(12) United States Patent
Nagai et al.

(10) Patent No.: US 7,956,368 B2
(45) Date of Patent: Jun. 7, 2011

(54) SEMICONDUCTOR LIGHT EMITTING DEVICE, LIGHTING MODULE, LIGHTING APPARATUS, AND MANUFACTURING METHOD OF SEMICONDUCTOR LIGHT EMITTING DEVICE

(75) Inventors: Hideo Nagai, Osaka (JP); Tetsuzo Ueda, Osaka (JP); Masaaki Yuri, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/569,660

(22) Filed: Sep. 29, 2009

(65) Prior Publication Data

US 2010/0019254 A1 Jan. 28, 2010

(30) Foreign Application Priority Data

Nov. 4, 2003 (JP) .................................. 2003-374913
Feb. 23, 2004 (JP) .................................. 2004-047026

(51) Int. Cl.
*H01L 29/207* (2006.01)
(52) U.S. Cl. ........ 257/93; 257/88; 257/79; 257/E33.001
(58) Field of Classification Search .................... 257/79, 257/81, 88, 82; 438/69
See application file for complete search history.

(56) References Cited

U.S. PATENT DOCUMENTS

| | | | |
|---|---|---|---|
| 3,636,617 A | 1/1972 | Schmidt et al. | |
| 3,821,774 A | 6/1974 | Beale | |
| 5,278,432 A | 1/1994 | Ignatius et al. | |
| 6,365,429 B1 | 4/2002 | Kneissl et al. | |
| 6,495,862 B1 | 12/2002 | Okazaki et al. | |
| 6,501,102 B2 | 12/2002 | Mueller-Mach et al. | |
| 6,562,643 B2 | 5/2003 | Chen | |
| 6,599,768 B1 | 7/2003 | Chen | |
| 6,836,579 B2 | 12/2004 | Ouchi | |
| 6,970,612 B2 | 11/2005 | Ouchi | |
| 7,474,681 B2 * | 1/2009 | Lin et al. ..................... | 372/43.01 |
| 7,525,248 B1 * | 4/2009 | Fan ............................... | 313/512 |
| 2003/0168664 A1 | 9/2003 | Hahn et al. | |
| 2005/0116235 A1 * | 6/2005 | Schultz et al. .................. | 257/79 |

FOREIGN PATENT DOCUMENTS

| | | |
|---|---|---|
| DE | 100 26 254 | 5/2000 |
| EP | 0 411 612 | 2/1991 |
| JP | 11-191642 | 7/1999 |
| JP | 2001-068795 | 3/2001 |

OTHER PUBLICATIONS

Japanese Application No. 2006-519006 Office Action dated Jan. 18, 2011, 2 pp.

* cited by examiner

*Primary Examiner* — Wai-Sing Louie
*Assistant Examiner* — Eva Yan Montalvo

(57) ABSTRACT

An LED bare chip which is one type of a semiconductor light emitting device (2) includes a multilayer epitaxial structure (6) composed of a p-GaN layer (12), an InGaN/GaN MQW light emitting layer (14) and an n-GaN layer (16). A p-electrode (18) is formed on the p-GaN layer (12), and an n-electrode (20) is formed on the n-GaN layer (16). An Au plating layer (4) is formed on the p-electrode (18). The Au plating layer (4) supports the multilayer epitaxial structure (6) and conducts heat generated in the light emitting layer (14). The Au plating layer (4) is electrically divided into two portions by a polyimide member (10). One of the two portions (4A) is connected to the p-electrode (18), to be constituted as an anode power supply terminal, and the other portion (4K) is connected to the n-electrode (20) by a wiring (22), to be constituted as a cathode power supply terminal.

9 Claims, 47 Drawing Sheets

STEP A1

STEP B1

STEP C1

STEP D1

STEP E1

STEP F1

STEP G1

STEP H1

STEP I1

STEP J1

STEP K1

STEP L1

STEP M1

STEP N1

STEP A2

STEP B2

STEP C2

STEP D2

STEP E2

STEP F2

STEP G2

STEP H2

STEP I2

STEP J2

STEP K2

STEP L2

STEP M2

STEP N2

STEP O2

STEP P2

STEP Q2

STEP A3

STEP B3

STEP C3

STEP D3

STEP E3

STEP F3

STEP G3

STEP H3

STEP I3

STEP J3

STEP K3

STEP L3

STEP M3

STEP N3

STEP A4

STEP B4

STEP C4

STEP D4

STEP E4

STEP F4

STEP J4

STEP K4

STEP L4

STEP M4

STEP N4

STEP O4

STEP P4

STEP Q4

STEP A5

STEP B5

STEP C5

STEP D5

STEP E5

STEP F5

STEP G5

STEP H5

STEP I5

STEP J5

STEP K5

STEP L5

PORTION J

SEMICONDUCTOR LIGHT EMITTING DEVICE, LIGHTING MODULE, LIGHTING APPARATUS, AND MANUFACTURING METHOD OF SEMICONDUCTOR LIGHT EMITTING DEVICE

TECHNICAL FIELD

The present invention relates to a semiconductor light emitting device such as a light emitting diode (LED) chip, a lighting module and a lighting apparatus including a semiconductor light emitting device, and a manufacturing method of a semiconductor light emitting device.

BACKGROUND ART

As white LEDs with higher luminance have recently been developed, LEDs are increasingly used not only for display, but also for lighting.

A typical LED chip has the following construction. A multilayer epitaxial structure including a light emitting layer is formed on a single-crystal substrate such as a sapphire substrate. An anode electrode and a cathode electrode are provided on a surface of the multilayer epitaxial structure which faces away from the sapphire substrate. Such an LED chip cannot be used by itself, and therefore mounted on a printed wiring board or the like.

When used for display, this LED chip is generally mounted in such a manner that the multilayer epitaxial structure is faced up (that is to say, the sapphire substrate is faced down). This mounting method is hereinafter referred to as epitaxial-side-up bonding or up-bonding. Power is supplied to the LED chip through metal wires connected to the anode and cathode electrodes, so that the LED chip emits light.

However, the up-bonding mounting method poses a problem related to heat when this LED chip is used for lighting. To use the LED chip for lighting, considerably larger amounts of currents need to be applied to obtain a significantly larger luminous flux, when compared with a case of using the LED chip for display. Therefore, unless heat dissipation is sufficiently performed, a luminous efficiency is worsened and a lifetime is shortened.

To solve this problem, when used for lighting, the LED chip may be flip-chip mounted to assure sufficient heat dissipation. To be specific, the LED chip is mounted on a highly heat-dissipative substrate having a bonding pad, by means of a metal bump, for example, a gold (Au) bump, in such a manner that the multilayer epitaxial structure is faced down (that is to say, the sapphire substrate is faced up). In this way, the light emitting layer that mainly generates heat is positioned closer to the highly heat-dissipative substrate. Furthermore, the flip-chip mounting method enables the heat to be conducted to the highly heat-dissipative substrate through the metal bump. As a consequence, better heat dissipation is achieved, so that the LED chip is prevented from being heated excessively.

In this case, however, light produced by the light emitting layer is emitted outside through the sapphire substrate. Therefore, a light extraction efficiency is lowered, when compared with a case where the LED chip is up-bonded and light produced by the light emitting layer is therefore emitted outside without going through the sapphire substrate. This problem may be solved by removing the sapphire substrate from the LED chip that is to be flip-chip mounted. This solution, however, makes it difficult to handle the LED chip, since the multilayer epitaxial structure has a thickness of only approximately 5 µm.

"D. Morita, et al, *Jpn. J. Appl. Phys.* Vol 41 (2002) pp. L1434-L1436" discloses an LED chip that improves heat dissipation without lowering a light extraction efficiency. According to this technique, a cathode electrode is formed on part of an upper surface of a multilayer epitaxial structure, and an anode electrode is formed on the entire lower surface of the multilayer epitaxial structure. Here, a metal layer is formed so as to be in contact with the anode electrode. In other words, the metal layer is provided as a replacement for a sapphire substrate which has been removed (lift off), for reinforcement. Hereinafter, this LED chip is referred to as a lift-off LED chip.

The lift-off LED chip is mounted on a mounting substrate in such a manner that the metal layer is faced down so as to be connected to a bonding pad provided on the mounting substrate by using a solder or a silver paste. Power is supplied to the lift-off LED chip through a metal wire connected to the cathode electrode and the bonding pad, to cause the lift-off LED chip to emit light. The lift-off LED chip does not have a sapphire substrate on or above the multilayer epitaxial structure, more specifically, above a light extraction surface of the multilayer epitaxial structure. This improves a light extraction efficiency. Furthermore, the multilayer epitaxial structure is mounted on the substrate with the anode electrode and the metal layer therebetween. This achieves better heat dissipation.

According to the lift-off LED chip, however, shadow of part of the metal wire which is positioned above the light extraction surface appears at a light-irradiated surface when light is emitted. This causes a serious problem when using the lift-off LED chip for lighting. It should be noted that the up-bonding mounting of the typical LED chip has the same problem.

In light of this problem, an object of the present invention is to provide a semiconductor light emitting device that can (i) achieve high heat dissipation without lowering a light extraction efficiency and (ii) emit light that is not likely to produce shadow of a metal wire on a light-irradiated surface. The object also includes provision of a manufacturing method of the semiconductor light emitting device, and a lighting module and a lighting apparatus including the semiconductor light emitting device.

DISCLOSURE OF THE INVENTION

The above object can be achieved by a semiconductor light emitting device in which at least part of a metal layer is constituted as a first power supply terminal. Here, the metal layer supports a multilayer epitaxial structure including a first conductive layer, a second conductive layer and a light emitting layer between the first and second conductive layers, and conducts heat generated in the light emitting layer. When the semiconductor light emitting device is mounted on a printed wiring board or the like by connecting the first power supply terminal to the printed wiring board, the heat generated in the light emitting layer can be efficiently dissipated into the printed wiring board. Thus, excellent heat dissipation can be achieved.

Furthermore, no single-crystal substrates such as a sapphire substrate are provided ahead of the second conductive layer, specifically speaking, a light extraction surface, in a direction of light emission. Thus, the multilayer epitaxial structure can attain an excellent light extraction efficiency.

A second power supply terminal, as well as the first power supply terminal, is positioned behind the light extraction surface, in the direction of light emission. The second power supply terminal is connected to a second electrode by means of a conductive member which extends from the second electrode in a direction parallel to a main surface of the second conductive layer. Thus, light emitted from this semiconductor light emitting device does not contain shadow. Conventionally, on the other hand, a metal wire which is provided ahead of a light extraction surface in a direction of light emission produces shadow on a light-irradiated surface.

The above object can be also achieved by a semiconductor light emitting device comprising: (i) a light emitting element array formed in such a manner that a plurality of light emitting elements are connected in series, where each of the plurality of light emitting elements includes (a) a multilayer epitaxial structure including a first conductive layer, a second conductive layer and a light emitting layer between the first conductive layer and the second conductive layer, where a main surface of the second conductive layer which faces away from the light emitting layer is a light extraction surface, (b) a first electrode formed on a main surface of the first conductive layer which faces away from the light emitting layer, and (c) a second electrode formed on the main surface of the second conductive layer which faces away from the light emitting layer, where the first electrode and the second electrode are positioned to each other in a same manner for each light emitting element; and (ii) a metal layer on which the light emitting element array is formed, with an insulating layer therebetween, in such a manner that the first electrode is positioned closer to the metal layer than the second electrode is, where the metal layer connects and supports the multilayer epitaxial structures and conducting heat generated in the light emitting layer. Here, the metal layer is electrically divided into at least two portions. At least one of the portions is connected to a first electrode of a light emitting element at one end of the light emitting element array, to be constituted as a first power supply terminal, and at least one of a rest of the portions is connected to a second electrode of a light emitting element at the other end of the light emitting element array, by means of a conductive member which extends from the second electrode in a direction parallel to a main surface of a second conductive layer of the light emitting element, to be constituted as a second power supply terminal. This semiconductor light emitting device can produce the same effects as the above-described semiconductor light emitting device.

The above object can be also achieved by a lighting module and a lighting apparatus including one of the above-described semiconductor light emitting devices. Thus, a higher luminous efficiency and a longer lifetime can be achieved, and emitted light does not include shadow which is created by a metal wire.

The above object can be also achieved by a manufacturing method of a semiconductor light emitting device that produces the effects described above.

BRIEF DESCRIPTION OF THE DRAWINGS

FIG. 1 illustrates an LED chip relating to a first embodiment, where

FIG. 7 illustrates an LED chip relating to a second embodiment, where

FIG. 14 illustrates an LED array chip relating to a third embodiment, where

FIG. 15 illustrates the LED array chip relating to the third embodiment, where

FIG. 21 illustrates an LED array chip relating to a fourth embodiment, where

FIG. 22 illustrates the LED array chip relating to the fourth embodiment, where

FIG. 29 illustrates an LED chip relating to a fifth embodiment, where

BEST MODE FOR CARRYING OUT THE INVENTION

The following part describes embodiments of the present invention with reference to the attached figures.

First Embodiment

Figure 1A:
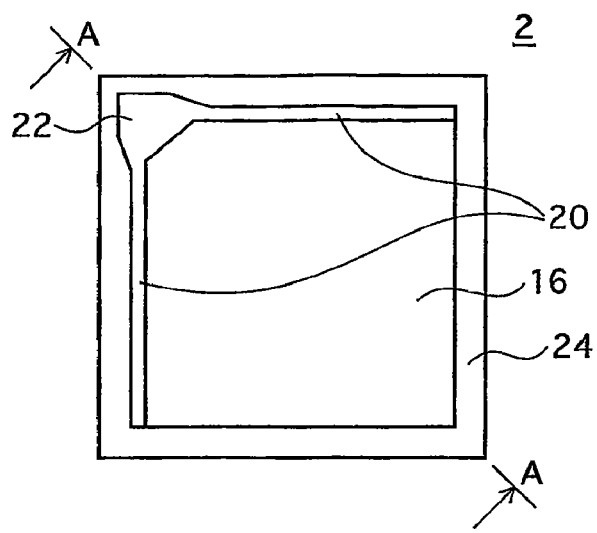
FIG. 1A is a plan view illustrating the LED chip by removing a phosphor layer.
Figure 1B:
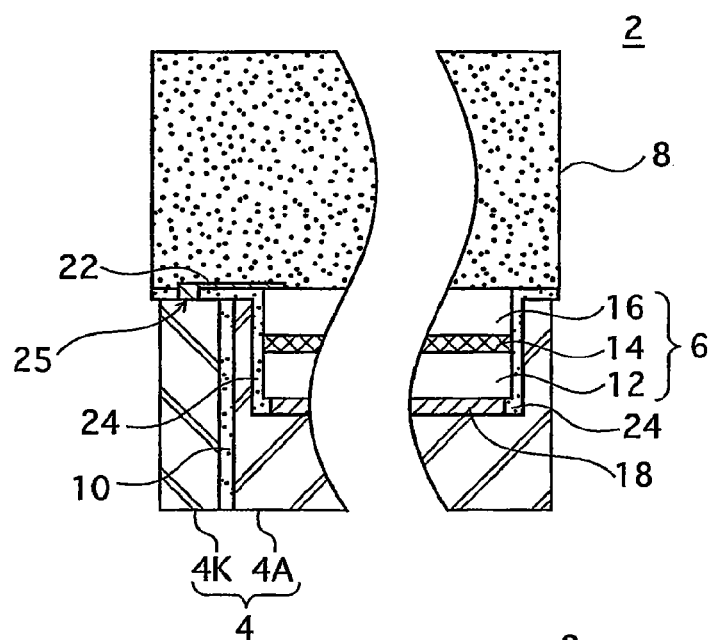
FIG. 1B illustrates a cross-section along a line AA shown in FIG. 1A.
Figure 1C:
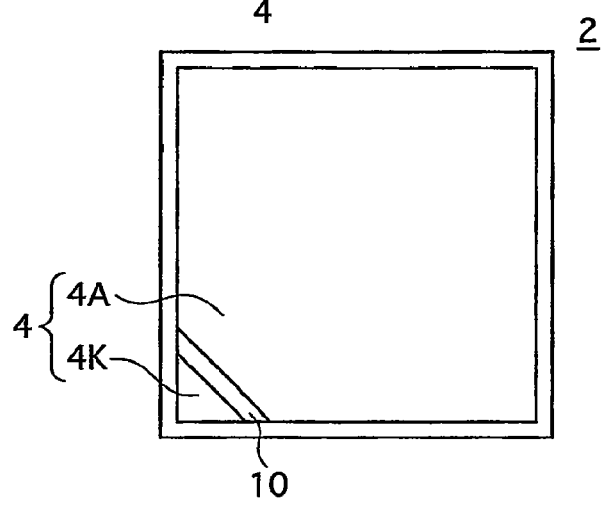
FIG. 1C is a bottom plan view.

FIG. 1A is a plan view illustrating an LED chip 2 which is one type of a semiconductor light emitting device, FIG. 1B illustrates a cross-section along a line AA shown in FIG. 1A, and FIG. 1C is a bottom plan view illustrating the LED chip 2. It should be noted that a phosphor layer 8 (shown in FIG. 1B and mentioned later) is not shown in FIG. 1A.

As shown in FIGS. 1A to 1C, the LED chip 2 is formed in such a manner that a multilayer epitaxial structure 6 and the phosphor layer 8 are provided on an Au plating layer 4, which is a metal layer. The Au plating layer 4 is electrically divided into two portions, by a polyimide member 10 which is an insulator. One of the portions is constituted as an anode power supply terminal (4A) and the other a cathode power supply terminal (4K). The LED chip 2 is 350-µm-square, and 100 µm in thickness. In detail, a thickness of the Au plating layer 4 is 50 µm and a thickness of the phosphor layer 8 is 50 µm.

The multilayer epitaxial structure 6 is composed of a p-GaN layer 12 (having a thickness of 200 nm) which is a conductive layer, an InGaN/GaN multiple quantum well (MQW) light emitting layer 14 (having a thickness of 50 nm), and an n-GaN layer 16 (having a thickness of 3 µm) which is a conductive layer, in the stated order. Here, the p-GaN layer 12 is positioned the closest to the Au plating layer 4. The multilayer epitaxial structure 6 has a diode structure.

A highly-reflective Rh/Pt/Au p-electrode 18 is formed on substantially the entire lower main surface of the p-GaN layer 12. The p-GaN layer 12 is connected to the anode power supply terminal 4A which is part of the Au plating layer 4, through the p-electrode 18.

A Ti/Pt/Au n-electrode 20 is formed on part of an upper main surface of the n-GaN layer 16. Here, a conductive Ti/Pt/Au wiring 22 extends from the n-electrode 20. The n-GaN layer 16 is connected to the cathode power supply terminal 4K which is part of the Au plating layer 4, by means of the wiring 22. An end portion of the wiring 22 which is connected to the n-electrode 20 extends from the n-electrode 20 in a direction parallel to the upper main surface (a light extraction surface) of the n-GaN layer 16.

A silicon nitride layer 24 which is an insulating layer is formed on every surface of the multilayer epitaxial structure 6, except for an upper surface (i.e. the upper main surface of the n-GaN layer 16) and an area in which the p-electrode 18 is formed. The silicon nitride layer 24 insulates the multilayer epitaxial structure 6 and the Au plating layer 4 from each other. A contact hole 25 is provided in a portion of the silicon nitride layer 24 which is in contact with the cathode power supply terminal 4K. The wiring 22 goes through the contact hole 25, to be connected to the cathode power supply terminal 4K.

The phosphor layer 8 is made of a light-transmitting resin such as silicone in which particles of a yellow phosphor and fine particles of metal oxide are dispersed. The light-transmitting resin may be instead an epoxy resin, a polyimide resin or the like. The yellow phosphor may be $(Sr, Ba)_2SiO_4:Eu^{2+}$, $(Y, Gd)_3Al_5O_{12}:Ce^{3+}$ or the like, and the metal oxide may be $SiO_2$.

When power is supplied to this LED chip 2 through the anode power supply terminal 4A and the cathode power supply terminal 4K, the light emitting layer 14 emits blue light having a wavelength of 460 nm. Here, part of the blue light is emitted from the light emitting layer 14 towards the Au plating layer 4, but reflected by the highly-reflective p-electrode 18 towards the phosphor layer 8. As a result, the blue light emitted from the light emitting layer 14 is, to a large extent, directed towards the phosphor layer 8. Part of the blue light is absorbed by the phosphor layer 8, to be converted into yellow light. The blue light and the yellow light mix together, to produce white light. The white light is emitted through the phosphor layer 8.

In the LED chip 2 relating to the first embodiment, which is one type of a semiconductor light emitting device, the highly-reflective p-electrode 18 is formed on substantially the entire lower surface of the multilayer epitaxial structure 6. Furthermore, a sapphire substrate or the like is not provided on or above the light extraction surface of the multilayer epitaxial structure 6. For these reasons, the multilayer epitaxial structure 6 achieves a significantly high light extraction efficiency. Although a p-GaN layer (the p-GaN layer 12) is generally difficult to be configured to have low resistance, the p-electrode 18 is provided on substantially the entire lower main surface of the p-GaN layer 12. This enables an electric current to be evenly injected to the entire multilayer epitaxial structure 6. As a result, the entire semiconductor light emitting layer 14 evenly emits light, and a lower operation voltage is achieved. Furthermore, heat generated mainly in the light emitting layer 14 is dissipated to a mounting substrate (a ceramics substrate 202 shown in FIG. 34) through the power supply terminals 4A and 4K which are formed by the highly heat-conductive Au plating layer 4. In this way, the light emitting layer 14 can be prevented from overheating, even when large amounts of electric current are applied. Consequently, the LED chip 2 (one type of a semiconductor light emitting device) can achieve a high output and a long lifetime. In addition, the power supply terminals 4A and 4K are provided on the lower surface of the multilayer epitaxial structure 6. This means that the power supply terminals 4A and 4K are positioned behind the light extraction surface of the n-GaN layer 16, in a direction of light emission. No components that block light, such as a bonding wire, exist on or above the light extraction surface. Therefore, light emitted from the LED chip 2 does not contain shadow. Furthermore, since the LED chip 2 does not include an insulating substrate such as a sapphire substrate, an ability to withstand static electricity is improved.

The following part describes a manufacturing method of this LED chip 2, with reference to FIGS. 2 to 6. In FIGS. 2 to 6, a material to form each constituent of the LED chip 2 is identified by a four-digit number whose first digit is one. The last two digits of the four-digit number represents a reference numeral identifying the corresponding constituent of the LED chip 2.

Figure 2:
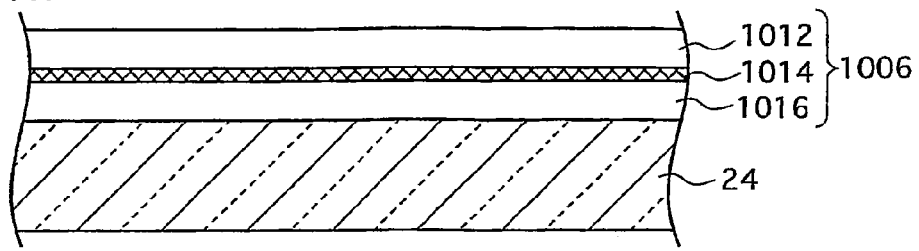
FIG. 2 illustrates part of a manufacturing process of the LED chip relating to the first embodiment.
Figure 2:
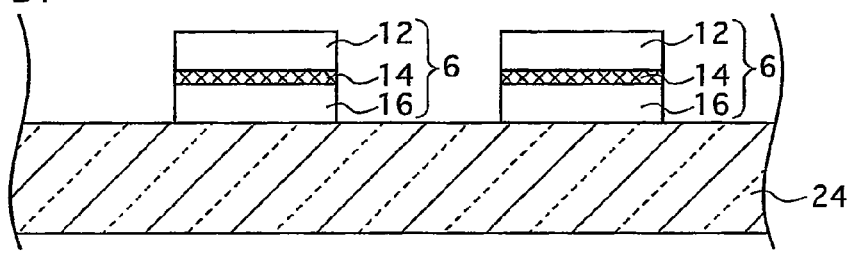
Figure 2:
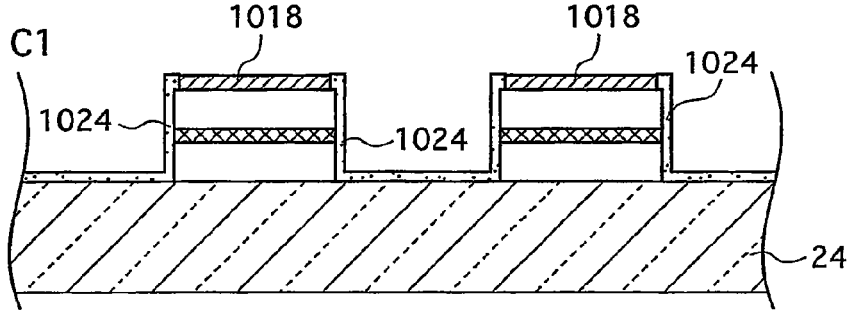
Figure 2:
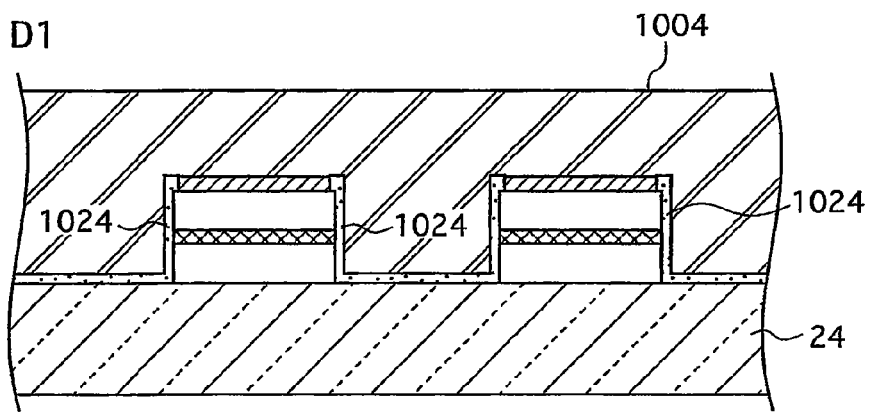
Figure 3:
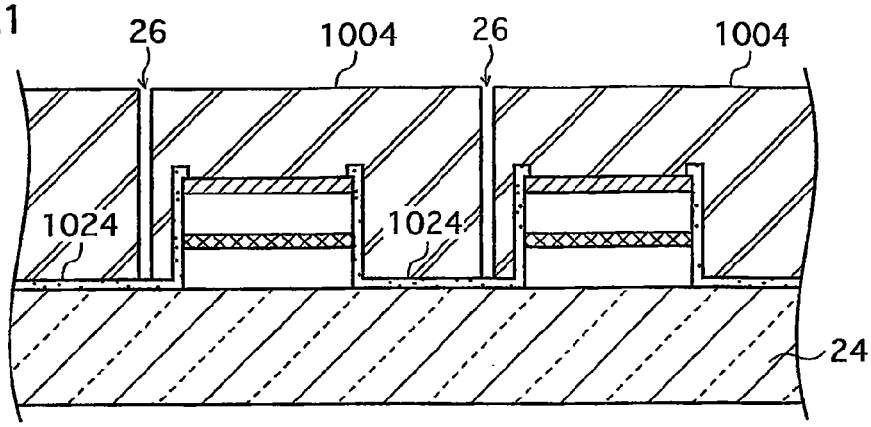
FIG. 3 illustrates part of the manufacturing process of the LED chip relating to the first embodiment.
Figure 3:
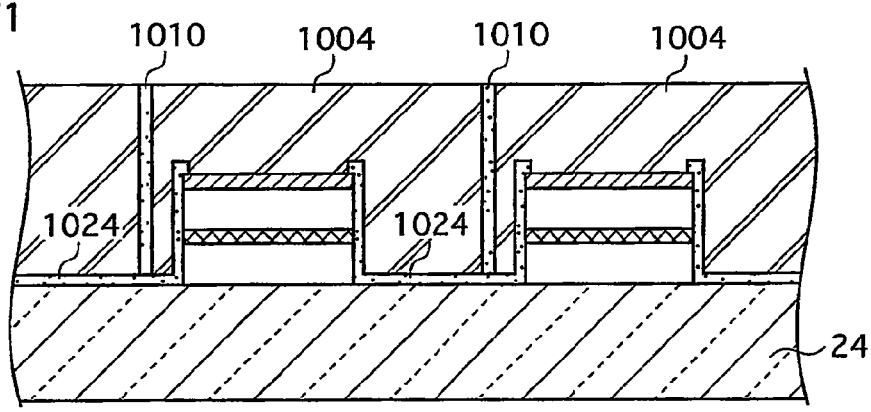
Figure 3:
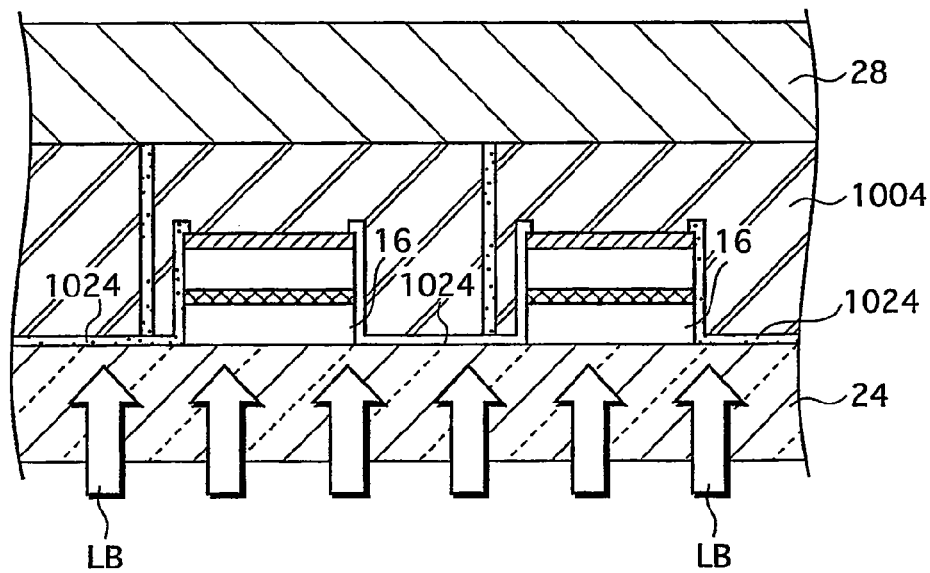

To start with, as shown in FIG. 2, an n-GaN layer 1016, an InGaN/GaN MQW light emitting layer 1014 and a p-GaN layer 1012 are formed in this order on a sapphire substrate 24 which is a single-crystal substrate, by epitaxial growth using a metal organic chemical vapor deposition (MOCVD) method (step A1). Here, the sapphire substrate 24 has a diameter of two inches and a thickness of 300 μm. The layers 1016, 1014 and 1012 form a multilayer epitaxial structure 1006.

The multilayer epitaxial structure 1006 is partly masked, and an unmasked area of the multilayer epitaxial structure 1006 is removed by dry etching to such a depth that the sapphire substrate 24 is exposed. Thus, multilayer epitaxial structures 6 (see FIG. 1B) are formed. The multilayer epitaxial structures 6 each constitute the LED chip 2. (step B1)

After this, a silicon nitride film 1024 is deposited on the entire resulting surface after the step B 1 by radio-frequency (RF) sputtering or the like for insulation and surface protection. Here, the silicon nitride film 1024 may be replaced with a silicon oxide film. Subsequently, the silicon nitride film 1024 is partly removed by etching, so that the p-GaN layer 12 is exposed in an area in which the p-electrode 18 (shown in FIG. 1B) is to be formed. In the area where the p-GaN layer 12 is exposed, an Rh/Pt/Au film 1018 is formed by an electron beam evaporation method or the like (step C1).

After a Ti/Au thin film undercoating (not shown in FIG. 2) is formed by an electron beam evaporation method or the like on the entire resulting surface after the step C1, an Au plating layer 1004 having a thickness of 50 μm is formed on the undercoating (step D1). The Au plating layer 1004 is then partly removed by etching with use of iodine or the like, to such a depth that the silicon nitride film 1024 is exposed. This creates a space 26 that divides (that is to say, electrically separates) the Au plating layer 1004 into a portion to constitute the anode power supply terminal 4A and a portion to constitute the cathode power supply terminal 4K (step E1). The space 26 is filled with a polyimide resin 1010 (step F1). The filling can be achieved in the following manner as an example. A polyimide organic solution is applied to the entire resulting surface after the step E1, and dried. After this, a polyimide resin formed on an upper surface of the Au plating layer 1004 is removed by plasma ashing. Here, a polyamideimide resin may be used instead of a polyimide resin. Furthermore, a silicon nitride film or a silicon oxide film may be formed in the space 26, instead of a resin. Alternatively, after one of a silicon nitride film and a silicon oxide film is applied to a side wall of the space 26 in the Au plating layer 1004, the space 26 may be filled with one of a polyimide resin and a polyamideimide resin. Having excellent heat-resistance, both a polyimide resin and a polyamideimide resin can resist heating performed in an LED chip mounting step described in a sixth embodiment.

In a step G1, the sapphire substrate 24 is separated. To do this, a first macromolecule film 28 is adhered to the Au plating layer 1004 by means of an adhesive layer (not shown in FIG. 3). Here, the adhesive layer is made of polyester or the like, and foams and loses adhesivity when heated. The first macromolecule film 28 supports the multilayer epitaxial structure 6 and the Au plating layer 4 after the sapphire substrate 24 is removed. The first macromolecule film 28 is also used as a supporting member to make handling of the LED chip 2 easy in its manufacturing process. The first macromolecule film 28 may be a polyester film, polyimide film or the like.

After the first macromolecule film 28 is adhered, a YAG laser third harmonic beam LB having a wavelength of 355 nm is irradiated to the sapphire substrate 24, from a side of the sapphire substrate 24, in such a manner that the beam scans the entire surface of the sapphire substrate 24. The irradiated laser beam is not absorbed by the sapphire substrate 24, but only by an interface between the sapphire substrate 24 and the n-GaN layer 16. Here, heat is generated locally and breaks GaN bonding around the interface. As a consequence, the sapphire substrate 24 is separated from the multilayer epitaxial structure 6 in terms of epitaxial structure (step G1). However, the sapphire substrate 24 is still adhered to the multilayer epitaxial structure 6 by a layer including gallium (Ga) (a pyrolytic layer). To separate the sapphire substrate 24 from the multilayer epitaxial structure 6 completely, the sapphire substrate 24 and the multilayer epitaxial structure 6 are immersed into hydrochloride or the like to dissolve the interface portion (step H1). Here, the sapphire substrate 24 is also connected to the silicon nitride film 1024. However, this connection is weak and made only in a small area. Therefore, the sapphire substrate 24 can be easily separated from the silicon nitride film 1024 by the procedures performed in the steps G1 and H1. It should be noted that the YAG laser third harmonic beam can be replaced with a KrF excimer laser having a wavelength of 248 nm or a mercury emission line having a wavelength of 365 nm. In addition, the sapphire substrate 24 may be removed by grinding.

An additional semiconductor layer may be formed on the multilayer epitaxial structure 1006 in the following manner. After the step A1, a laser beam is irradiated as in the step G1. This forms a layer including Ga at an interface between the sapphire substrate 24 and the multilayer epitaxial structure 1006. Following this, epitaxial regrowth may be conducted using an MOCVD method. Here, the layer including Ga formed at the interface is not affected by a difference in coefficient of thermal expansion between the sapphire substrate 24 and the semiconductor light emitting layer 1014 which is made of a GaN semiconductor material. This can improve epitaxial structure and reduces cracking.

Figure 4:
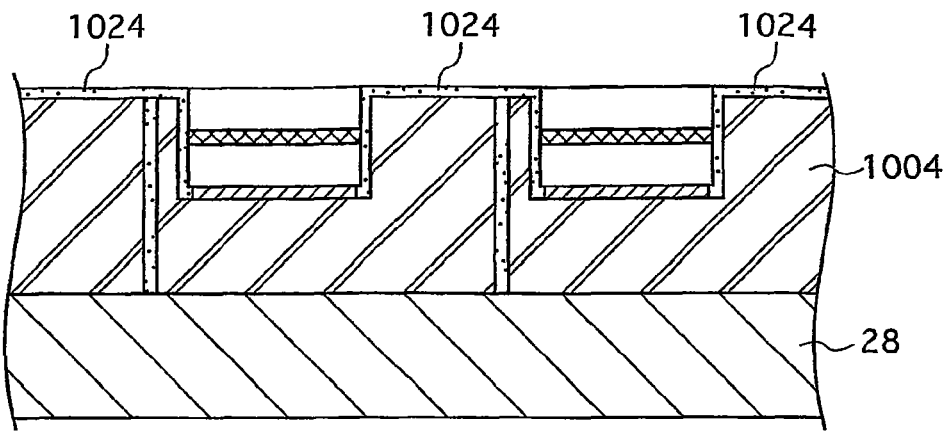
FIG. 4 illustrates part of the manufacturing process of the LED chip relating to the first embodiment.
Figure 4:
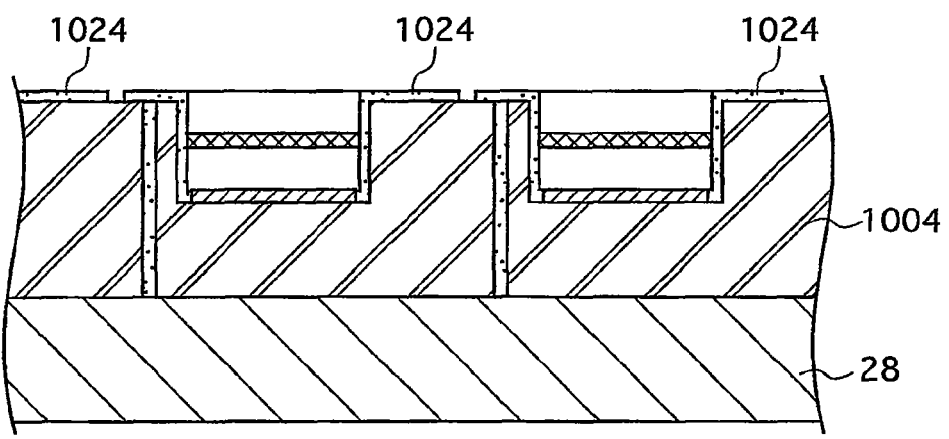
Figure 4:
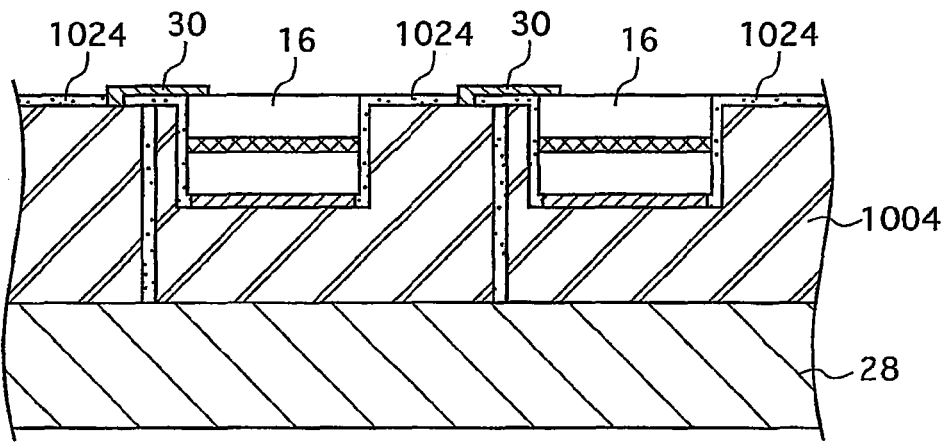
Figure 5:
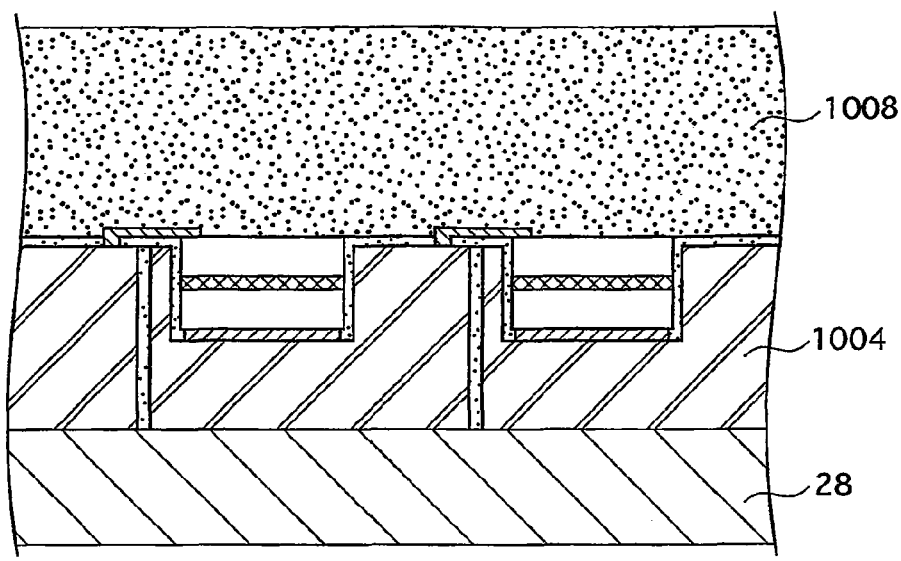
FIG. 5 illustrates part of the manufacturing process of the LED chip relating to the first embodiment.
Figure 5:
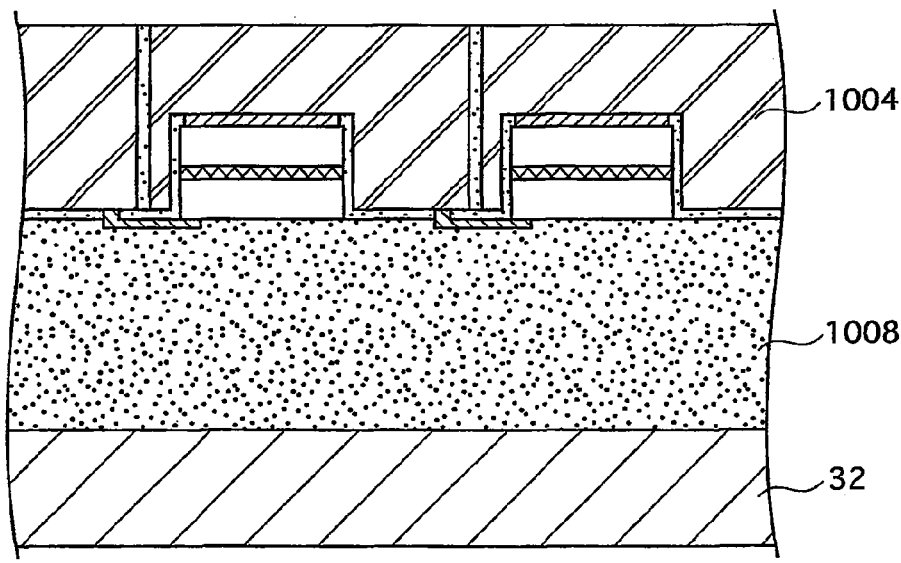
Figure 6:
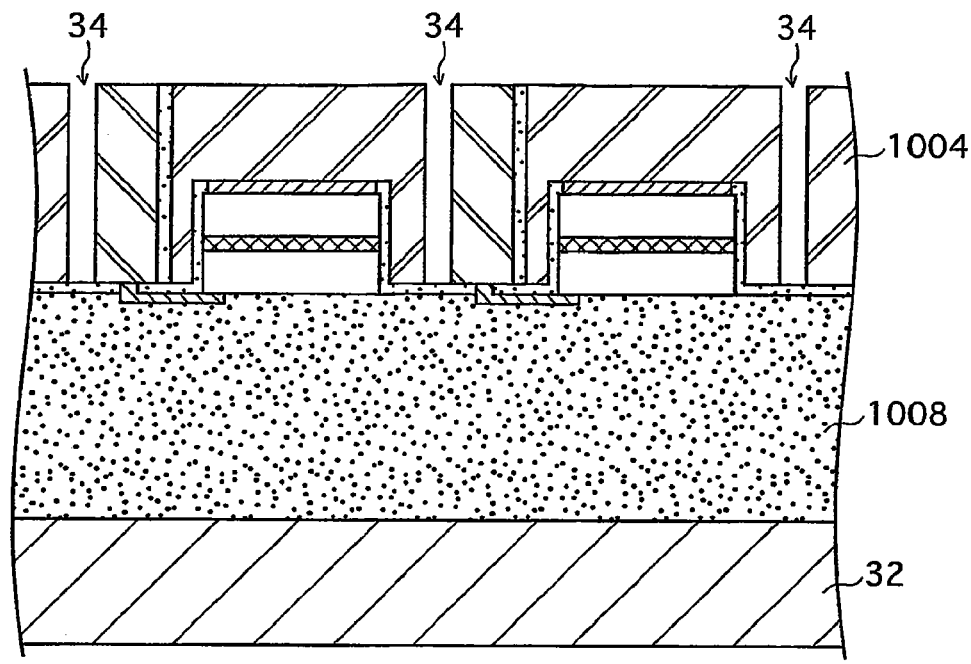
FIG. 6 illustrates part of the manufacturing process of the LED chip relating to the first embodiment.
Figure 6:
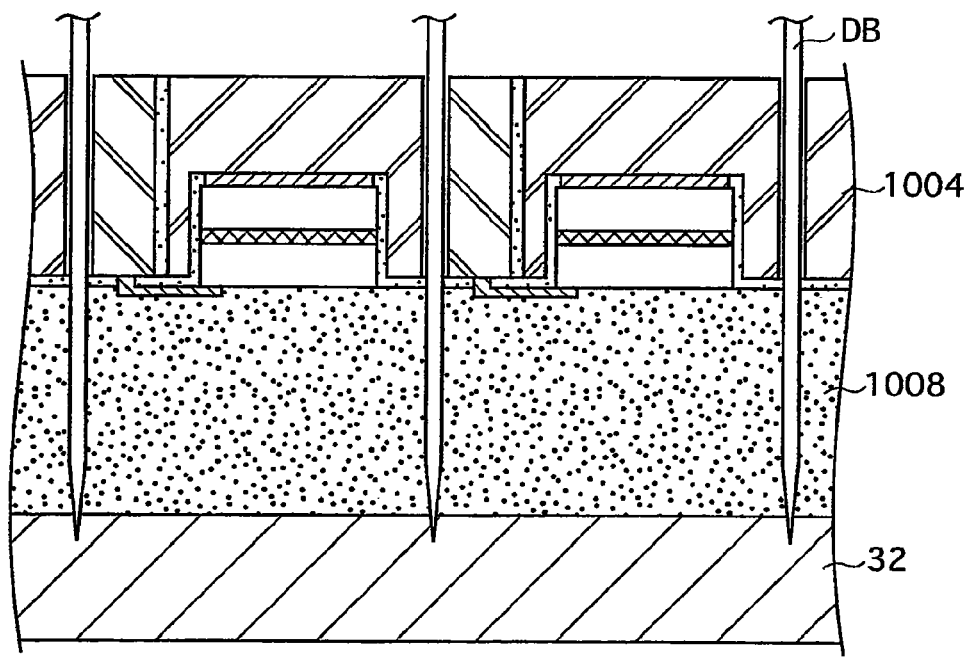

After the step H1, the silicon nitride film 1024 formed on the Au plating layer 1004 is partly removed by etching, to partly expose a portion of the Au plating layer 1004 which is to be constituted as the cathode power supply terminal 4K (shown in FIGS. 1B and 1C) (step I1). A Ti/Pt/Au film 30 is then formed by an electron beam evaporation method or the like, as shown in FIG. 4, so as to connect the n-GaN layer 16 and the exposed part created in the step I1 (step J1). The Ti/Pt/Au film 30 constitutes the n-electrode 20 and the wiring 22 (see FIGS. 1A to 1C).

Subsequently, a phosphor layer 1008 is formed. The above-described silicone resin in which particles of a yellow phosphor and fine particles of metal oxide such as $SiO_2$ are dispersed is applied to the entire resulting surface after the step J1. After the silicone resin is heated to be cured, the phosphor layer 1008 is ground so as to have a predetermined thickness, for example, 50 μm (step K1). Here, it should be noted that a color of white light emitted from the LED chip 2 is determined by a ratio between blue light and yellow light. This ratio can be adjusted by changing the percentage of the phosphor particles included in the silicone resin and the thickness of the phosphor layer 8. Specifically speaking, when the percentage of the phosphor particles is higher, or the thickness of the phosphor layer 8 is larger, the ratio of the yellow light becomes higher. Here, a high ratio of the yellow light means that the white light emitted from the LED chip 2 has a low color temperature. According to the first embodiment, the silicone resin including the phosphor particles is first applied at a thickness larger than a designed thickness of the phosphor layer 8. The applied resin is then ground, to achieve the designed thickness. In this way, the phosphor layer 8 can be formed at an even thickness. This reduces unevenness of color, since the blue light and the yellow light are well balanced at a light extraction surface of the phosphor layer 8. At the same time, the LED chip 2 can produce white light having exactly a predetermined color temperature.

A conventional LED chip (explained in the Background Art section) receives a power supply through a metal wire connected to an electrode that is provided on a light extraction surface of the LED chip. In a manufacturing method for this LED chip, a silicone resin is applied to form a phosphor layer. Here, there is a risk that the metal wire may break due to an inflow pressure generated by applying the silicone resin. To avoid this breakage, the silicone resin needs to be applied with a relatively low pressure. This makes it difficult to form the phosphor layer at an even thickness. Therefore, the conventional LED chip has a problem of unevenness of color. The first embodiment, however, does not have this problem. Here, even if the phosphor layer of the conventional LED chip is formed in such a manner that a cured resin is ground so that the phosphor layer has an even thickness, a risk of breakage of the metal wire still exists, due to vibration generated by a grindstone used for the grinding.

After the step K1, the first macromolecule film 28 is removed, and a second macromolecule film 32 is adhered to the phosphor layer 1008 as a dicing sheet in order to divide the Au plating layer 1004 for each LED chip 2 (step L1).

Subsequently, the Au plating layer 1004 is partly removed by etching. As a result of the etching, a plurality of grooves 34 (shown in FIG. 6) are created vertically and horizontally when the Au plating layer 1004 is seen from above. Thus, the Au plating layer 1004 is divided for each LED chip 2 (step M1). After this, the phosphor layer 1008 is divided for each LED chip 2 by inserting dicing blades DB (FIG. 6) into the grooves 34. Thus, the LED chip 2 is completed (step N1).

In the LED chip 2 relating to the first embodiment, the multilayer epitaxial structure 6 is supported (reinforced) by the Au plating layer 4, which has a sufficiently large thickness. In addition, the multilayer epitaxial structure 6 is also supported (reinforced) by the phosphor layer 8. These layers 4 and 8 make it easy to handle the LED chip 2.

In detail, since a total thickness of the Au plating layer 4 and the phosphor layer 8 is approximately 100 μm, the LED chip 2 can be handled in the same manner as a conventional LED chip including a sapphire substrate (a single-crystal substrate). If the total thickness of the Au plating layer 4 and the phosphor layer 8 is made remarkably small, it is difficult to handle the LED chip 2. If such is the case, the second macromolecule film 32 is adhered using the same adhesive agent used to adhere the first macromolecule film 28. Furthermore, the second macromolecule film 32 is also divided for each LED chip 2 when the phosphor layer 1008 is divided for each LED chip 2 using the dicing blades DB. Here, if the second macromolecule film 32 has a thickness of 100 μm, each LED chip 2 can be thick (strong) enough to be handled. To mount this LED chip 2 including the second macromolecule film 32, the LED chip 2 is suctioned by a vacuum collet, to be bonded to a die bonding portion on a mounting substrate by means of PbSn solder or the like. To be bonded, the LED chip 2 is heated to approximately 200° C. Here, the second macromolecule film 32 is adhered by means of the adhesive layer which loses adhesivity when heated. Therefore, the second macromolecule film 32 can be easily separated. Thus, even when the LED chip 2 only has a small thickness, the LED chip 2 can be mounted with ease. Here, if an AuSn layer which has a melting point of approximately 280° C. is plated on the Au plating layer 4, the LED chip 2 can be directly mounted without requiring PbSn solder.

Second Embodiment

Figure 7A:
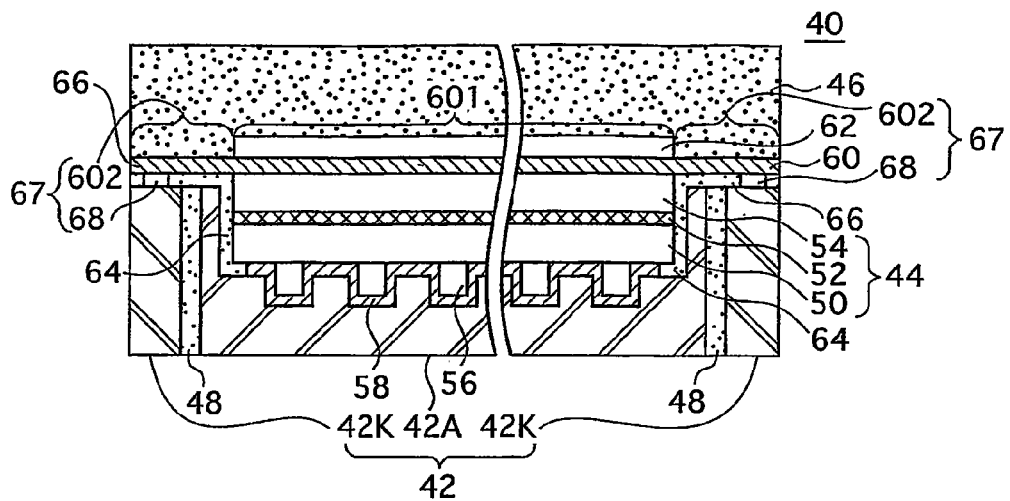
FIG. 7A illustrates a cross-section along a line BB shown in FIG. 7C.
Figure 7B:
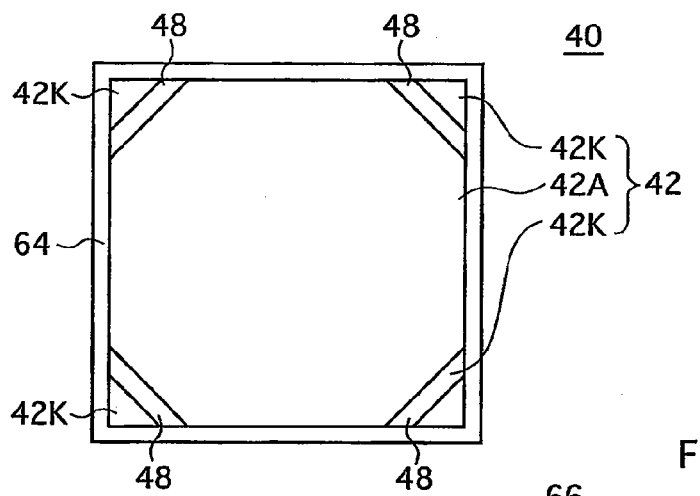
FIG. 7B is a bottom plan view.
Figure 7C:
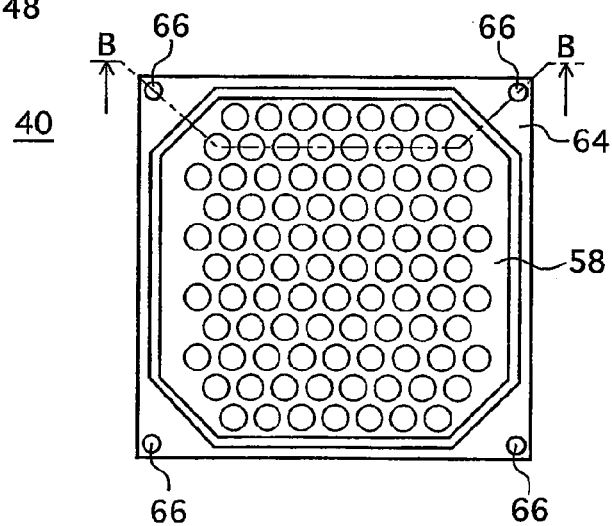
FIG. 7C is a bottom plan view illustrating the LED chip by removing an Au plating layer.

FIG. 7A is a cross-sectional view illustrating an LED chip 40 relating to a second embodiment which is one type of a semiconductor light emitting device, FIG. 7B is a bottom plan view illustrating the LED chip 40, and FIG. 7C is a bottom plan view illustrating the LED chip 40 by removing an Au plating layer 42 and polyimide members 48. Here, FIG. 7A illustrates a cross-section along a line BB shown in FIG. 7C.

As shown in FIG. 7, the LED chip 40 is formed in such a manner that a multilayer epitaxial structure 44 and a phosphor layer 46 are formed on the Au plating layer 42. The Au plating layer 42 is electrically divided into five portions by the polyimide members 48 which are insulators. One of the portions is constituted as an anode power supply terminal (42A), and the other four portions are constituted as cathode power supply terminals (42K). The LED chip 40 is 1-mm-square, and 250 μm in thickness (a thickness of the Au plating layer 42 is 50 μm and a thickness of the phosphor layer 46 is 200 μm). The multilayer epitaxial structure 44 includes a p-AlGaN layer 50 which is a conductive layer (having a thickness of 50 nm), an InGaN/AlGaN MQW light emitting layer 52 (having a thickness of 40 nm), and an n-AlGaN layer 54 which is a conductive layer (having a thickness of 300 nm). The layers 50, 52 and 54 are formed in this order, where the layer 50 is positioned the closest to the Au plating layer 42. The layers 50, 52 and 54 form a diode structure.

The p-AlGaN layer 50 is connected to the anode power supply terminal 42A which is part of the Au plating layer 42, by means of an $SiO_2/Ta_2O_5$ multilayer dielectric film 56 and a highly-reflective Rh/Pt/Au electrode 58. The multilayer dielectric film 56 is formed by partly removing a sheet-like multilayer dielectric film by etching in a predetermined pattern. The p-AlGaN layer 50 is electrically connected to the highly-reflective Rh/Pt/Au electrode 58 in areas which are not covered by the multilayer dielectric film 56.

A silicon nitride film 64 which is an insulating layer is formed on every surface of the multilayer epitaxial structure 44, except for an upper surface (i.e. an upper main surface of the n-AlGaN layer 54) and an area in which the electrode 58 (the multilayer dielectric film 56) is formed. The silicon nitride film 64 insulates the multilayer epitaxial structure 44 and the Au plating layer 42 from each other.

An ITO transparent electrode 60 and an $SiO_2/Ta_2O_5$ multilayer dielectric film 62 are formed on the n-AlGaN layer 54. A Contact hole 66 is provided at each corner of the silicon nitride film 64, and the contact hole 66 is filled with Pt/Au conductive member 68. The n-AlGaN layer 54 is electrically connected to the cathode power supply terminals 42K by means of the ITO transparent electrode 60 and the conductive members 68. As shown in FIG. 7A, the ITO transparent electrode 60 is divided into a portion which covers (is in contact with) the entire upper main surface (a light extraction surface) of the n-AlGaN layer 54 and a portion which is not in contact with the upper main surface of the n-AlGaN layer 54. Here, the portion of the ITO transparent electrode 60 which is in contact with the n-AlGaN layer 54 (hereinafter referred to as an electrode unit 601) is constituted as an electrode. On the other hand, the portion (602) which is not in contact with the upper main surface of the n-AlGaN layer 54 is constituted as a wiring to build a connection between the n-AlGaN layer 54 and the cathode power supply terminals 42K. In other words, the portion 602 and the conductive member 68 constitute a wiring 67, which connects the electrode unit 601 to the cathode power supply terminals 42K. This means that, as in the first embodiment, an end portion of the wiring 67 which is connected to the electrode unit 601 extends from the electrode unit 601 in a direction parallel to the upper main surface (the light extraction surface) of the n-AlGaN layer 54.

The phosphor layer 46 is made of a light-transmitting resin such as silicone in which particles of phosphors of four different colors and fine particles of metal oxide such as $SiO_2$ are dispersed. Such phosphors include a blue phosphor which contains at least one of $(Ba, Sr)MgAl_{10}O_{17}:Eu^{2+}$, $(Ba, Sr, Ca, Mg)_{10}(PO_4)_6Cl_2:Eu^{2+}$ and the like, a green phosphor which contains at least one of $BaMgAl_{10}O_{17}:Eu^{2+}Mn^{2+}$, $(Ba, Sr)_2SiO_4:Eu^{2+}$ and the like, a yellow phosphor which contains at least one of $(Sr, Ba)_2SiO_4:Eu^{2+}$, $CaGa_2S_4:Eu^{2+}$ and the like, and a red phosphor which contains at least one of $La_2O_2S:Eu^{3+}$, $(Ca, Sr, Ba)_3Si_5N_8:Eu^{2+}$ and the like. Instead of silicone, an epoxy resin or a polyimide resin may be used as the light-transmitting resin.

In the LED chip 40 relating to the second embodiment, the multilayer epitaxial structure 44 is positioned between mirror structures, i.e. the $SiO_2/Ta_2O_5$ multilayer dielectric films 58 and 62. The mirror structure closer to the p-AlGaN layer 50 has a reflectance of 99% or over, and the mirror structure closer to the n-AlGaN layer 54 has a reflectance of 90% or over. Thus, a resonant LED structure is formed. Near-ultraviolet light having a wavelength of 390 nm emitted from the light emitting layer 52 is emitted through the multilayer dielectric film 62, which is the mirror structure closer to the n-AlGaN layer 54 and has a lower reflectance, and absorbed by the phosphor layer 46. The phosphor layer 46 converts the near-ultraviolet light into white light.

Having a resonant LED structure, the LED chip 40 relating to the second embodiment has a significantly higher light extraction efficiency in a direction perpendicular to the light emitting layer 52. Generally speaking, if the thickness of the p-AlGaN layer 50 and that of the n-AlGaN layer 54 are reduced, an electric current is likely to unevenly expand in a horizontal direction. This may cause light to be emitted unevenly from the light emitting layer 52. The uneven light emission becomes more notable as a light emission area becomes large. According to the second embodiment, power is supplied to the p-AlGaN layer 50 through the Rh/Pt/Au highly-reflective electrode 58. Here, the electrode 58 is formed on substantially the entire surface of the p-AlGaN layer 50 since the multilayer dielectric film 56 is formed by partly etching a sheet-like multilayer dielectric film. Furthermore, the n-AlGaN layer 54 is supplied with power through the ITO transparent electrode 60, which is formed on substantially the entire surface of the n-AlGaN layer 54. In addition, the cathode power supply terminals 42K are provided at four corners of the LED chip 40. Thus, an electric current can be evenly injected to the entire semiconductor light emitting layer 52. This enables the entire light emitting layer 52 to evenly emit light, with it being possible to achieve a lower operation voltage. In addition, heat generated mainly in the light emitting layer 52 can be dissipated to a mounting substrate (mentioned later) through the power supply terminals 42A and 42K which are formed by the highly heat-conductive Au plating layer 42. This can reduce an increase in temperature of the light emitting layer 52 even when large amounts of electric current are injected. As a result, the LED chip 40, which is one type of a semiconductor light emitting device, can achieve a high output and a long lifetime. Additionally, the power supply terminals 42A and 42K are provided on a lower surface of the multilayer epitaxial structure 44. No components that block light emitted from the light emitting layer 52 are provided on or above the upper surface of the multilayer epitaxial structure 44. As a consequence, light emitted from the LED chip 40 does not contain shadow. In addition, since the LED chip 40 does not include an insulating substrate such as a sapphire substrate, an ability to withstand static electricity is improved.

The following part describes a manufacturing method of this LED chip 40 with reference to FIGS. 8 to 13.

In FIGS. 8 to 13, a material to form each constituent of the LED chip 40 is identified by a four-digit number whose first digit is one. The last two digits of the four-digit number represents a reference numeral identifying the corresponding constituent of the LED chip 40.

Figure 8:
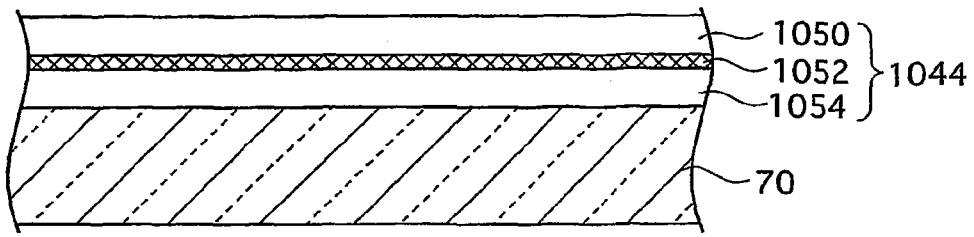
FIG. 8 illustrates part of a manufacturing process of the LED chip relating to the second embodiment.
Figure 8:
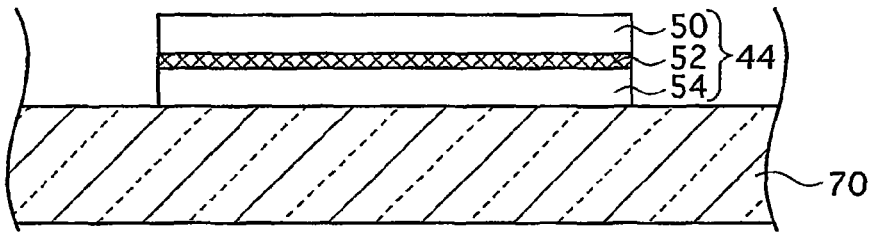
Figure 8:
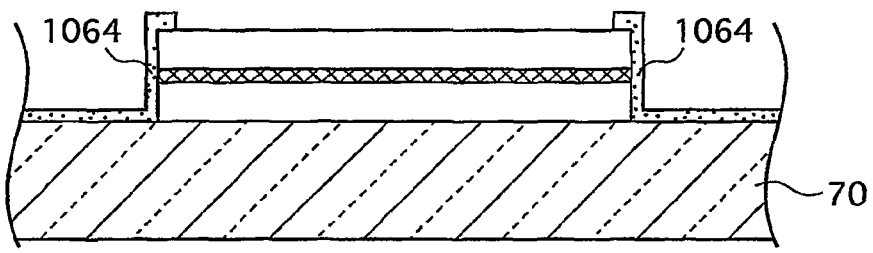
Figure 8:
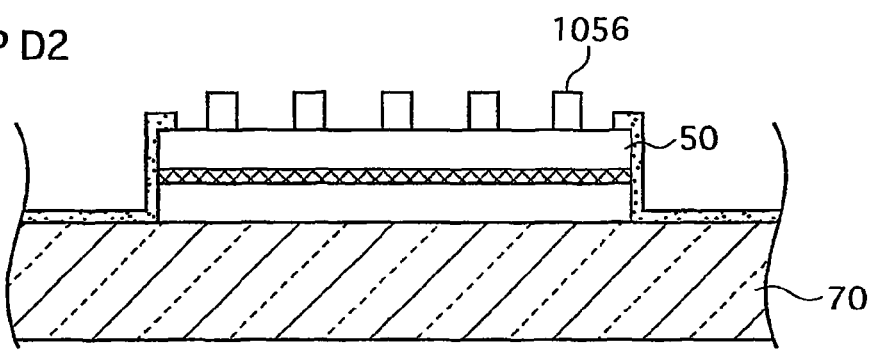
Figure 9:
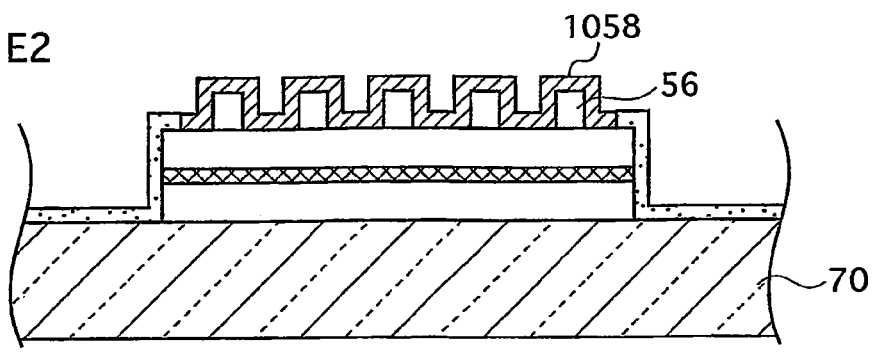
FIG. 9 illustrates part of the manufacturing process of the LED chip relating to the second embodiment.
Figure 9:
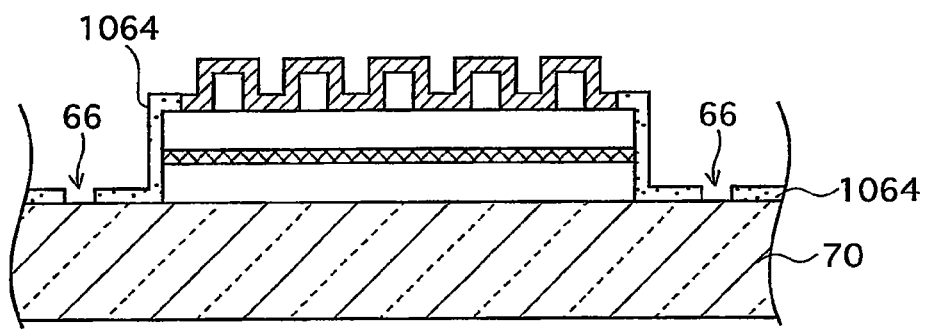
Figure 9:
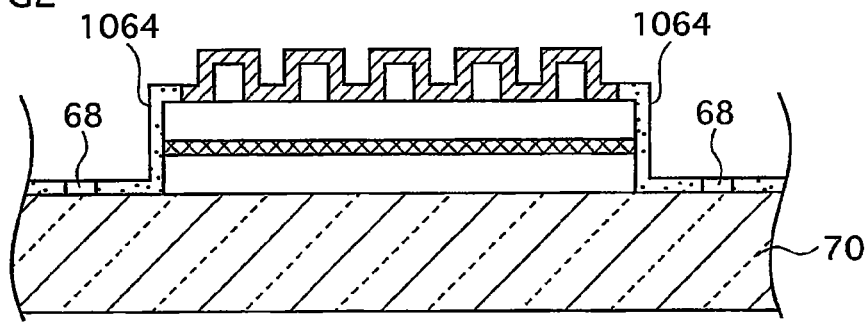
Figure 9:
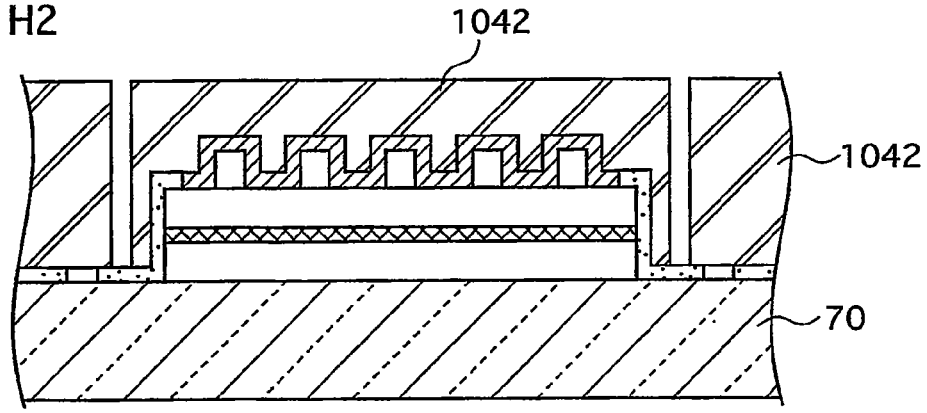
Figure 10:
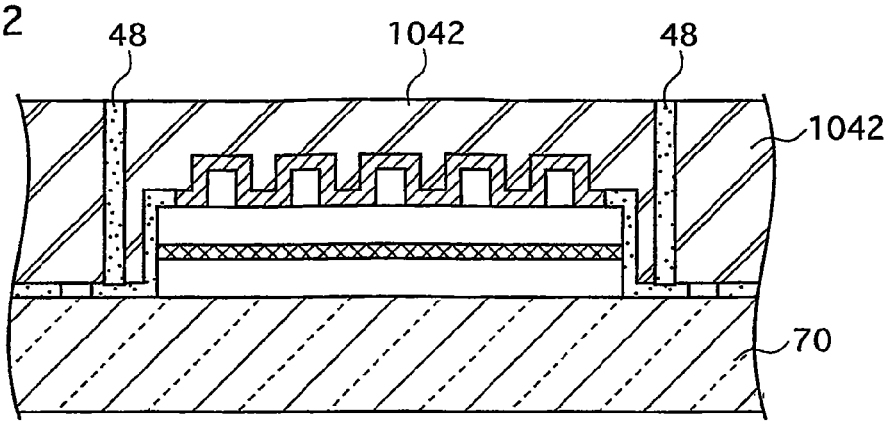
FIG. 10 illustrates part of the manufacturing process of the LED chip relating to the second embodiment.
Figure 10:
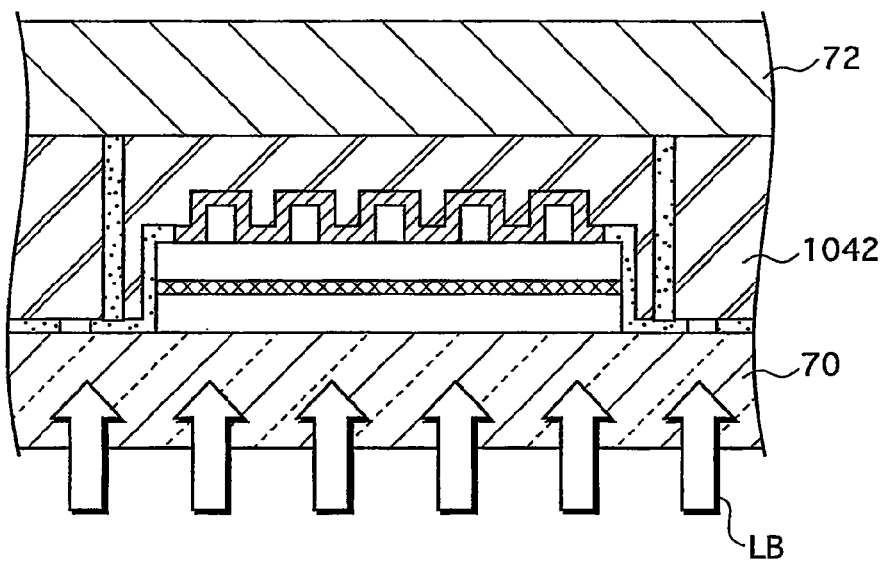
Figure 10:
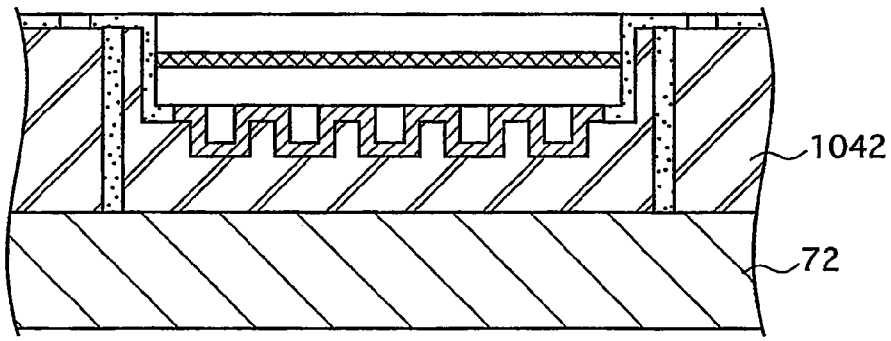
Figure 11:
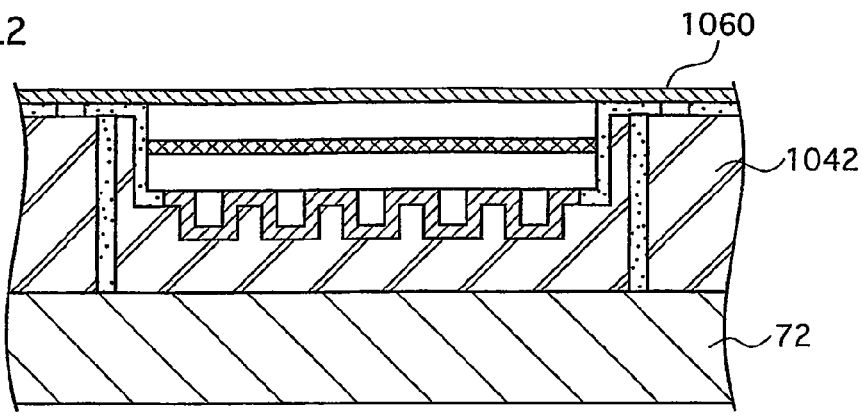
FIG. 11 illustrates part of the manufacturing process of the LED chip relating to the second embodiment.
Figure 11:
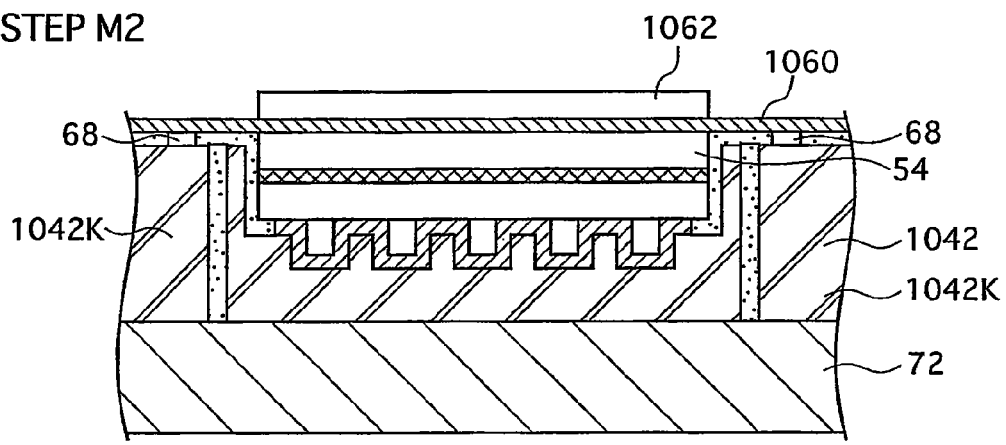
Figure 11:
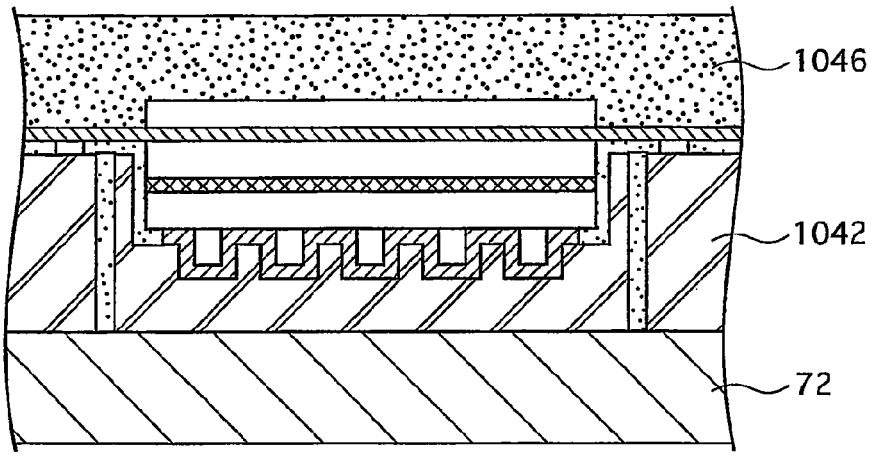
Figure 12:
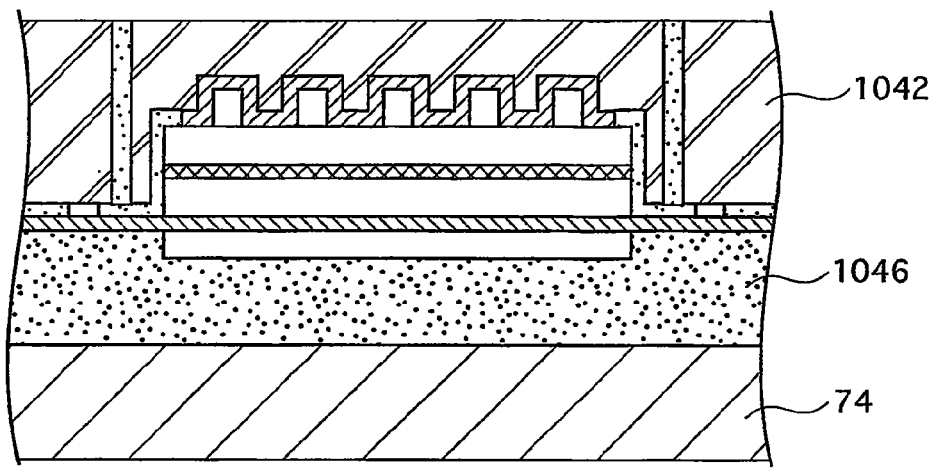
FIG. 12 illustrates part of the manufacturing process of the LED chip relating to the second embodiment.
Figure 12:
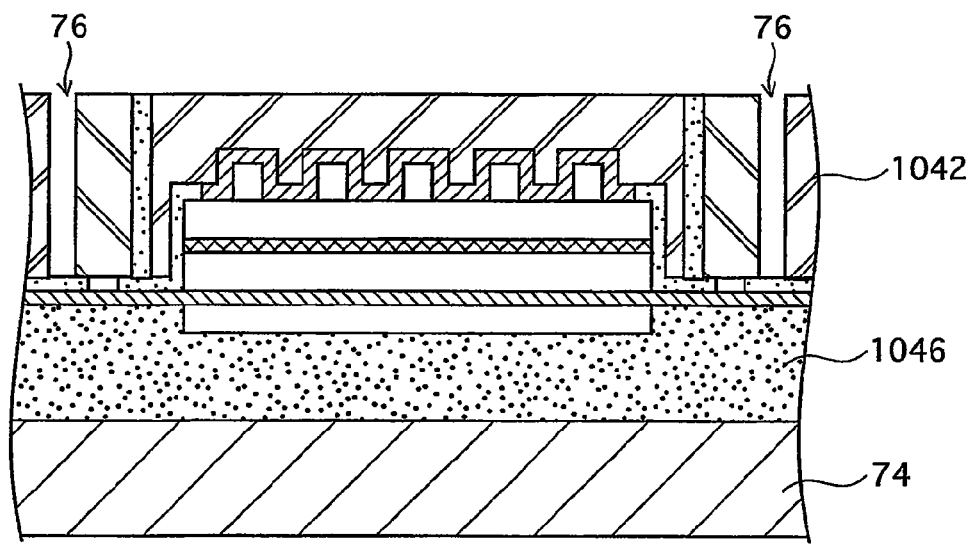
Figure 13:
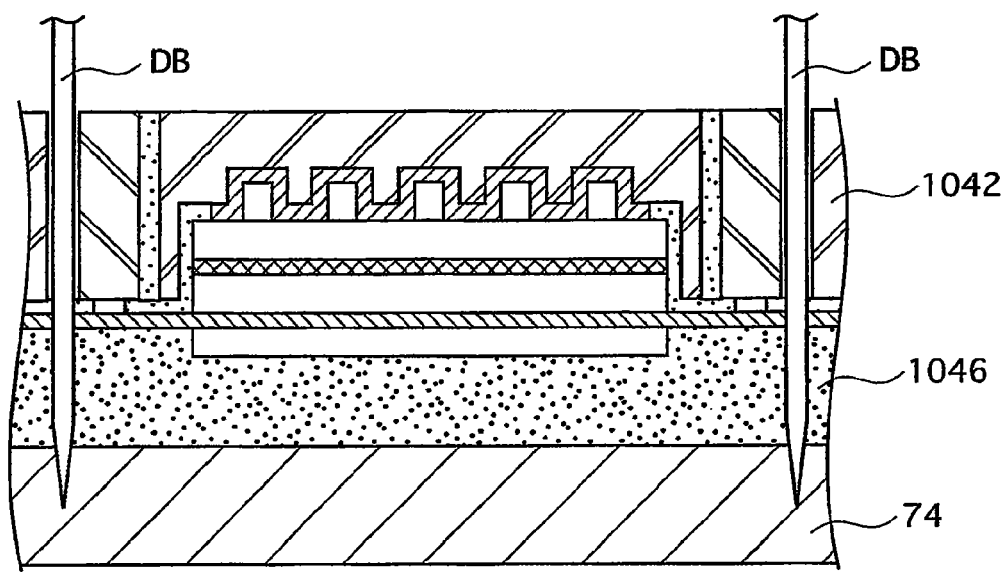
FIG. 13 illustrates part of the manufacturing process of the LED chip relating to the second embodiment.

Firstly, as shown in FIG. 8, a GaN layer (not shown in FIG. 8), an n-AlGaN layer 1054, an InGaN/AlGaN MQW light emitting layer 1052, and a p-AlGaN layer 1050 are formed by epitaxial growth on a sapphire substrate 70 in the stated order using an MOCVD method, to form a multilayer epitaxial structure 1044 (step A2). Here, the sapphire substrate 70 has a diameter of two inches and a thickness of 300 μm.

After this, a mask is formed on the multilayer epitaxial structure 1044, and an unmasked area of the multilayer epitaxial structure 1044 is removed by dry etching to such a depth that the sapphire substrate 70 is exposed. Thus, multilayer epitaxial structures 44 (shown in FIG. 7A), each of which constitutes the LED chip 40 are formed on the sapphire substrate 70 (step B2).

After this, a silicon nitride film 1064 is deposited on the entire resulting surface after the step B2 by RF sputtering or the like for insulation and surface protection. Here, the silicon nitride film 1064 may be replaced with a silicon oxide film or the like. The silicon nitride film 1064 is removed by etching, except for a portion formed on every side surface of the multilayer epitaxial structure 44. In this way, the p-AlGaN layer 50 is exposed (step C2). An $SiO_2/Ta_2O_5$ multilayer dielectric film 1056 is then formed by RF sputtering or the like in an area of the silicon nitride film 1064 in which the p-AlGaN layer 50 is exposed. The multilayer dielectric film 1056 is partly removed by etching to such a depth that the p-AlGaN layer 50 is exposed (step D2). Subsequently, an Rh/Pt/Au highly-reflective electrode 1058 is formed by an electron beam evaporation method or the like (step E2).

After this, the silicon nitride film 1064 is partly removed by etching, to provide the contact holes 66 (step F2). The contact holes 66 are filled with Pt/Au, to form the conductive members 68 (step G2).

Subsequently, a resist or the like (not shown in FIG. 9) is formed in an area of the silicon nitride film 1064 in which the polyimide members 48 are to be formed. A Ti/Au thin film undercoating (not shown in FIG. 9) is then formed on the entire resulting surface by an electron beam evaporation method or the like. In addition, an Au plating layer 1042 is formed at a thickness of 50 μm (step H2). Here, the resist or the like creates a space in the Au plating layer 1042. After the resist is removed, the space is filled with a polyimide resin, to form the polyimide member 48 (step I2). Instead of a polyimide resin, a polyamideimide resin may be used. Having excellent heat resistance, a polyimide resin and a polyamideimide resin are able to endure heating performed in a mounting process of the LED chip 40.

In the next steps J2 and K2, the sapphire substrate 70 is separated. A method to separate the sapphire substrate 70 is the same as in the first embodiment, and therefore not repeatedly described here. It should be noted that a first macromolecule film 72 used in the steps J2 and K2 (shown in FIG. 10) corresponds to the first macromolecule film 28 in the first embodiment.

After the sapphire substrate 70 is separated, an ITO transparent electrode 1060 is formed by RF sputtering or the like on the entire surface which is created by separating the sapphire substrate 70 (step L2). A multilayer dielectric film 1062 is then formed on the ITO transparent electrode 1060 (step M2). Thus, the n-AlGaN layer 54 is electrically connected to cathode power supply terminals 1042K which are part of the Au plating layer 1042, by means of the ITO transparent electrode 1060 and the conductive member 68.

To form a phosphor layer 1046, the above-described silicone resin in which particles of blue, green, yellow and red phosphors and fine particles of metal oxide such as $SiO_2$ are dispersed is applied to the entire resulting surface after the step M2. After the silicone resin is heated to be cured, the phosphor layer 1046 is ground so as to have a predetermined thickness, for example, 200□μm. The grinding has a purpose of reducing unevenness of color and achieving a predetermined color temperature (step N2).

After this, the Au plating layer 1042 is divided for each LED chip 40. To do this, the first macromolecule film 72 is removed, and a second macromolecule film 74 is adhered to the phosphor layer 1046 as a dicing sheet (step O2).

Subsequently, the Au plating layer 1042 is partly removed by etching, so that grooves 76 are formed vertically and horizontally when the Au plating layer 1042 is seen from above. In this way, the Au plating layer 1042 is divided for each LED chip 40 (step P2). Then, dicing blades DB are inserted into the grooves 76 to divide the phosphor layer 1046 for each LED chip 40. Thus, the LED chip 40 is completed (step Q2).

Third Embodiment

Figure 14A:
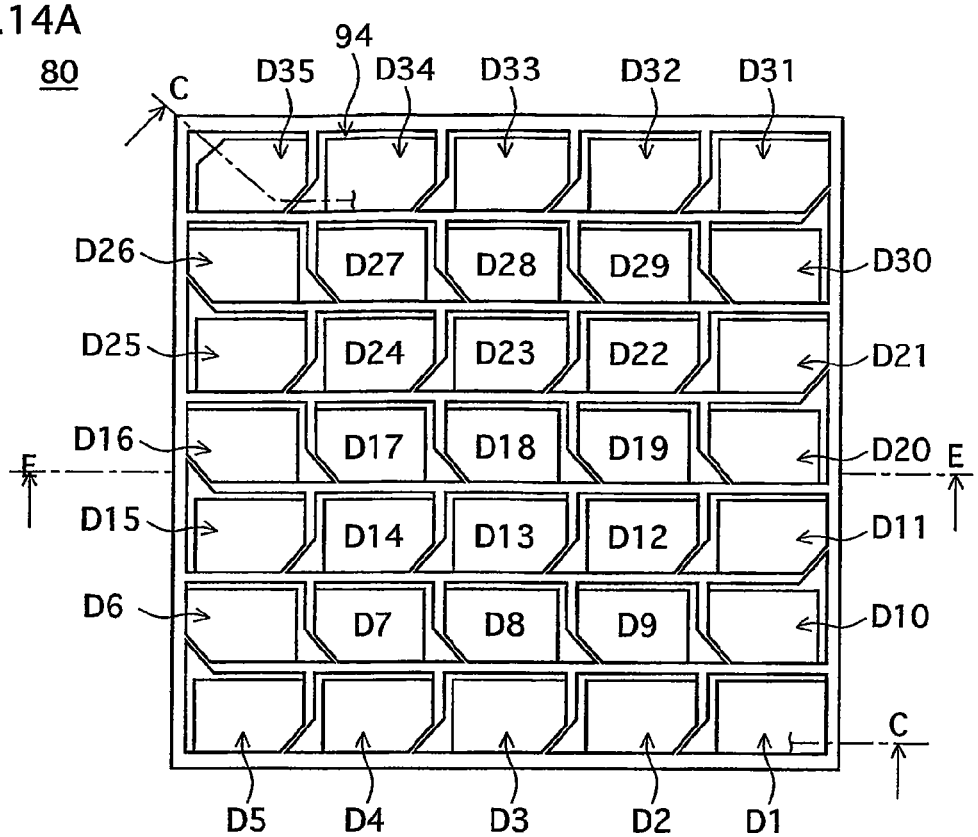
FIG. 14A is a plan view illustrating the LED array chip by removing a phosphor layer.
Figure 14B:
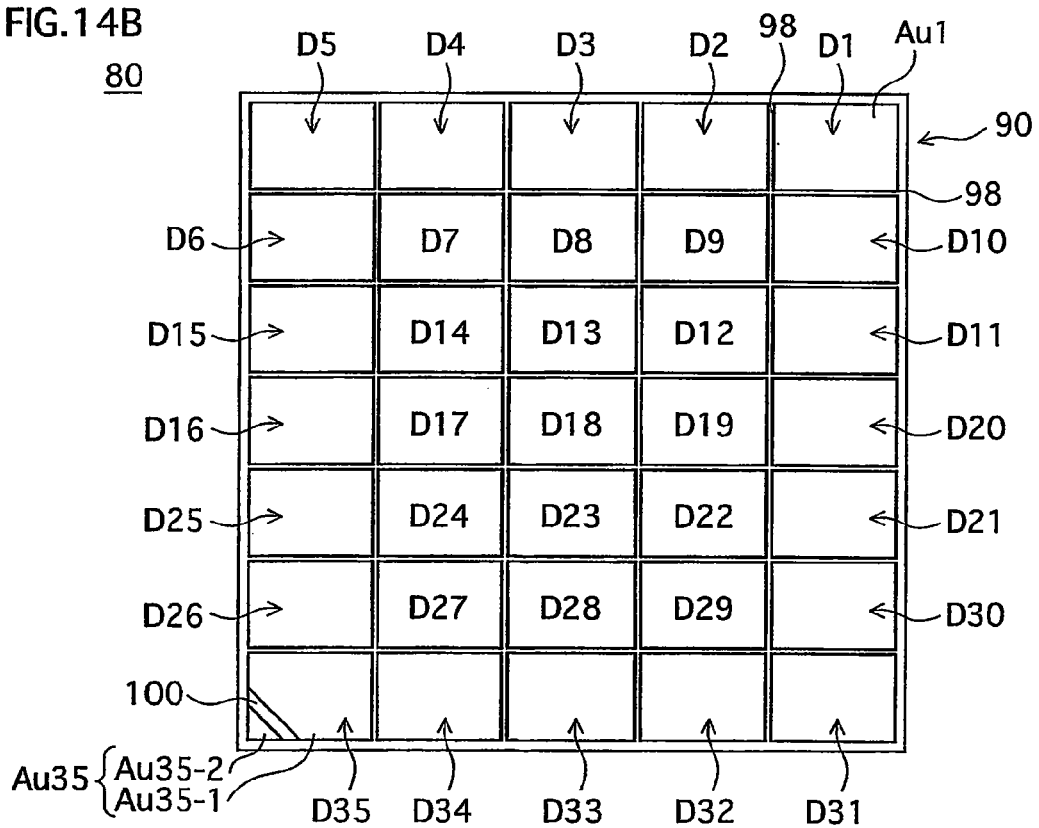
FIG. 14B is a bottom plan view.

FIG. 14A is a plan view illustrating an LED array chip 80 which is one type of a semiconductor light emitting device, and FIG. 14B is a bottom plan view illustrating the LED array chip 80. It should be noted that a phosphor layer 96 (shown in FIG. 15A and mentioned later) is not shown in FIG. 14A.

As shown in FIG. 14, the LED array chip 80 is formed in such a manner that 35 LEDs (D1 to D35) are arranged in a matrix of seven rows and five columns. A size of each of the LEDs D1 to D35 is 285 μm×400 μm, and the LED array chip 80 is 2-mm-square. Each of the LEDs D1 to D35 basically has the same construction as the LED chip 2 relating to the first embodiment. In the LED array chip 80, the LEDs D1 to D35 are connected in series in this order as shown in FIG. 15B. The LED D1 is an LED on a higher potential end of the LED array chip 80, and the LED D35 is an LED on a lower potential end. How the LEDs D1 to D35 are connected together is described later.

Figure 15A:
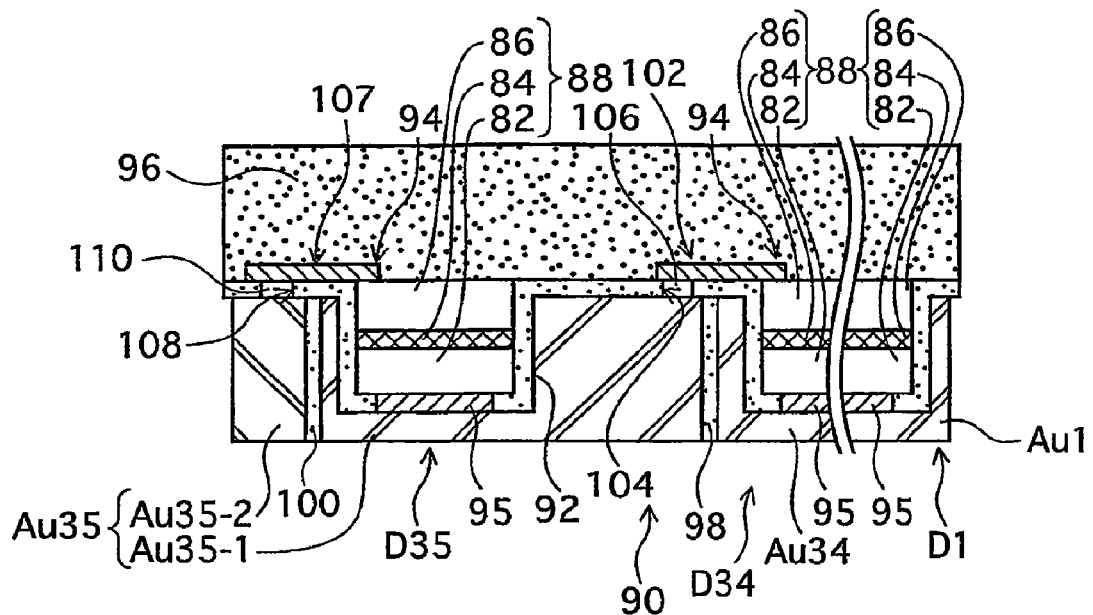
FIG. 15A illustrates a cross-section along a line CC shown in FIG. 14A.
Figure 15B:
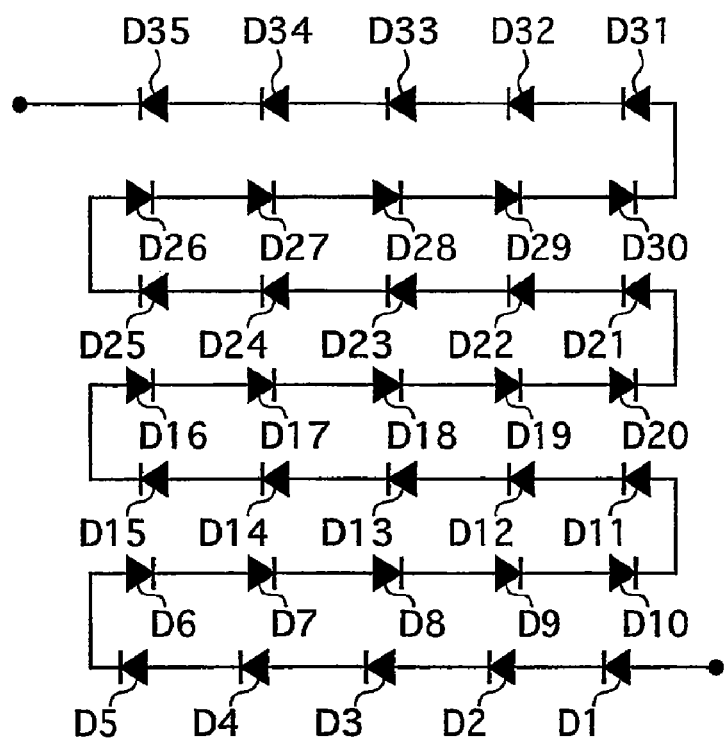
FIG. 15B illustrates how LEDs are connected to each other in the LED array chip relating to the third embodiment.

FIG. 15A illustrates a cross-section of the LED array chip 80 along a line CC shown in FIG. 14A. FIG. 15A therefore illustrates the LED D35, and part of the LEDs D34 and D1.

As mentioned above, each of the LEDs D1 to D35 basically has the same construction as the LED chip 2 relating to the first embodiment. To be specific, each LED in the LED array chip 80 includes a multilayer epitaxial structure 88 in which a p-GaN layer 82, an InGaN/GaN MQW light emitting layer 84, and an n-GaN layer 86 are formed in this order. Furthermore, an Au plating layer 90 is formed on the multilayer epitaxial structure 88, where the p-GaN layer 82 is positioned closer to the Au plating layer 90 than the n-GaN layer 86 is in a vertical direction. Here, the Au plating layer 90 and the multilayer epitaxial structure 88 are insulated from each other by means of a silicon nitride layer 92. The p-GaN layer 82 is connected to the Au plating layer 90 by means of an Rh/Pt/Au highly-reflective p-electrode 95. A Ti/Pt/Au n-electrode 94 is formed so as to be partly in contact with the n-GaN layer 86. In addition, the phosphor layer 96 is formed on the multilayer epitaxial structure 88, where the n-GaN layer 86 is positioned closer to the phosphor layer 96 than the p-GaN layer 82 is. Here, the phosphor layer 96 has the same composition as the phosphor layer 8 relating to the first embodiment. In addition, each of the layers 82, 84 and 86 constituting the multilayer epitaxial structure 88, the Au plating layer 90, and the phosphor layer 96 is the same in thickness as the corresponding components in the LED chip 2 relating to the first embodiment.

The Au plating layer 90 is electrically divided for each of the LEDs D1 to D35, by means of polyimide members 98 that run vertically and horizontally when the Au plating layer 90 is seen from above, as shown in FIG. 14B. Which is to say, the Au plating layer 90 is divided into 35 portions. The portions of the Au plating layer 90 are each identified by addition of a number of a corresponding LED. In detail, an Au plating layer of the LED D1 is represented by Au1, and an Au plating layer of the LED D35 is represented by Au35. Of the 35 Au plating layers (Au1 to Au35) created by dividing the Au plating layer 90, the Au plating layer Au35 of the LED D35 is further electrically divided into two portions by a polyimide member 100. As a consequence, the Au plating layer 90 is divided into 36 portions in total. One of the two portions of the Au plating layer Au35 which is connected to a p-electrode 95 of the LED 35 is identified as Au35-1, and the other Au35-2.

The following part describes how the LEDs D1 to D35 are connected together in the LED array chip 80. As each LED is connected to an adjacent LED in substantially the same manner, the following description is made using the LEDs D34 and D35 as an example, with reference to FIG. 15A. A Ti/Pt/Au wiring 102 horizontally extends from an n-electrode 94 of the LED D34, to reach above the Au plating layer Au35-1 of the LED D35. Here, a contact hole 104 is provided at a location, in the silicon nitride layer 92, which is close to an end of the wiring 102. The contact hole 104 is filled with an Rh/Pt/Au conductive member 106. Thus, the n-electrode 94 of the LED D34 is electrically connected to the p-electrode 95 of the LED D35, by means of the wiring 102, the conductive member 106, and the Au plating layer Au35-1. In the same manner, the LEDs D33 to D1 are connected together, so that the LEDs D1 to D35 are connected in series in the manner shown in FIG. 15B.

Furthermore, a Ti/Pt/Au wiring 107 horizontally extends from an n-electrode 94 of the LED D35, to reach above the Au plating layer Au35-2. A contact hole 108 is provided at a location in the silicon nitride layer 92 which is close to an end of the wiring 107. Here, the contact hole 108 is filled with an Rh/Pt/Au conductive member 110. Thus, the n-electrode 94 of the LED D35 is electrically connected to the Au plating layer Au35-2, by means of the wiring 107 and the conductive member 110. In other words, an end portion of the wiring 107 which is connected to the n-electrode 94 extends from the n-electrode 94 in a direction parallel to an upper main surface of the n-GaN layer 86 (the light extraction surface), as in the first and second embodiments.

In the LED array chip 80 in which the LEDs D1 to D35 are connected as described above, the Au plating layer Au1 of the LED D1 on a higher potential end of the LED array chip 80 is constituted as an anode power supply terminal of the LED array chip 80, and the Au plating layer Au35-2 of the LED D35 on a lower potential end is constituted as a cathode power supply terminal.

When power is supplied to this LED array chip 80 through the anode power supply terminal Au1 and the cathode power supply terminal Au35-2, the light emitting layer 84 in each of the LEDs D1 to D35 emits blue light having a wavelength of 460 nm.

Part of the blue light is emitted from the light emitting layer 84 towards the Au plating layer 90, and reflected by the highly-reflective p-electrode 95 towards the phosphor layer 96. Accordingly, the blue light emitted by the light emitting layer 84 is, to a large extent, emitted outside through the phosphor layer 96. Part of the light is absorbed by the phosphor layer 96, to be converted into yellow light. The blue light and the yellow light mix together, to produce white light. The white light is emitted from an upper surface of the phosphor layer 96.

A commercial power source of 100 V is equivalent to a direct-current power source of approximately 140 V, when converted. To drive one LED with this direct-current power source, a voltage of 140 V needs to be lowered to 3 V to 4 V by limiting resistance or the like. This causes a decrease in circuit efficiency. However, the LED array chip 80 (one type of a semiconductor light emitting device) relating to the third embodiment can achieve a high circuit efficiency for the following reason. As described above, the 35 LEDs D1 to D35 are connected in series in the LED array chip 80. This means that a driving voltage applied between the anode power supply terminal Au1 and the cathode power supply terminal Au35-2 is 35 times as high as a driving voltage applied to each LED, i.e. approximately 140 V. Therefore, the direct-current power source can be connected to the LED array chip 80 without adding limiting resistance or the like.

The third embodiment produces the same effects as the first embodiment. Specifically speaking, having the Rh/Pt/Au highly-reflective electrode 95 on a lower surface of each multilayer epitaxial structure 88, the LED array chip 80 can achieve a significantly higher light extraction efficiency. Furthermore, the p-electrode 95 is formed on substantially the entire surface of the p-GaN layer 82 which is difficult to be configured to have low resistance. This enables an electric current to be evenly injected into the entire semiconductor light emitting layer 84. As a result, the entire light emitting layer 84 emits light evenly, and a lower operation voltage can be achieved. In addition, the Au plating layer 90, which is highly heat-conductive, is formed on a lower side of the multilayer epitaxial structure 88. This makes it easy to dissipate heat mainly generated by the light emitting layer 84 to a mounting substrate (mentioned later). Accordingly, an increase in temperature of the light emitting layer 84 can be reduced even when large amounts of electric current are injected. As a consequence, the LED array chip 80 can attain a high output and a long lifetime. Moreover, the anode power supply terminal Au1 and the cathode power supply terminal Au35-2 are provided on the lower surface of the multilayer epitaxial structure 88. No components that block light emitted from the light emitting layer 84 exist on or above the upper surface of the multilayer epitaxial structure 88. As a result, light emitted from the LED array chip 80 does not contain shadow. In addition, since the LED array chip 80 does not include an insulating substrate such as a sapphire substrate, an ability to withstand static electricity is improved.

The following part describes a manufacturing method of this LED array chip 80 with reference to FIGS. 16 to 20. FIGS. 16 to 20 each illustrate part of a cross-section along a line EE shown in FIG. 14A.

In FIGS. 16 to 20, a material to form each constituent of the LED array chip 80 is identified by a four-digit number whose first digit is two. The last three digits of the four-digit number represents a reference numeral identifying the corresponding constituent of the LED array chip 80. The manufacturing method of the LED array chip 80 is basically the same as that of the LED chip 2 relating to the first embodiment, except for a pattern of dividing the Au plating layer 90 and a unit for dicing. The following description is therefore somewhat simplified.

Figure 16:
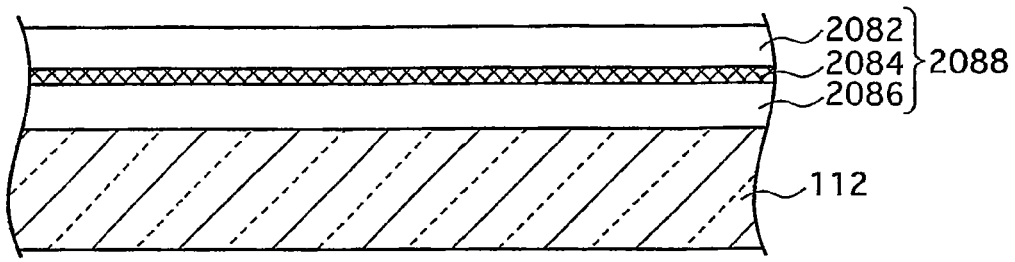
FIG. 16 illustrates part of a manufacturing process of the LED array chip relating to the third embodiment.
Figure 16:
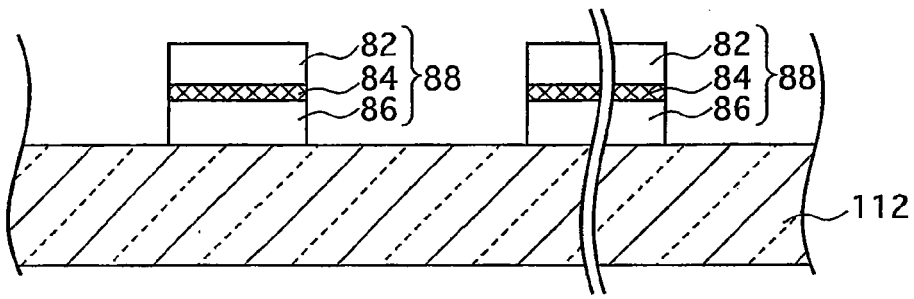
Figure 16:
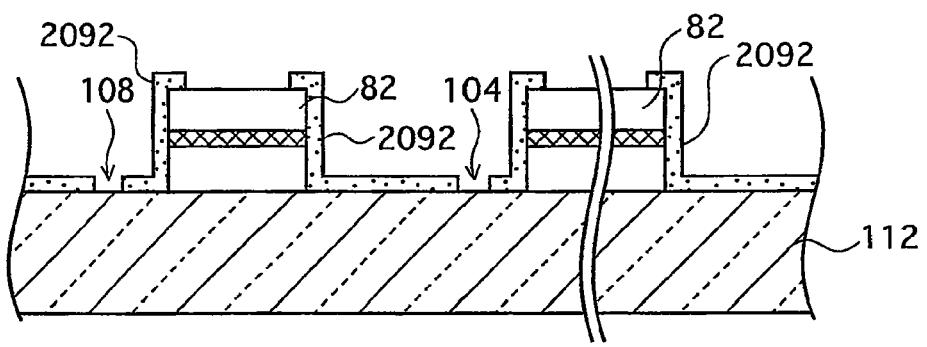
Figure 16:
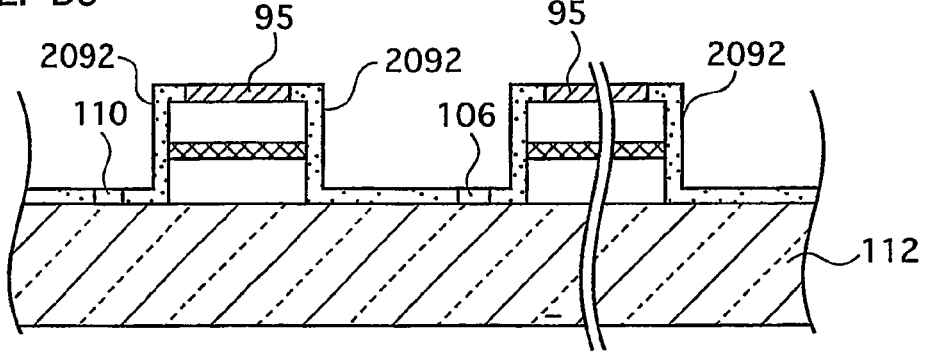
Figure 17:
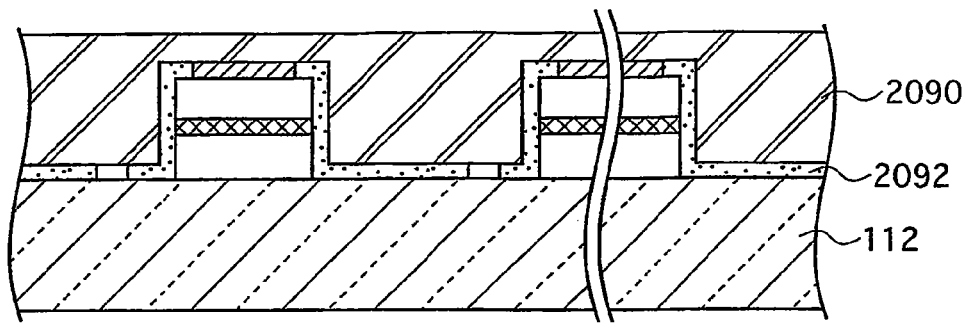
FIG. 17 illustrates part of the manufacturing process of the LED array chip relating to the third embodiment.
Figure 17:
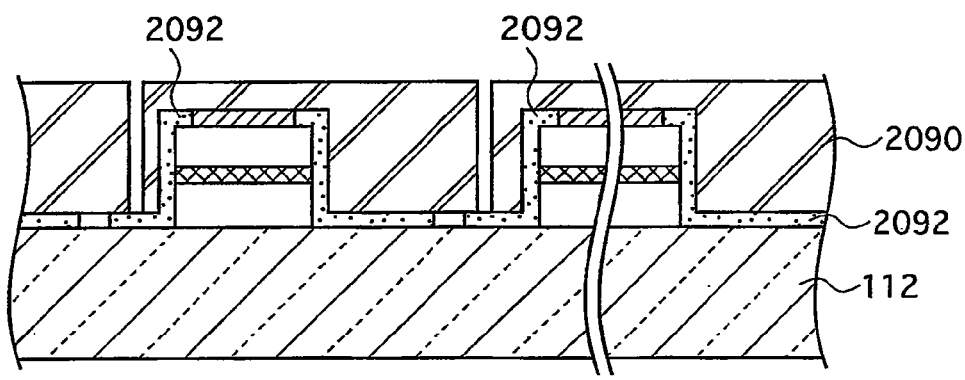
Figure 17:
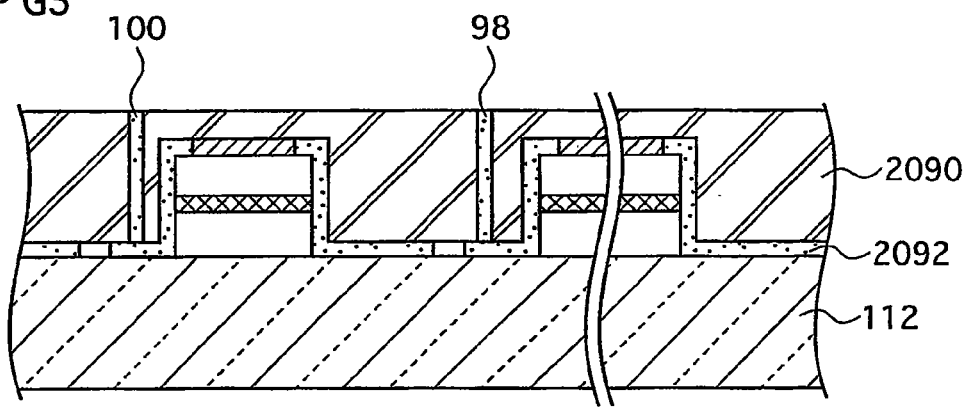
Figure 18:
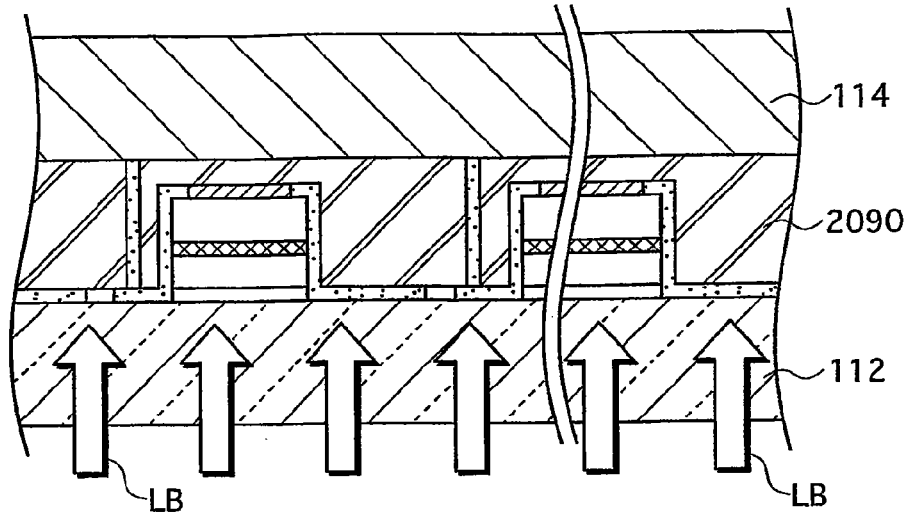
FIG. 18 illustrates part of the manufacturing process of the LED array chip relating to the third embodiment.
Figure 18:
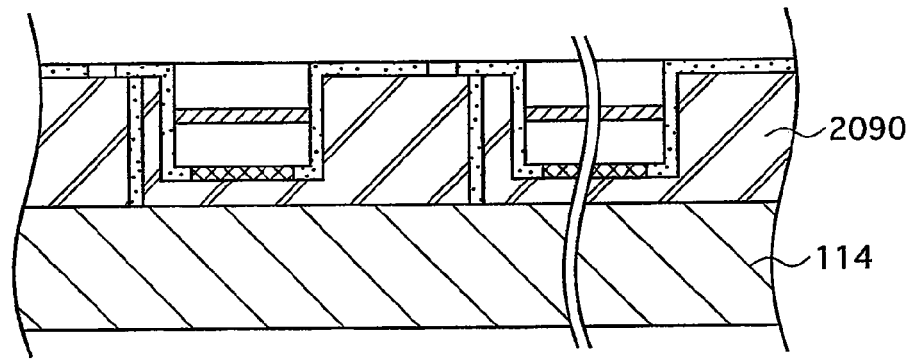
Figure 18:
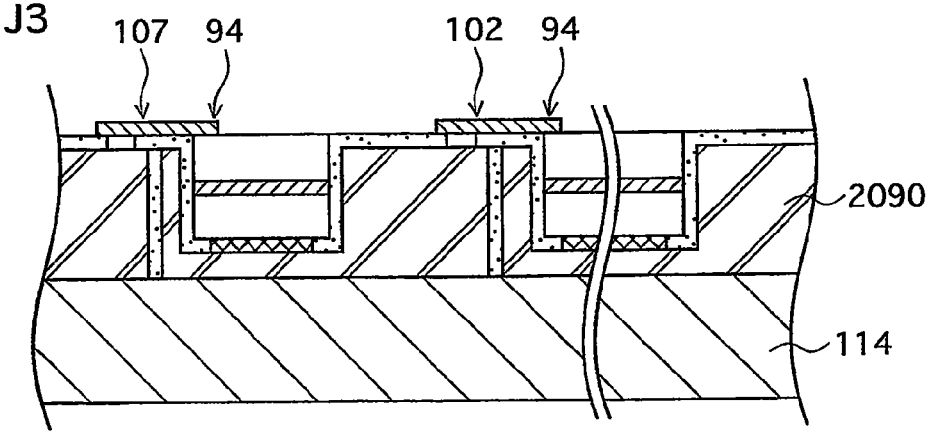
Figure 19:
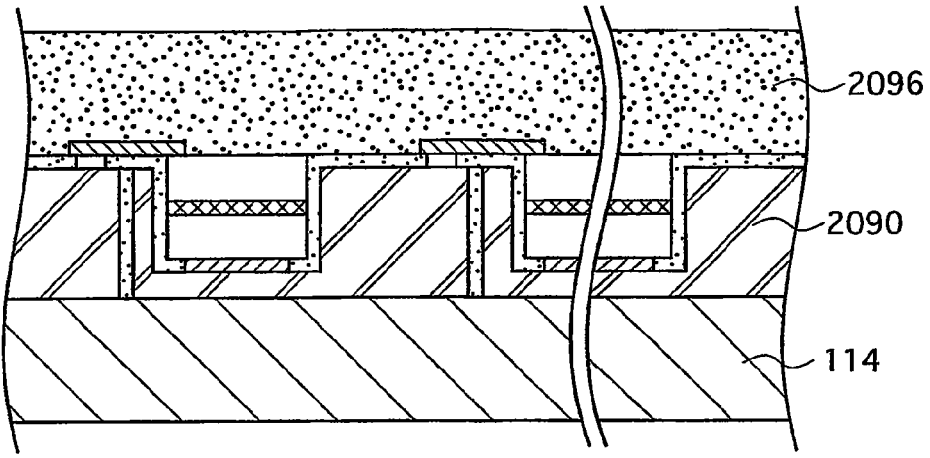
FIG. 19 illustrates part of the manufacturing process of the LED array chip relating to the third embodiment.
Figure 19:
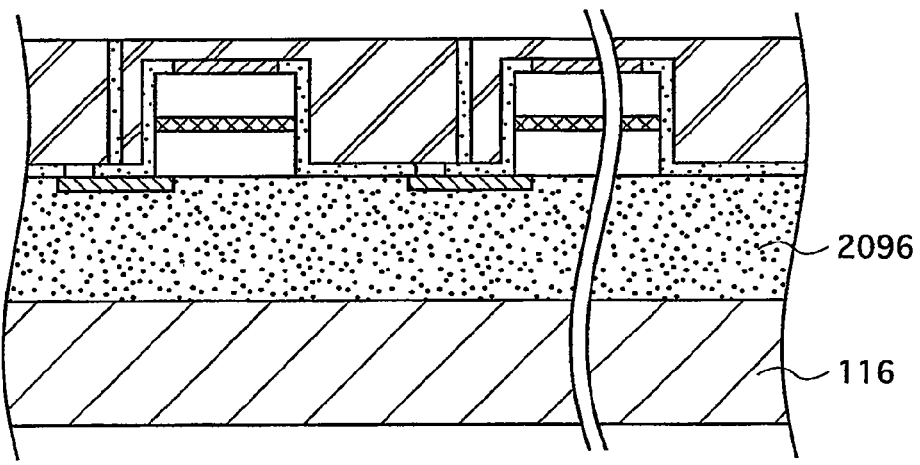
Figure 19:
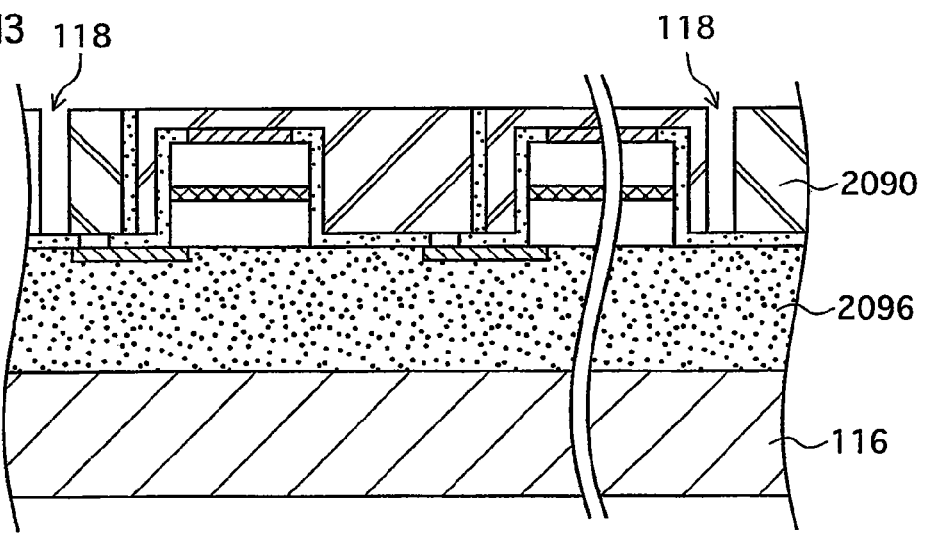
Figure 20:
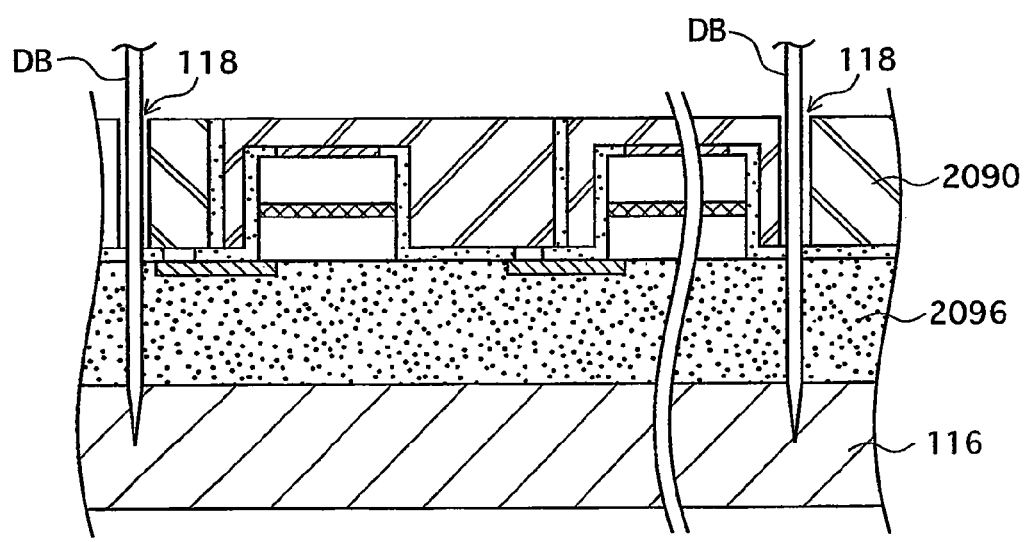
FIG. 20 illustrates part of the manufacturing process of the LED array chip relating to the third embodiment.

To start with, an n-GaN layer 2086, an InGaN/GaN MQW light emitting layer 2084 and a p-GaN layer 2082 are formed in this order on a sapphire substrate 112 using a MOCVD method as shown in FIG. 16 (step A3). The layers 2082, 2084 and 2086 form a multilayer epitaxial structure 2088. Here, the sapphire substrate 112 has a diameter of two inches and a thickness of 300 μm as in the first embodiment.

The multilayer epitaxial structure 2088 is partly masked, and an unmasked area of the multilayer epitaxial structure 2088 is removed by dry etching to such a depth that the sapphire substrate 112 is exposed. Thus, multilayer epitaxial structures 88 (see FIG. 15A) each of which constitutes an LED in the LED array chip 80 are formed (step B3).

After this, a silicon nitride film 2092 is deposited on the entire resulting surface after the step B3 by RF sputtering or the like for insulation and surface protection. Here, the silicon nitride film 2092 may be replaced with a silicon oxide film or the like. Subsequently, the silicon nitride film 2092 is partly removed by etching. As a result, an area of the silicon nitride film 2092 in which the p-electrode 95 (shown in FIG. 15A) is to be formed, and an area of the silicon nitride film 2092 in which the contact holes 104 and 108 are to be provided are removed. Thus, the p-GaN layer 82 is exposed, and the contact holes 104 and 108 are provided (step C3). In these areas, Rh/Pt/Au is applied by an electron beam evaporation method or the like (step D3). In this way, the p-electrode 95 and the conductive members 106 and 110 are formed.

After this, a Ti/Au thin film undercoating (not shown in FIG. 17) is formed on the entire resulting surface after the step D3, by an electron beam evaporation method or the like. On the undercoating, an Au plating layer 2090 is formed at a thickness of 50 μm (step E3). Subsequently, the Au plating layer 2090 is partly removed by etching with use of iodine or the like, to such a depth that the silicon nitride film 2092 is exposed. Thus, the Au plating layer 2090 is electrically divided into Au plating layers Au1 to Au35, Au35-1 and Au35-2 (step F3). Furthermore, spaces created by the etching in the step F3 are filled with a polyimide resin, to form the polyimide members 98 and 100 (step G3).

After a first macromolecule film 114 is adhered to the Au plating layer 2090, the sapphire substrate 112 is separated using the same method as in the first embodiment (steps H3 and 13).

After the sapphire substrate 112 is separated, a Ti/Pt/Au film is formed in a predetermined area, so that the n-electrode 94 and the wirings 102 and 107 are formed (step J3).

Subsequently, to form a phosphor layer 2096, the above-described silicone resin in which particles of a yellow phosphor and fine particles of metal oxide such as $SiO_2$ are dispersed is applied to the entire resulting surface after the step J3. After the silicone resin is heated to be cured, the phosphor layer 2096 is ground so as to have a predetermined thickness, for example, 50 μm (step K3). As described, the phosphor layer 2096 is first formed at a thickness larger than the predetermined thickness, and then ground to have the predetermined thickness. Thus, the third embodiment produces the same effects as the first embodiment.

After this, the Au plating layer 2090 is divided for each LED array chip 80. To do this, the first macromolecule film 114 is removed, and a second macromolecule film 116 is adhered to the phosphor layer 2096 (step L3).

Subsequently, grooves 118 are created vertically and horizontally when the Au plating layer 2090 seen from above by removing part of the Au plating layer 2090 by etching. As a result, the Au plating layer 2090 is divided for each LED array chip 80 (step M3). Then, dicing blades DB (in FIG. 20) are inserted into the grooves 118, to divide the phosphor layer 2096 for each LED array chip 80 (step N3). Thus, the LED array chip 80 is completed.

Fourth Embodiment

Figure 21A:
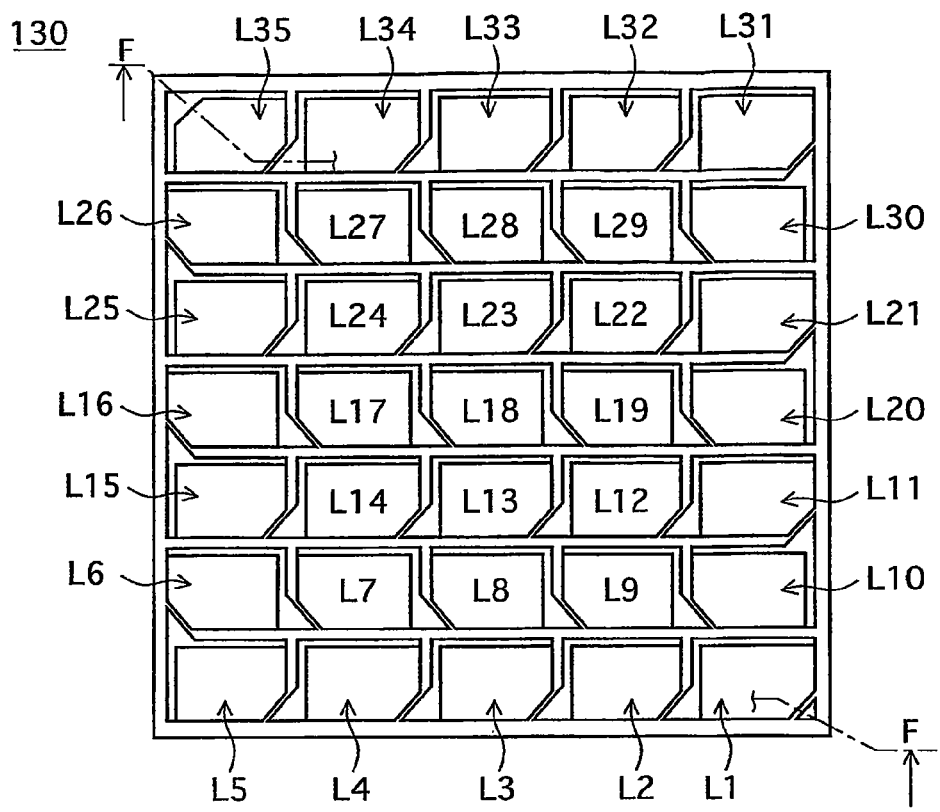
FIG. 21A is a plan view illustrating the LED array chip by removing a phosphor layer.
Figure 21B:
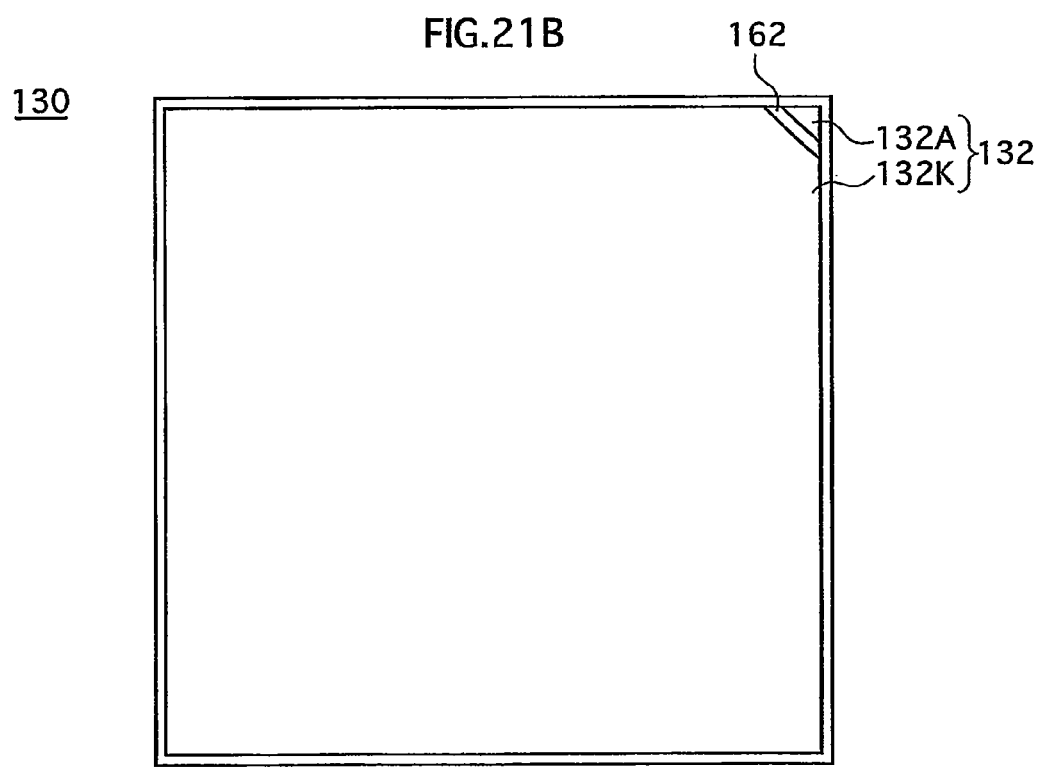
FIG. 21B is a bottom plan view.

FIG. 21A is a plan view illustrating an LED array chip 130 which is one type of a semiconductor light emitting device, and FIG. 21B is a bottom plan view illustrating the LED array chip 130. It should be noted that a phosphor layer 148 (shown in FIG. 22A and mentioned later) is not shown in FIG. 21A.

As shown in FIG. 21A, the LED array chip 130 is formed in such a manner that 35 LEDs (L1 to L35) are arranged in a matrix of seven rows and five columns. A size of each of the LEDs L1 to L35 is 285 μm×400 μm, and the LED array chip 130 is 2-mm-square. The LEDs L1 to L35 are provided on an Au plating layer 132 (mentioned later) with an insulating layer 134 therebetween, and each LED is constituted as an independent light emitting element. In the LED array chip 130, the LEDs L1 to L35 are connected in series in this order as shown in FIG. 22B. The LED L1 is an LED on a higher potential end of the LED array chip 130, and the LED L35 is an LED on a lower potential end. How the LEDs L1 to L35 are connected together is described later.

Figure 22A:
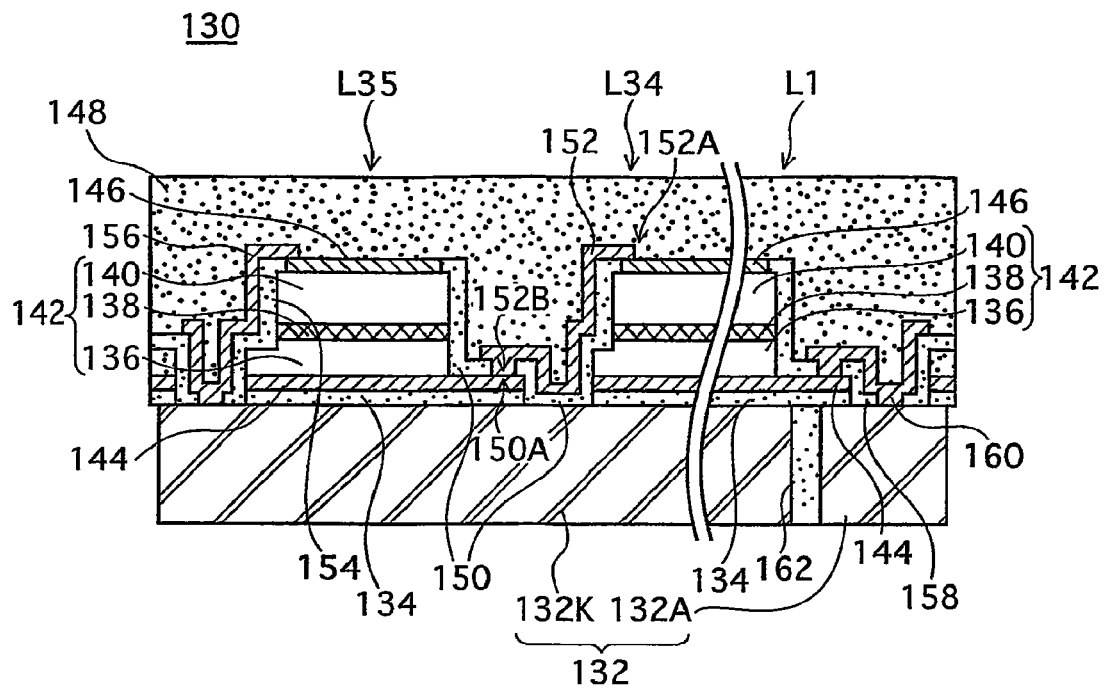
FIG. 22A illustrates a cross-section along a line FF shown in FIG. 21A
Figure 22B:
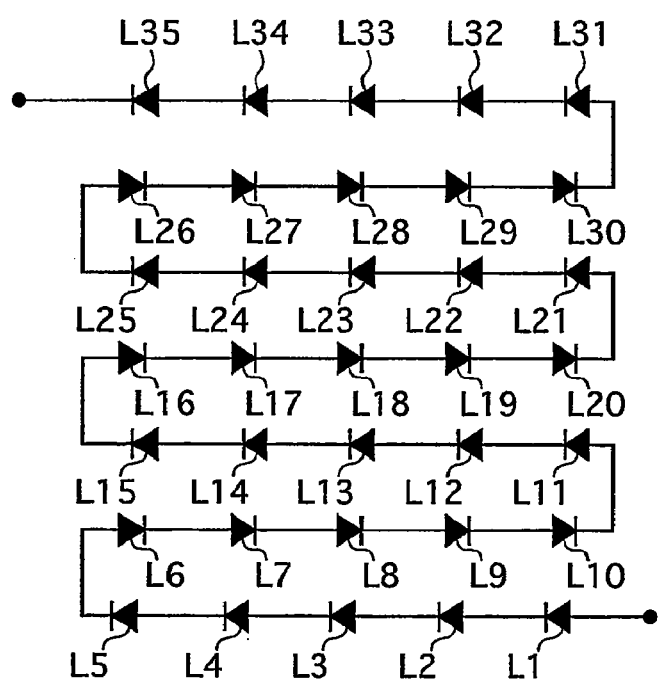
FIG. 22B illustrates how LEDs are connected to each other in the LED array chip relating to the fourth embodiment.

FIG. 22A illustrates a cross-section of the LED array chip 130 along a line FF shown in FIG. 21A. In other words, FIG. 22A shows the LED L35 and part of the LEDs L34 and L1. Here, it should be noted that each of the LEDs L1 to L35 basically has the same construction.

The LEDs L1 to L35 are formed on the Au plating layer 132, by means of a silicon nitride layer 134, which is an insulating layer. Furthermore, each of the LEDs L1 to L35 has a multilayer epitaxial structure 142 formed by a p-AlGaN layer 136 (having a thickness of 200 nm), an InGaN/AlGaN MQW light emitting layer 138 (having a thickness of 40 nm), and an n-AlGaN layer 140 (having a thickness of 2 μm). The layers 136, 138 and 140 are formed in this order, to have a diode structure, where the layer 136 is positioned the closest to the Au plating layer 132. An Rh/Pt/Au highly-reflective p-electrode 144 is formed on the entire main surface of the p-AlGaN layer 136 which faces away from the light emitting layer 138. A Ti/Au transparent thin-film n-electrode 146 is formed on substantially the entire main surface of the n-AlGaN layer 140 which faces away from the light emitting layer 138.

The phosphor layer 148 is formed on the LEDs L1 to L35. The phosphor layer 148 is made of a light-transmitting resin such as silicone in which particles of phosphors of four different colors and fine particles of metal oxide such as $SiO_2$ are dispersed. Such phosphors include a blue phosphor which contains at least one of $(Ba, Sr)MgAl_{10}O_{17}:Eu^{2+}$, $(Ba, Sr, Ca, Mg)_{10}(PO_4)_6Cl_2:Eu^{2+}$ and the like, a green phosphor which contains at least one of $BaMgAl_{10}O_{17}:Eu^{2+}Mn^{2+}$, $(Ba, Sr)_2SiO_4:Eu^{2+}$ and the like, a yellow phosphor which contains, for example, $(Sr, Ba)_2SiO_4:Eu^{2+}$, and a red phosphor which contains at least one of $La_2O_2S:Eu^{3+}$, $CaS:Eu^{2+}$, $(Ca, Sr, Ba)_3Si_5N_8:Eu^{2+}$ and the like. Instead of silicone, an epoxy resin or a polyimide resin may be used as the light-transmitting resin. The Au plating layer 132 and the phosphor layer 148 each have a thickness of approximately 50 μm.

The following part describes how the LEDs L1 to L35 are connected together. In the LED array chip 130, each of the LEDs L1 to L35 is connected to an adjacent LED in the same manner. Therefore, the following description is made using the LEDs L34 and L35 as an example, with reference to FIG. 22A. A silicon nitride film 150, which is an insulating film, is formed on part of side surfaces of the multilayer epitaxial structure 142 and part of an upper surface of the Au plating layer 132. A Ti/Pt/Au conductor bridging wire 152 is formed on the silicon nitride film 150. An end portion 152A of the conductor bridging wire 152 is connected to an n-electrode 146 of the LED L34. The other end portion 152B of the conductor bridging wire 152 is connected to a p-electrode 144 of the LED L35, through a removed portion 150A which is created by removing part of the silicon nitride film 150. Thus, an n-electrode 146 of the LED L34 and a p-electrode 144 of the LED L35 are electrically connected to each other by the conductor bridging wire 152. In this manner, the LEDs L33 to L1 are connected, so that the LEDs L1 to L35 are connected in series as shown in FIG. 22B.

The n-electrode 146 of the LED L35 on the lower potential end is electrically connected to the Au plating layer 132 by means of a conductor bridging wire 156 formed on the silicon nitride film 154. An end portion of the conductor bridging wire 156 which is connected to the n-electrode 146 of the LED L35 extends from the n-electrode 146 in a direction parallel to an upper main surface of the n-AlGaN layer 140 (a light extraction surface).

A p-electrode 144 of the LED L1 on the higher potential end of the LED array chip 130 is electrically connected to the Au plating layer 132 by means of a bridging wire 160 formed on a silicon nitride film 158.

The Au plating metal layer 132 is electrically divided into two portions, by a polyimide wall 162, between its connection with the n-electrode 146 of the LED L35 and its connection with the p-electrode 144 of the LED L1 . Here, one of the two portions which is connected to the p-electrode 144 of the LED L1 is referred to as an Au plating metal layer 132A, and the other which is connected to the n-electrode 146 of the LED L35 is referred to as an Au metal plating layer 132K. In the LED array chip 130 formed by the LEDs L1 to L35, the Au plating metal layer 132A is constituted as an anode power supply terminal, and the Au plating metal layer 132K is constituted as a cathode power supply terminal.

When power is supplied to this LED array chip 130 through the anode and cathode power supply terminals 132A and 132K, the light emitting layer 138 of each of the LEDs L1 to L35 emits near-ultraviolet light having a wavelength of 390 nm.

The near-ultraviolet light is reflected by the highly-reflective p-electrode 144 towards the n-AlGaN layer 140, and absorbed by the phosphor layer 148. The phosphor layer 148 converts the near-ultraviolet light into white light.

Having the Rh/Pt/Au highly-reflective p-electrode 144 in each LED, the LED array chip 130 relating to the fourth embodiment has a significantly higher light extraction efficiency. Furthermore, power is applied to each of the LEDs L1 to L35 through the p-electrode 144 (highly-reflective electrode) and the n-electrode 146 (transparent electrode) which are respectively formed on substantially the entire lower and upper surfaces of the multilayer epitaxial structure 142. This enables an electric current to be evenly injected to the entire light emitting layer 138. As a result, the entire light emitting layer 138 evenly emits light, and a lower operation voltage can be achieved. In addition, heat generated by the light emitting layer 138 can be dissipated to a mounting substrate (mentioned later) through the power supply terminals 132A and 132K, which are formed by the highly heat-conductive Au plating layer 132. This can reduce an increase in temperature of the light emitting layer 138 even when large amounts of electric current are injected. As a result, the LED array chip 130 can attain a high output and a long lifetime. Furthermore, the power supply terminals 132A and 132K are provided on the lower surface of the multilayer epitaxial structure 142. No components that block light emitted from the light emitting layer 138 exist on or above the upper surface of the multilayer epitaxial structure 142. As a consequence, light emitted from the LED array chip 130 does not contain shadow. In addition, since the LED array chip 130 does not include an insulating substrate such as a sapphire substrate, an ability to withstand static electricity is improved.

The following part describes a manufacturing method of the LED array chip 130 described above, with reference to FIGS. 23 to 28.

In FIGS. 23 to 28, a material to form each constituent of the LED array chip 130 is identified by a four-digit number whose first digit is two. The last three digits of the four-digit number represents a reference numeral identifying the corresponding constituent of the LED array chip 130. Some of the steps explained in the following are the same as in the first to third embodiments, and such steps are only briefly mentioned.

Figure 23:
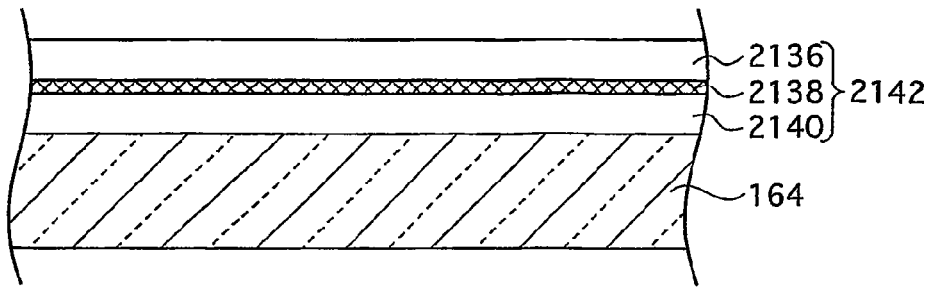
FIG. 23 illustrates part of a manufacturing process of the LED array chip relating to the fourth embodiment.
Figure 23:
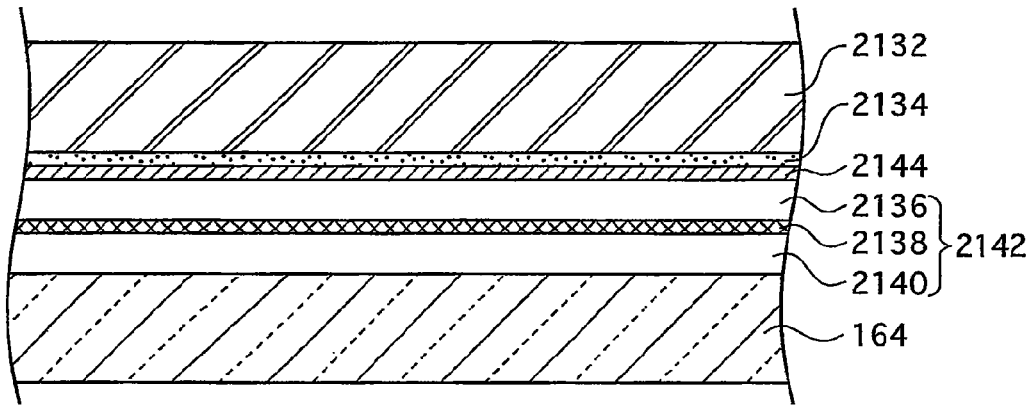
Figure 23:
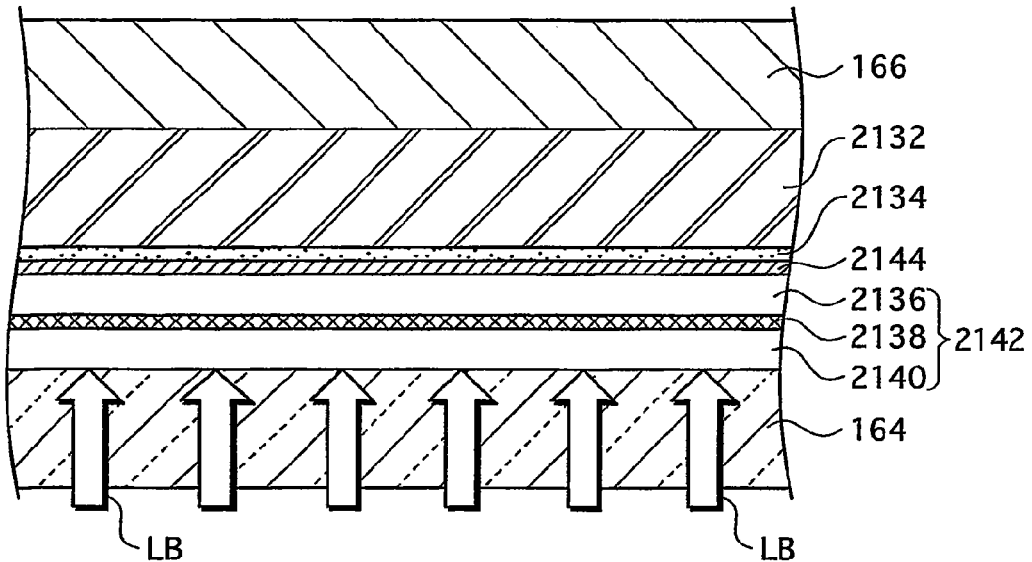
Figure 24:
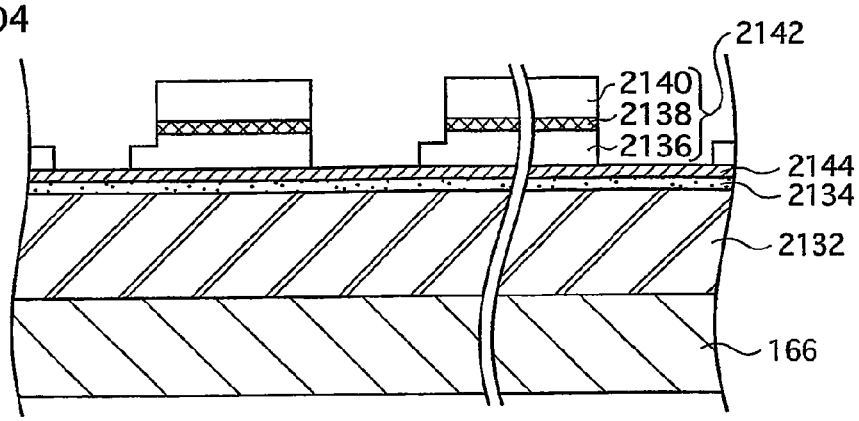
FIG. 24 illustrates part of the manufacturing process of the LED array chip relating to the fourth embodiment.
Figure 24:
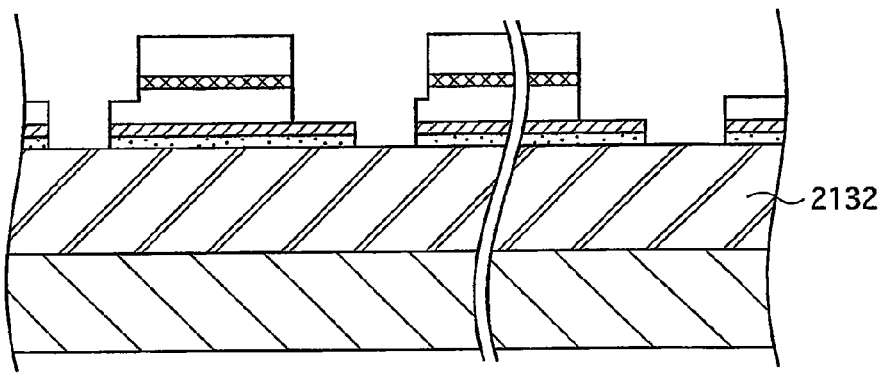
Figure 24:
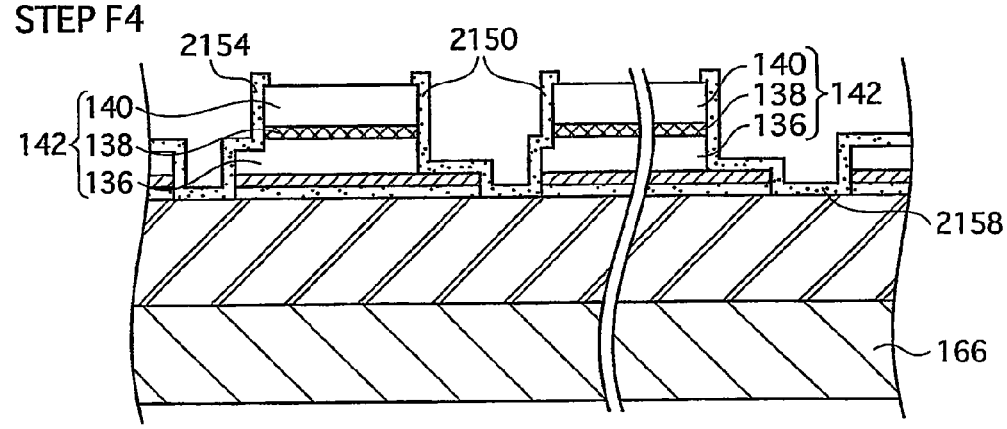
Figure 25:
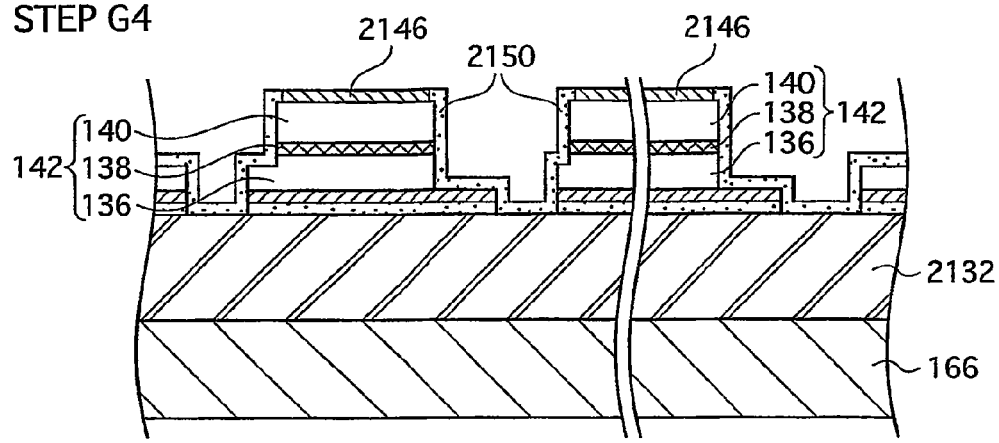
FIG. 25 illustrates part of the manufacturing process of the LED array chip relating to the fourth embodiment.
Figure 25:
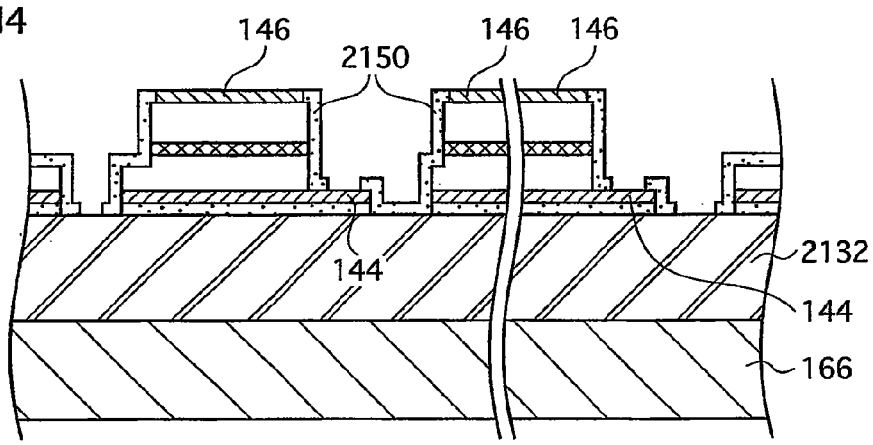
Figure 25:
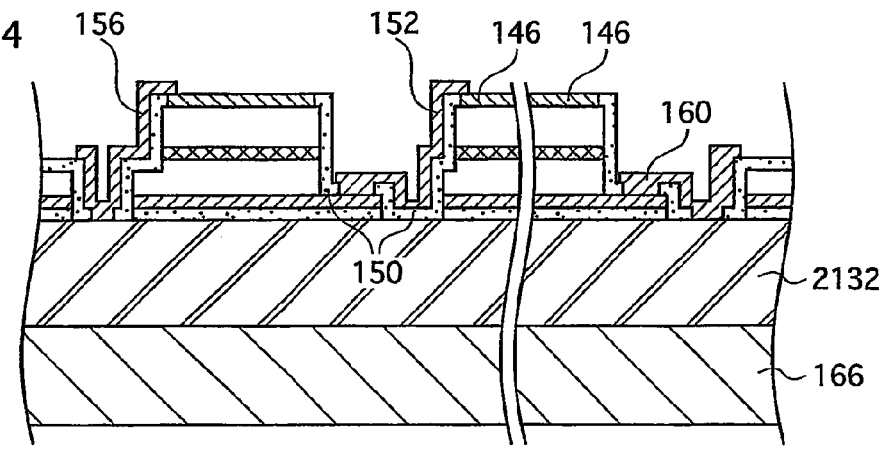
Figure 26:
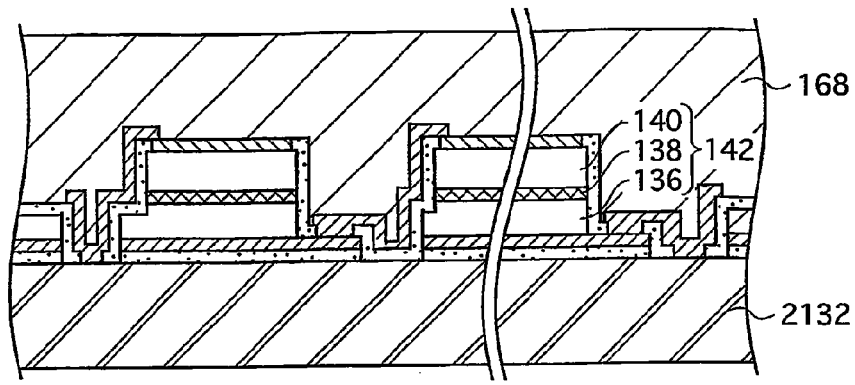
FIG. 26 illustrates part of the manufacturing process of the LED array chip relating to the fourth embodiment.
Figure 26:
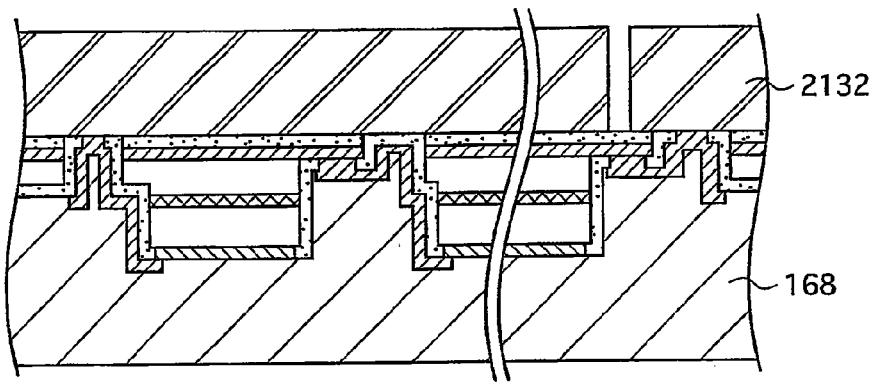
Figure 26:
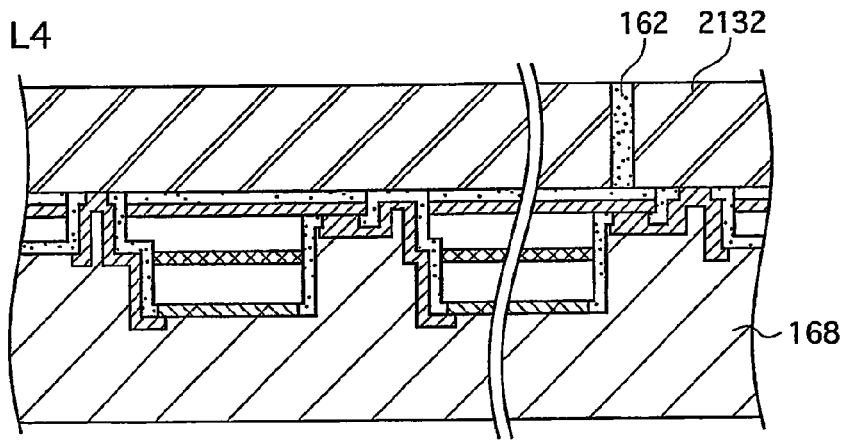
Figure 27:
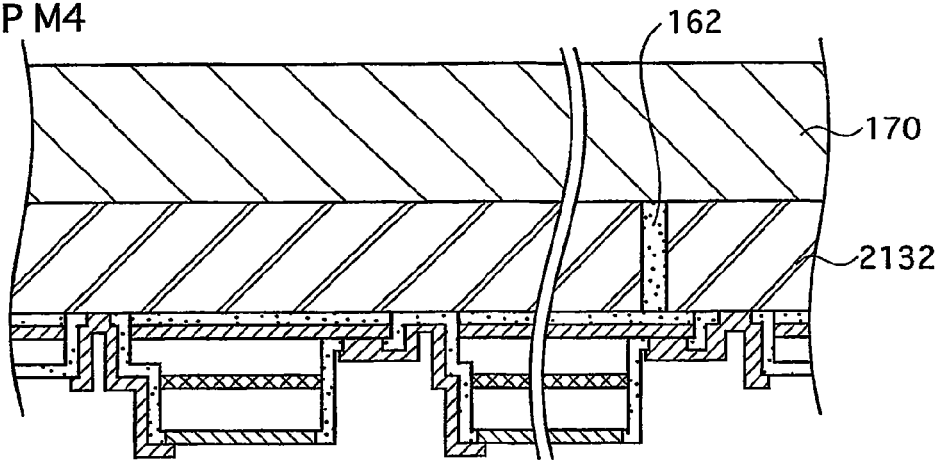
FIG. 27 illustrates part of the manufacturing process of the LED array chip relating to the fourth embodiment.
Figure 27:
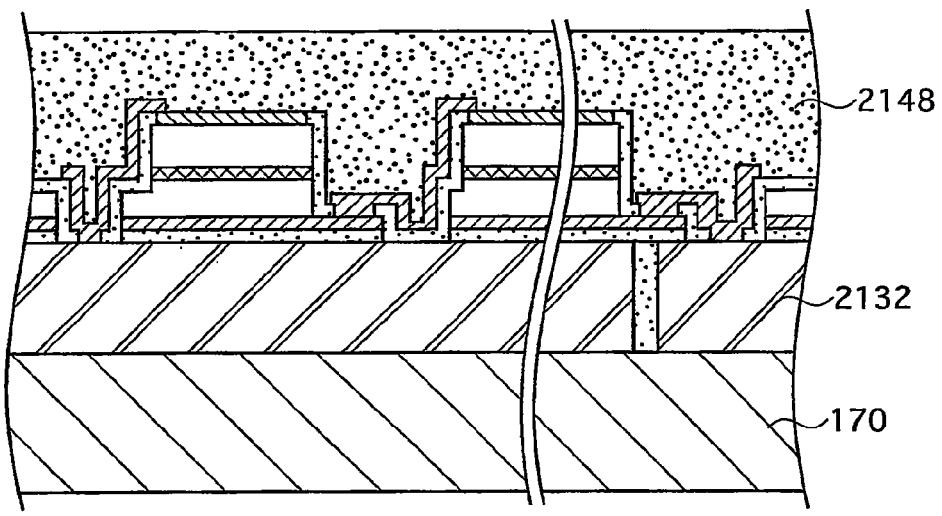
Figure 27:
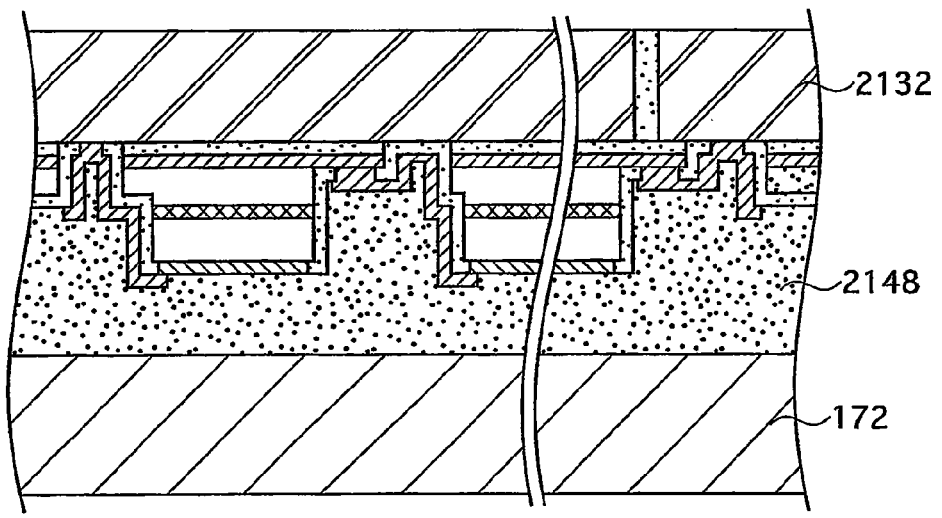
Figure 28:
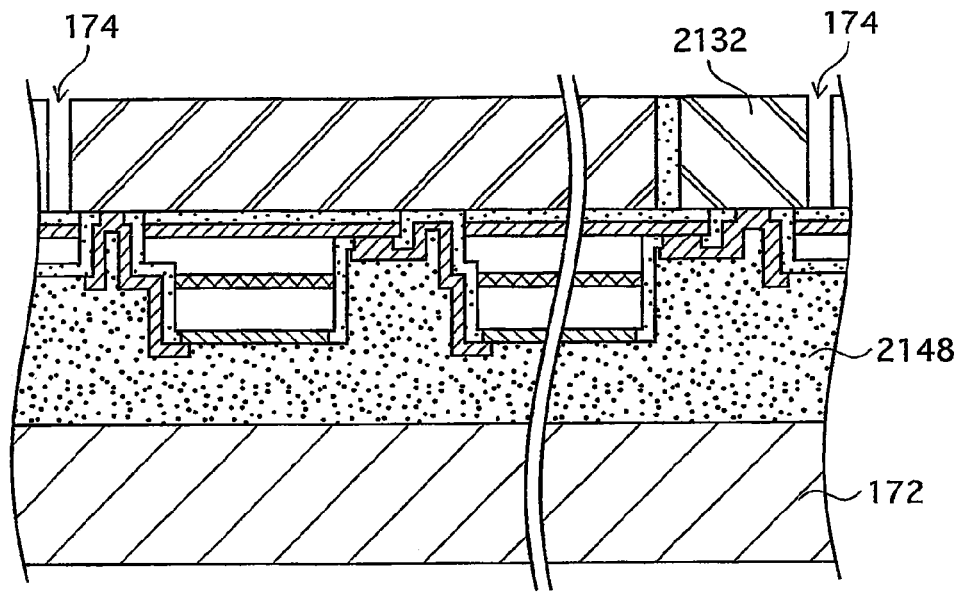
FIG. 28 illustrates part of the manufacturing process of the LED array chip relating to the fourth embodiment.
Figure 28:
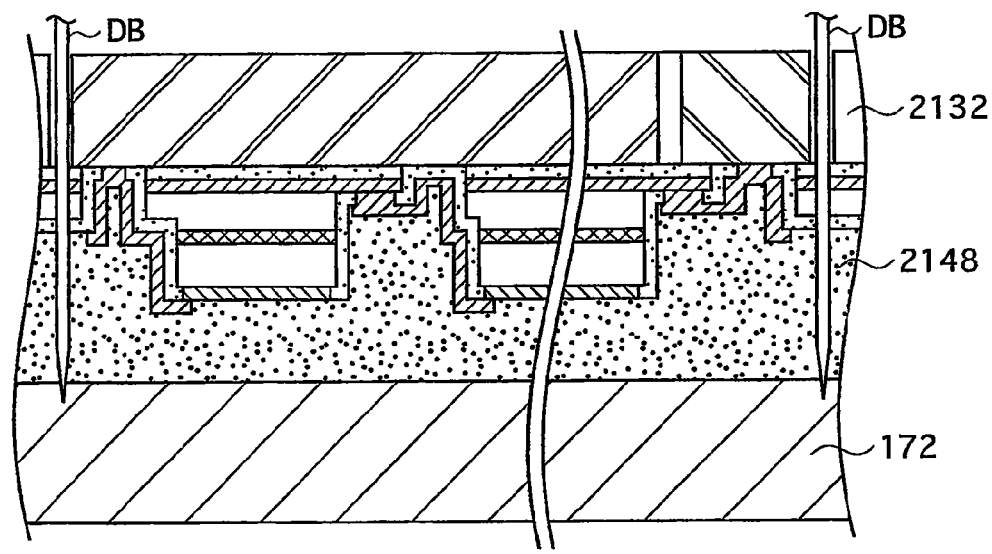

To start with, an n-AlGaN layer 2140, an InGaN/AlGaN MQW light emitting layer 2138 and a p-AlGaN layer 2136 are formed in this order on a sapphire substrate 164 using a MOCVD method as shown in FIG. 23 (step A4). The layers 2140, 2138 and 2136 form a multilayer epitaxial structure 2142. Here, the sapphire substrate 164 has a diameter of two inches and a thickness of 300 μm.

After this, an Rh/Pt/Au layer 2144 is formed by an electron beam evaporation method or the like, a silicon nitride film 2134 is formed by RF sputtering or the like, a Ti/Au thin film undercoating (not shown in FIG. 23) is formed by an electron beam evaporation method or the like, and then an Au plating layer 2132 is formed (step B4).

The sapphire substrate 164 is separated at this stage in the fourth embodiment (step C4). A method to separate the sapphire substrate 164 is the same as in the first to third embodiments, and therefore not repeatedly described here. It should be noted that a first macromolecule film 166 is adhered to the Au plating layer 2132, prior to the separation of the sapphire substrate 164.

After the sapphire substrate 164 is separated, the multilayer epitaxial structure 2142 is partly masked, and an unmasked area of the multilayer epitaxial structure 2142 is removed by dry etching to such a depth that the p-AlGaN layer 2136 is exposed. After this, the resulting surface is again partly masked, and an unmasked area is removed to such a depth that the Rh/Pt/Au layer 2144 is exposed (step D4). Following this, the resulting surface after the step D4 is again partly masked in order to obtain individual light emitting elements. An unmasked area of the Rh/Pt/Au layer 2144 and the silicon nitride film 2134 is then removed to such a depth that the Au plating layer 2132 is exposed (step E4).

After this, a silicon nitride film 2150 (2154, 2158) is deposited on the entire resulting surface after the step E4, by RF sputtering or the like for insulation and surface protection. An area of the silicon nitride film 2150 in which the n-electrode 146 (shown in FIG. 22A) is to be formed is removed by etching. As a result, a part of the n-AlGaN layer 140 is exposed (step F4). A Ti/Au transparent thin film 2146 is formed by an electron beam evaporation method or the like on the n-AlGaN layer 140 in the exposed part (step G4).

A portion of the silicon nitride film 2150 which is formed on the p-electrode 144 is partly removed to connect a p-electrode 144 of an LED to an n-electrode 146 of another LED (step H4). Subsequently, the bridging wire 152 is formed by a Ti/Pt/Au thin film (step I4). At the same time, the bridging wires 156 and 160 are also formed by a Ti/Pt/Au thin film.

After this, the first macromolecule film 166 is removed, and a second macromolecule film 168 is then adhered so as to cover the multilayer epitaxial structure 142, in order to divide the Au plating layer 2132 (step J4). A predetermined portion of the Au plating layer 2132 is removed by etching, to create a space (step K4). The space is filled with a polyimide resin, to form the polyimide wall 162 (step L4).

Subsequently, a phosphor layer 2148 is formed. To do this, the second macromolecule film 168 is removed, and a third macromolecule film 170 is adhered to the Au plating layer 2132 (step M4). The above-described silicone resin in which particles of blue, green, yellow and red phosphors and fine particles of metal oxide such as $SiO_2$ are dispersed is applied. After the silicone resin is heated to be cured, the phosphor layer 2148 is ground so as to have a predetermined thickness, for example, 200 μm (step N4). The grinding has a purpose of reducing unevenness of color and achieving a predetermined color temperature.

After this, individual LED array chips 130 are obtained. To do this, the third macromolecule film 170 is removed, and a fourth macromolecule film 172, which is a dicing sheet, is adhered to the phosphor layer 2148 (step O4).

Subsequently, grooves 174 are created vertically and horizontally when the Au plating layer 2132 seen from above, by removing part of the Au plating layer 2132 by etching. Thus, the Au plating layer 2132 is divided for each LED array chip 130 (step P4). Dicing blades DB (shown in FIG. 28) are then inserted into the grooves 174, to divide the phosphor layer 2148 for each LED array chip 130. Thus, the LED array chip 130 is completed (step Q4).

Fifth Embodiment

According to the first to fourth embodiments, an Au plating layer is divided into two or more portions, and one of them is constituted as an anode power supply terminal and the other (s)(a) cathode power supply terminal(s). According to a fifth embodiment, however, the entire Au plating layer is constituted as an anode power supply terminal, and a cathode power supply terminal is separately provided.

Figure 29A:
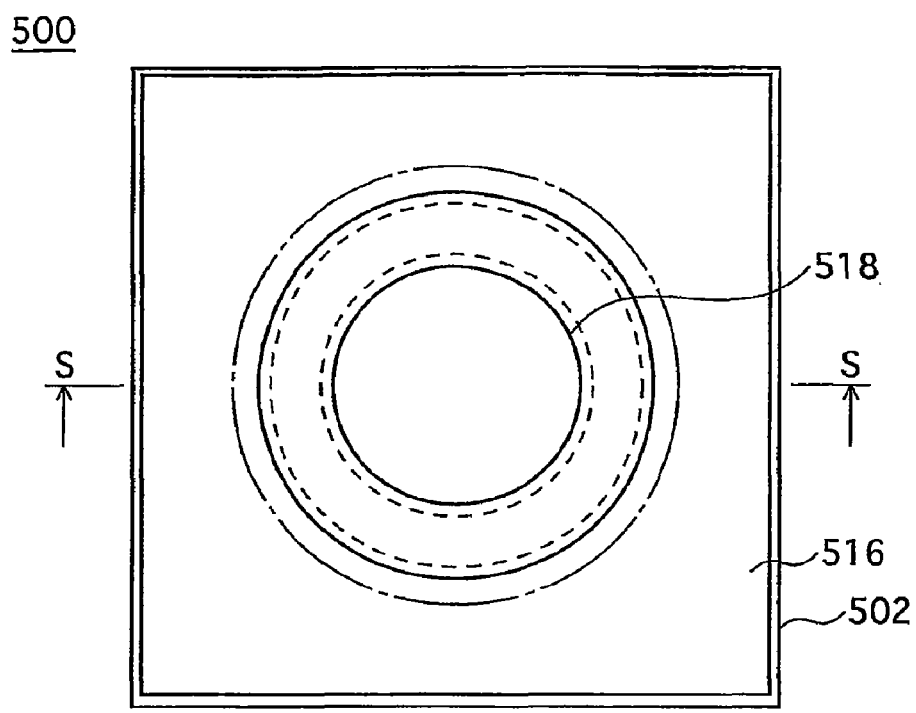
FIG. 29A is a plan view illustrating the LED chip by removing a phosphor layer.
Figure 29B:
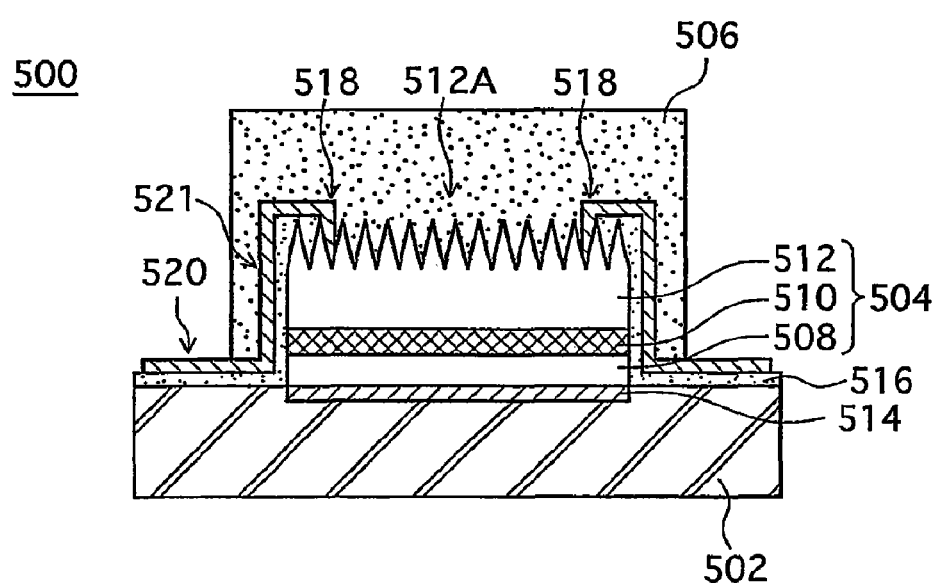
FIG. 29B illustrates a cross-section along a line SS shown in FIG. 29A.

FIG. 29 illustrates a white LED chip 500 relating to the fifth embodiment (hereinafter simply referred to as an LED chip 500). In detail, FIG. 29A is a plan view illustrating the LED chip 500, and FIG. 29B illustrates a cross-section along a line SS shown in FIG. 29A. It should be noted that a phosphor layer 506 mentioned later is not shown in FIG. 29A. (The phosphor layer 506 is indicated by an alternate short and long dash line.)

As shown in FIG. 29, the LED chip 500 is formed in the following manner. A multilayer epitaxial structure 504 is formed like a disk (a circular cylinder) on one of square main surfaces of an Au plating layer 502 that is formed like a rectangular solid. Furthermore, the phosphor layer 506 is formed on the Au plating layer 502 so as to cover the multilayer epitaxial structure 504. The Au plating layer 502 is 350-μm-square and has a thickness of 50 μm. The phosphor layer 506 has a diameter of 330 μm and a thickness of 200 μm.

The multilayer epitaxial structure 504 is formed in such a manner that a p-GaN layer 508 (having a thickness of 200 nm) which is a conductive layer, an InGaN/GaN MQW light emitting layer 510 (having a thickness of 50 nm), and an n-GaN layer 512 (having a thickness of 2 μm) which is a conductive layer are provided in this order. Here, the p-GaN layer 508 is positioned the closest to the Au plating layer 502. The layers 508, 510 and 512 form a diode structure.

An Rh/Pt/Au highly-reflective p-electrode 514 is formed on substantially the entire lower main surface of the p-GaN layer 508. The p-GaN layer 508 is connected to the Au plating layer 502 by means of the p-electrode 514. This means that the Au plating layer 502 is constituted as an anode power supply terminal.

An insulating film 516 made of silicon nitride is formed on the entire side surface of the multilayer epitaxial structure 504, on part of an upper surface (a light extraction surface) of the multilayer epitaxial structure 504, and in an area of the upper surface of the Au plating layer 502 in which the multilayer epitaxial structure 504 is not formed.

A Ti/Pt/Au n-electrode 518 is formed like a ring along a periphery of a surface of the n-GaN layer 512 which faces away from the light emitting layer 510.

A Ti/Pt/Au conductive film 520 is formed on the upper main surface of the Au plating layer 502, with the insulating film 516 therebetween. The conductive film 520 is constituted as a cathode power supply terminal. The cathode power supply terminal 520 is electrically connected to the n-electrode 518, by means of a wiring 521 which is formed by a Ti/Pt/Au conductive film. Here, an end portion of the wiring 521 which is connected to the n-electrode 518 extends from the n-electrode 518 in a direction parallel to an upper main surface (a light extraction surface) of the n-GaN layer 512. Here, the upper main surface of the n-GaN layer 512 (the light extraction surface) is made uneven in such a manner that cone-like protrusions 512A are provided. The protrusions 512A improve a light extraction efficiency.

The phosphor layer 506 is made of a light-transmitting resin such as silicone, in which particles of a yellow phosphor such as $(Sr, Ba)_2SiO_4:Eu^{2+}$, $(Y, Gd)_3Al_5O_{12}:Ce^{3+}$ or the like, and fine particles of metal oxide such as $SiO_2$ are dispersed. Instead of silicone, an epoxy resin or a polyimide resin may be used for the light-transmitting resin.

When power is supplied to this LED chip 500 through the anode power supply terminal 502 and the cathode power supply terminal 520, the light emitting layer 510 emits blue light having a wavelength of 460 nm. Part of the blue light is emitted towards the Au plating layer 502, and reflected by the highly-reflective p-electrode 514 towards the phosphor layer 506. Therefore, the blue light is, to a large extent, emitted from the light emitting layer 510 towards the phosphor layer 506. Part of the blue light is absorbed by the phosphor layer 506, to be converted into yellow light. The blue light and the yellow light mix together, to produce white light. The white light is emitted from the phosphor layer 506.

In the LED chip 500 (one type of a semiconductor light emitting device) relating to the fifth embodiment, the highly-reflective p-electrode 514 is formed on substantially the entire lower surface of the multilayer epitaxial structure 504, and no components such as a sapphire substrate are provided on or above the light extraction surface of the multilayer epitaxial structure 504. Furthermore, the p-electrode 514 is formed on substantially the entire surface of the p-GaN layer 508. In addition, the LED chip 500 includes the highly heat-conductive Au plating layer 502. Because of these distinctive features, the LED chip 500 produces the same effects as the LED chip 2 relating to the first embodiment.

Similarly to the LED chip 2, the LED chip 500 can emit light that hardly contains shadow of a bonding wire, towards an object. This effect is explained later.

In the LED chip 500, the multilayer epitaxial structure 504 including the light emitting layer 510 is formed like a disk (a circular cylinder), and the phosphor layer 506 is applied on the multilayer epitaxial structure 504 at a substantially even thickness. This means that a spot shape of light emitted from the LED chip 500 is substantially circular. Having this feature, the LED chip 500 is suitable for lighting.

The following part explains a manufacturing method of this LED chip 500 with reference to FIGS. 30 to 33. In FIGS. 30 to 33, a material to form each constituent of the LED chip 500 is identified by a four-digit number whose first digit is three. The last three digits of the four-digit number represents a reference numeral identifying the corresponding constituent of the LED chip 500.

Figure 30:
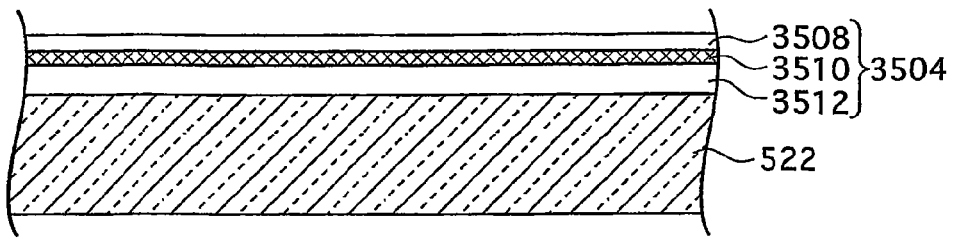
FIG. 30 illustrates part of a manufacturing process of the LED chip relating to the fifth embodiment.
Figure 30:
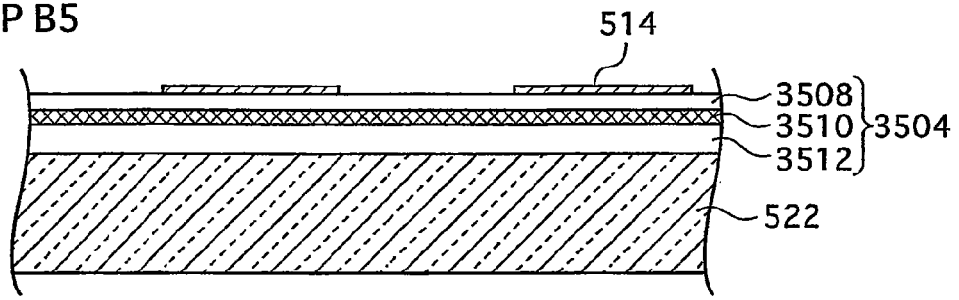
Figure 30:
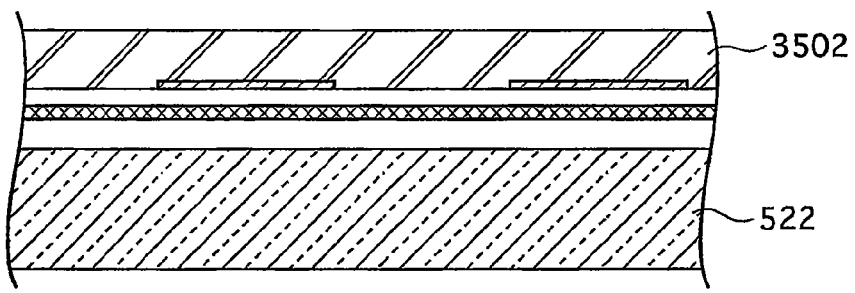
Figure 30:
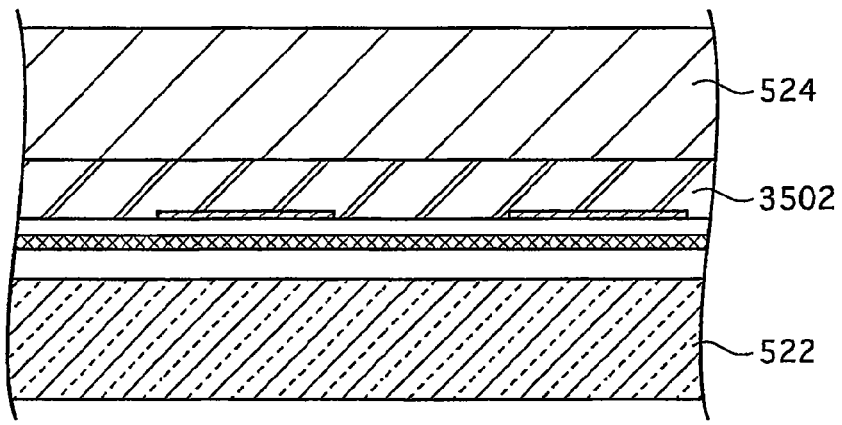
Figure 31:
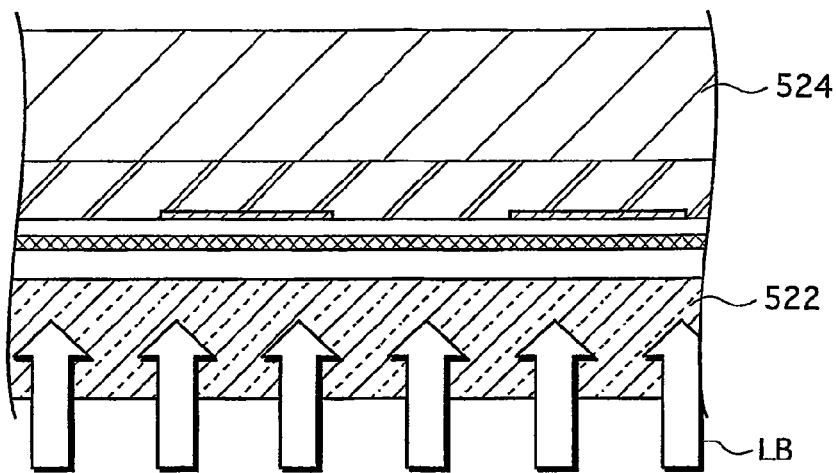
FIG. 31 illustrates part of the manufacturing process of the LED chip relating to the fifth embodiment.
Figure 31:
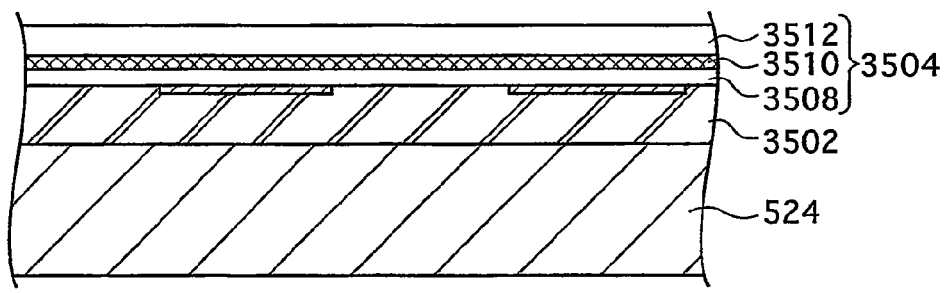
Figure 31:
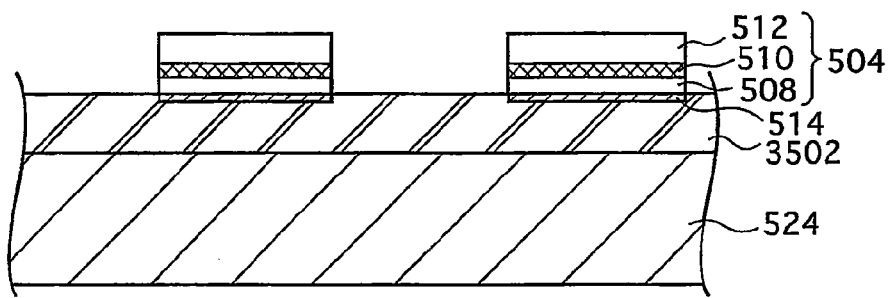
Figure 32:
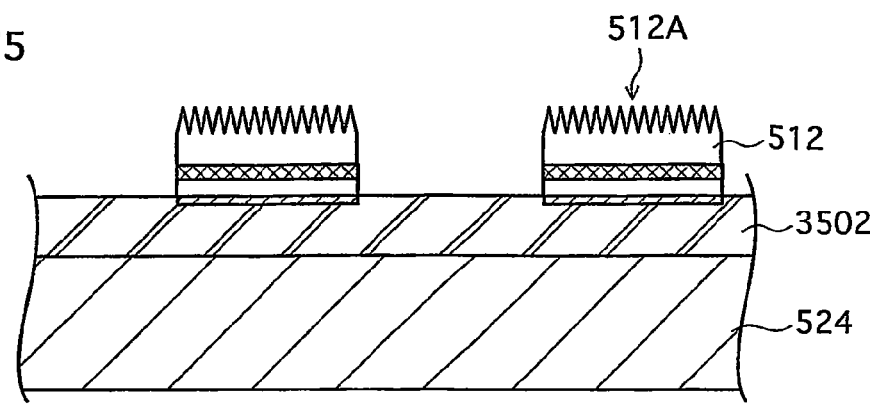
FIG. 32 illustrates part of the manufacturing process of the LED chip relating to the fifth embodiment.
Figure 32:
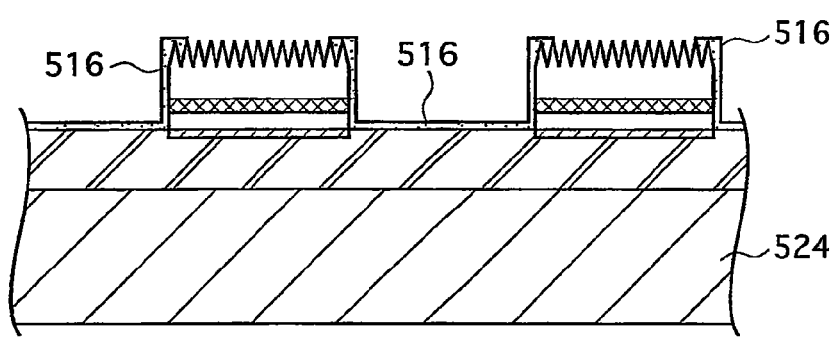
Figure 32:
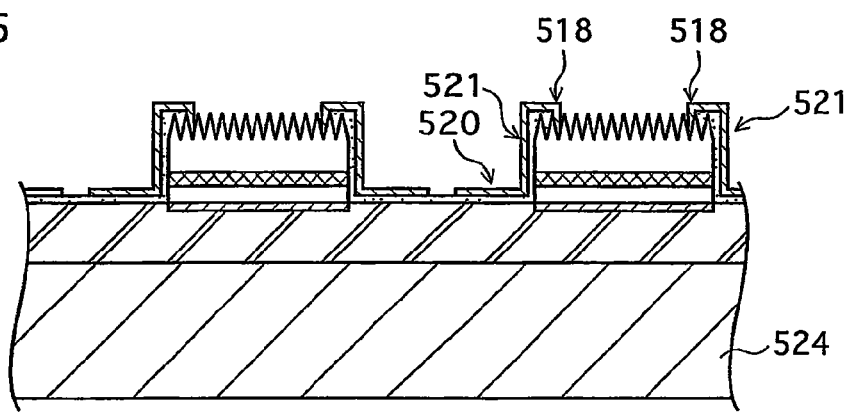
Figure 33:
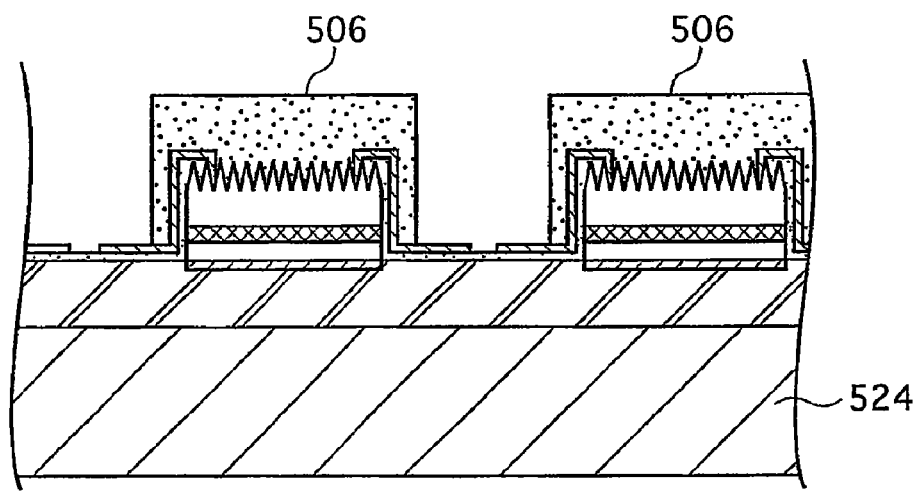
FIG. 33 illustrates part of the manufacturing process of the LED chip relating to the fifth embodiment.
Figure 33:
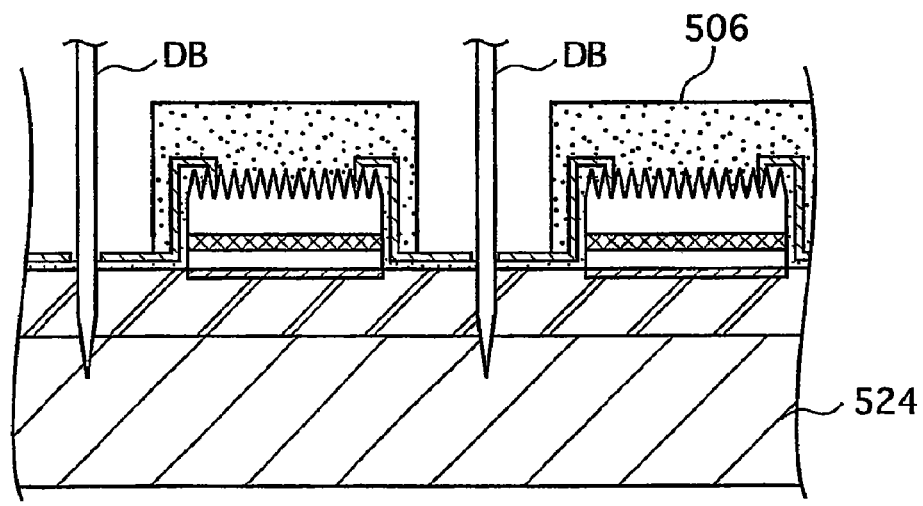

To start with, an n-GaN layer 3512, an InGaN/GaN MQW light emitting layer 3510 and a p-GaN layer 3508 are formed in this order on a sapphire substrate 522 which is a single-crystal substrate, by epitaxial growth, using a MOCVD method as shown in FIG. 30 (step A5). Here, the sapphire substrate 522 has a diameter of two inches and a thickness of 300 μm. The layers 3508, 3510 and 3512 form a multilayer epitaxial structure 3504.

An Rh/Pt/Au film is formed on a predetermined area of the p-GaN layer 3508, to form the p-electrode 514 (step B5).

After this, a Ti/Au thin film undercoating (not shown in FIG. 30) is formed on the entire resulting surface after the step B5 by an electron beam evaporation method or the like. On the undercoating, an Au plating layer 3502 is formed at a thickness of 50 μm (step C5).

After this, the sapphire substrate 522 is separated (step D5). To do this, a macromolecule film 524 is adhered to the Au plating layer 3502. Here, the macromolecule film 524 is the same as the first macromolecule film 28 used in the first embodiment, and has the same purpose. In the fifth embodiment, the macromolecule film 524 is also used as a dicing sheet (mentioned later). After the macromolecule film 524 is adhered, the sapphire substrate 522 is separated (steps E5 and F5). A method to separate the sapphire substrate 522 is the same as in the first embodiment, and therefore not repeatedly described here.

The multilayer epitaxial structure 3504 is partly masked, and an unmasked area of the multilayer epitaxial structure 3504 is removed by dry etching to such a depth that the Au plating layer 3502 is exposed. Thus, multilayer epitaxial structures 504 (see FIG. 29B) each of which constitutes the LED chip 500 are created (step G5).

Subsequently, a mask is formed on the resulting surface after the step G5, so as not to cover the upper surface of the multilayer epitaxial structure 504 (the n-GaN layer 512). After this, anisotropic etching is conducted, by immersing the resulting surface into KOH solution or the like (step H5). Thus, the unmasked upper surface is made uneven. In detail, the corn-like protrusions 512A are formed on the upper surface. A shape of each protrusion 512A can be changed by adjusting a concentration or a temperature of the KOH solution, a time period for which the surface is immersed, a level of an electric current/a voltage, or the like. After the protrusions 512A are formed, the mask is removed prior to the next step.

After this, a silicon nitride film is formed by RF sputtering or the like for insulation, to form the insulating film 516 (step I5).

Subsequently, a Ti/Pt/Al film is formed in a predetermined area, to simultaneously form the n-electrode 518, the wiring 521, and the cathode power supply terminal 520 (step J5).

After this, the phosphor layer 506 is formed by screen printing (step K5). The Au plating layer 3502 is divided by dicing blades DB for each multilayer epitaxial structure 504. Thus, the LED chip 500 is completed (step L5).

Sixth Embodiment

Figure 34:
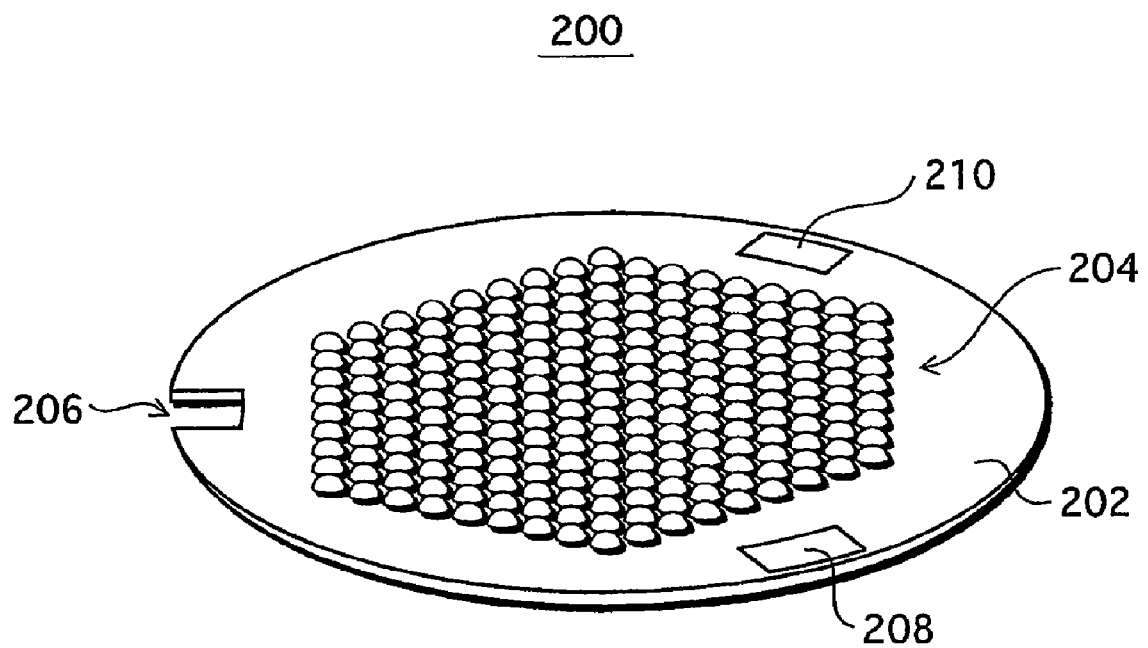
FIG. 34 is a perspective view illustrating a white LED module relating to a sixth embodiment.

FIG. 34 is an external perspective view illustrating a white LED module 200, which is a lighting module including the LED chip 2 relating to the first embodiment (shown in FIG. 1) (hereinafter simply referred to as an LED module 200). The LED module 200 is attached to a lighting unit 232 (mentioned later and shown in FIG. 37).

The LED module 200 includes a ceramics substrate 202 that is in a shape of a circle having a diameter of 5 cm and is made of AlN and 217 resin lenses 204. A guiding depression 206 used to attach the LED module 200 to the lighting unit 232 and terminals 208 and 210 to receive a power supply from the lighting unit 232 are provided in the ceramics substrate 202.

Figure 35A:
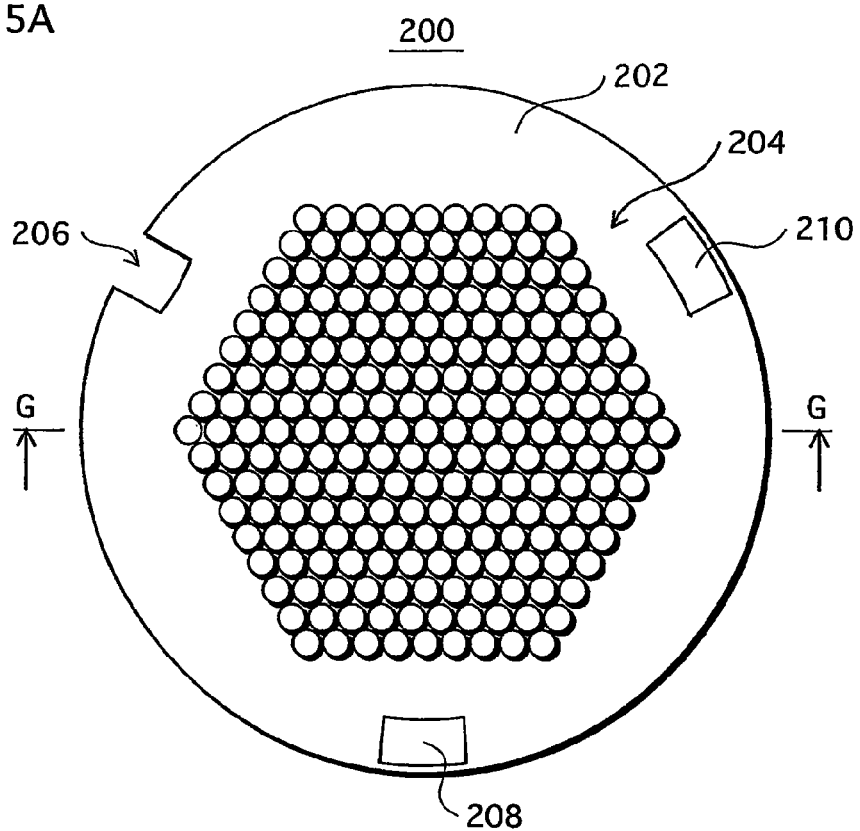
FIG. 35A is a plan view illustrating the white LED module relating to the sixth embodiment.
Figure 35B:
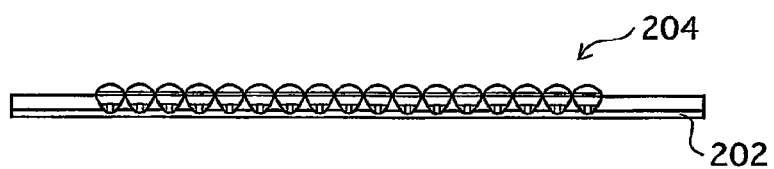
FIG. 35B illustrates a cross-section along a line GG shown in FIG. 35A.
Figure 35C:
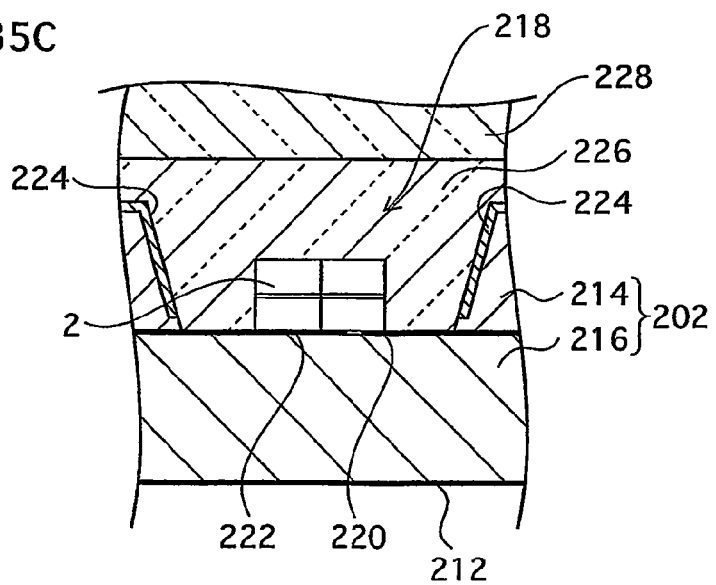
FIG. 35C is an enlargement view illustrating a chip mounting portion shown in FIG. 35B.

FIG. 35A is a plan view illustrating the LED module 200, FIG. 35B illustrates a cross-section of the LED module 200 along a line GG shown in FIG. 35A, and FIG. 35C is an enlargement view illustrating a chip mounted area shown in FIG. 35B.

As shown in FIG. 35C, an Au plating 212 is applied to a back main surface of the ceramics substrate 202 for improving heat dissipation.

The LED chip 2 is mounted at a location, on an upper surface of the ceramics substrate 202, corresponding to a center of each of the lenses 204 having a shape of a circle as shown in FIG. 35A. In total, 217 LED chips 2 are mounted on the ceramics substrate 202.

The ceramics substrate 202 is constituted by two ceramics substrates 214 and 216 each of which is 0.5 mm in thickness and mainly made of AlN. Other than AlN, the ceramics substrates 214 and 216 can be made of $Al_2O_3$, BN, MgO, ZnO, SiC or diamond.

The LED chips 2 are mounted on the lower ceramics substrate 216. Taper through holes 218 are provided in the upper ceramics substrate 214, so as to create spaces for mounting the LED chips 2.

A cathode pad 220 and an anode pad 222 (shown in FIG. 36B) are provided at the location, on an upper surface of the ceramics substrate 216, where each LED chip 2 is to be mounted. Each of the cathode pad 220 and the anode pad 222 is made up of Au plating applied on copper (Cu). Here, the cathode power supply terminal 4K and the anode power supply terminal 4A of the LED chip 2 (shown in FIG. 1B), which are made of Au plating, are respectively connected to the cathode pad 220 and the anode pad 222 on which PbSn solder has been formed.

A step of forming the PbSn solder on the cathode pad 220 and the anode pad 222 can be omitted, if AuSn solder is plated beforehand on the cathode power supply terminal 4K and the anode power supply terminal 4A. After all of the LED chips 2 are mounted on pairs of the cathode pad 220 and the anode pad 222, the ceramics substrate 202 is heated through a reflow furnace to a temperature equal to a melting point of the solder. Thus, the 217 LED chips 2 can be simultaneously connected to the ceramics substrate 202. This reflow soldering process can be conducted if a shape of each of the cathode pad 220 and the anode pad 222, an amount of the applied solder, a shape of the anode power supply terminal 4A and the cathode power supply terminal 4K and the like are optimized. Here, a silver paste or a bump may be used instead of the solder.

Before being mounted, the LED chips 2 have been tested for their optical performance, such as unevenness of color and a color temperature, and have passed the test. According to the sixth embodiment, the LED chip 2 includes the phosphor layer 8, and can emit white light by itself. As described above, this makes it possible to test the LED chip 2 for its optical performance before mounting. Consequently, it can be prevented that the LED module 200 including the LED chips 2 is rejected due to poor optical performance of the LED chips 2. In other words, the ratio of accepted finished products (LED modules 200) is improved.

An aluminum reflection film 224 is formed on a wall of each through hole 218 provided in the upper ceramics substrate 214 and on an upper surface of the ceramics substrate 214 as shown in FIG. 35C.

After mounted on the ceramics substrate 216, the LED chips 2 are covered by a first resin (e.g. a silicone resin 226). Subsequently, the lenses 204 are formed by injection molding with use of a second resin (e.g. an epoxy resin 228).

The 217 LED chips 2 are connected in series-parallel (seven groups of 31 LEDs connected in series are connected in parallel) by a wiring pattern 230 (shown in FIG. 36A) formed on the upper main surface of the ceramics substrate 216.

Figure 36A:
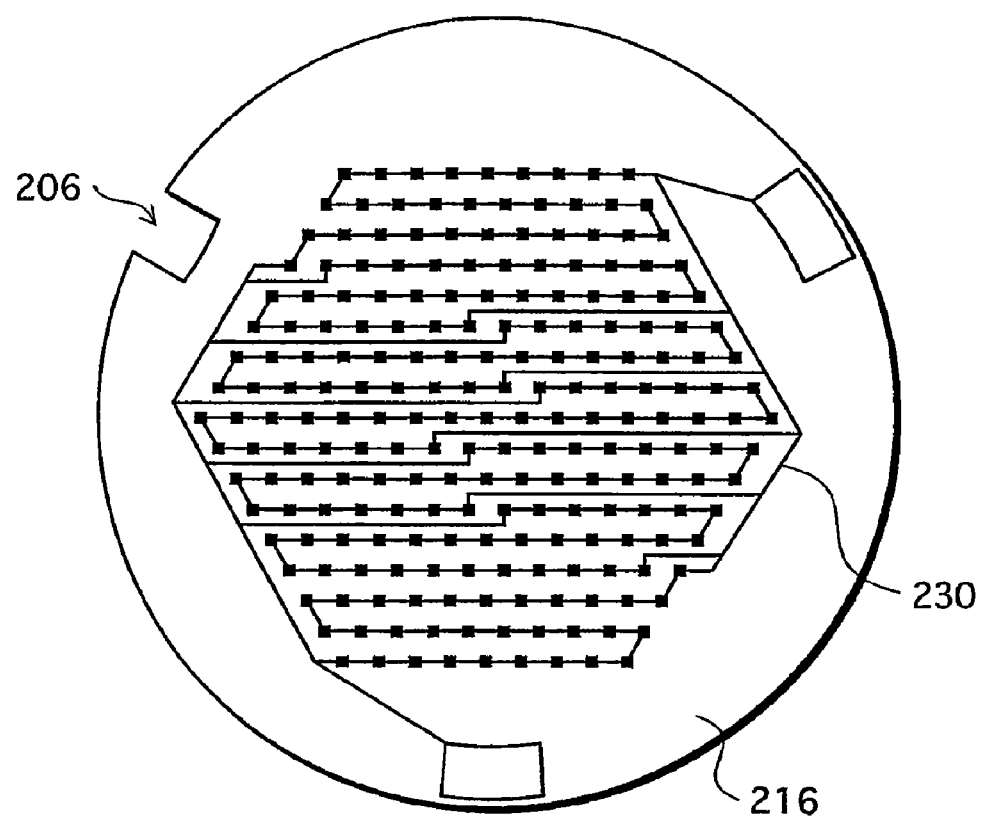
FIG. 36A illustrates a wiring pattern formed in the white LED module.
Figure 36B:
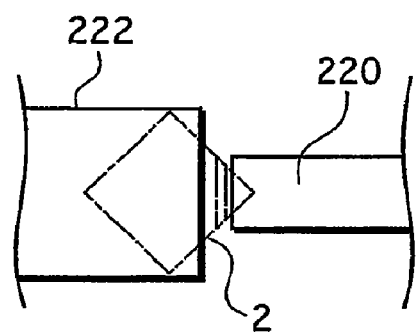
FIG. 36B illustrates a pad pattern formed on a ceramics substrate which constitutes the white LED module.

FIG. 36A is a plan view illustrating the LED module 200 by removing the lenses 204 and the upper ceramics substrate 214. As described above, the anode pad 222 and the cathode pad 220 (shown in FIG. 36B) are provided at the location, on the upper main surface of the ceramics substrate 216, where each LED chip 2 is to be mounted.

The anode pads 222 and the cathode pads 220 are connected by the wiring pattern 230 in such a manner that seven groups of 31 LED chips 2 connected in series are connected in parallel. The wiring pattern 230 is connected at one end to the positive terminal 208 (shown in FIG. 35A) by a through hole (not shown in FIG. 36A), and connected at the other end to the negative terminal 210 (shown in FIG. 35A) by another through hole (not shown in FIG. 36A).

This LED module 200 is attached to the lighting unit 232. The LED module 200 and the lighting unit 232 constitute a lighting apparatus 234.

Figure 37A:
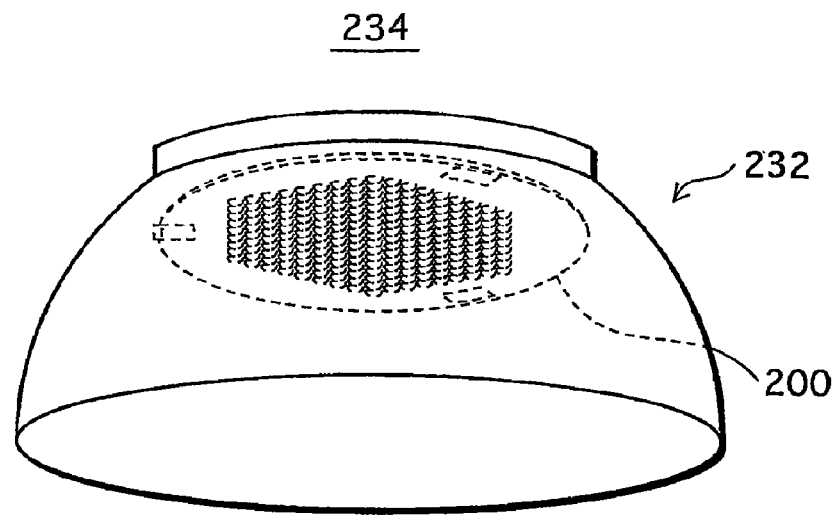
FIG. 37A is a perspective view illustrating a lighting apparatus relating to the sixth embodiment.
Figure 37B:
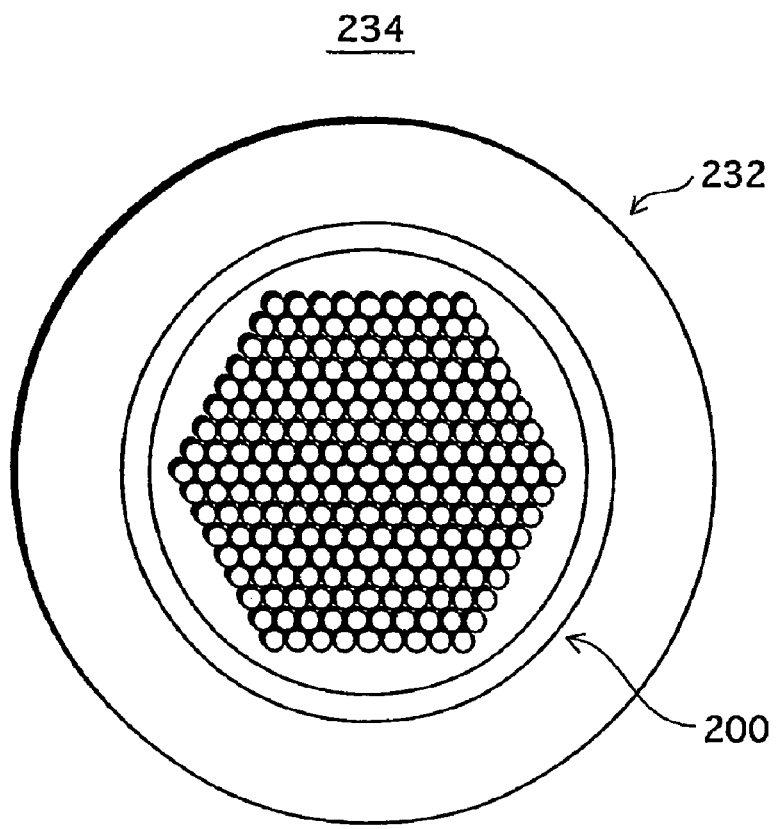
FIG. 37B is a bottom plan view illustrating the lighting apparatus.

FIG. 37A is a schematic perspective view illustrating the lighting apparatus 234, and FIG. 37B is a bottom plan view illustrating the lighting apparatus 234.

The lighting unit 232 is, for example, fixed on a ceiling of a room. The lighting unit 232 includes a power supply circuit (not shown in FIGS. 37A and 37B) that converts alternating-current power (e.g. 100 V, 50/60 Hz) supplied from a commercial power source into direct-current power required for driving the LED module 200.

Figure 38:
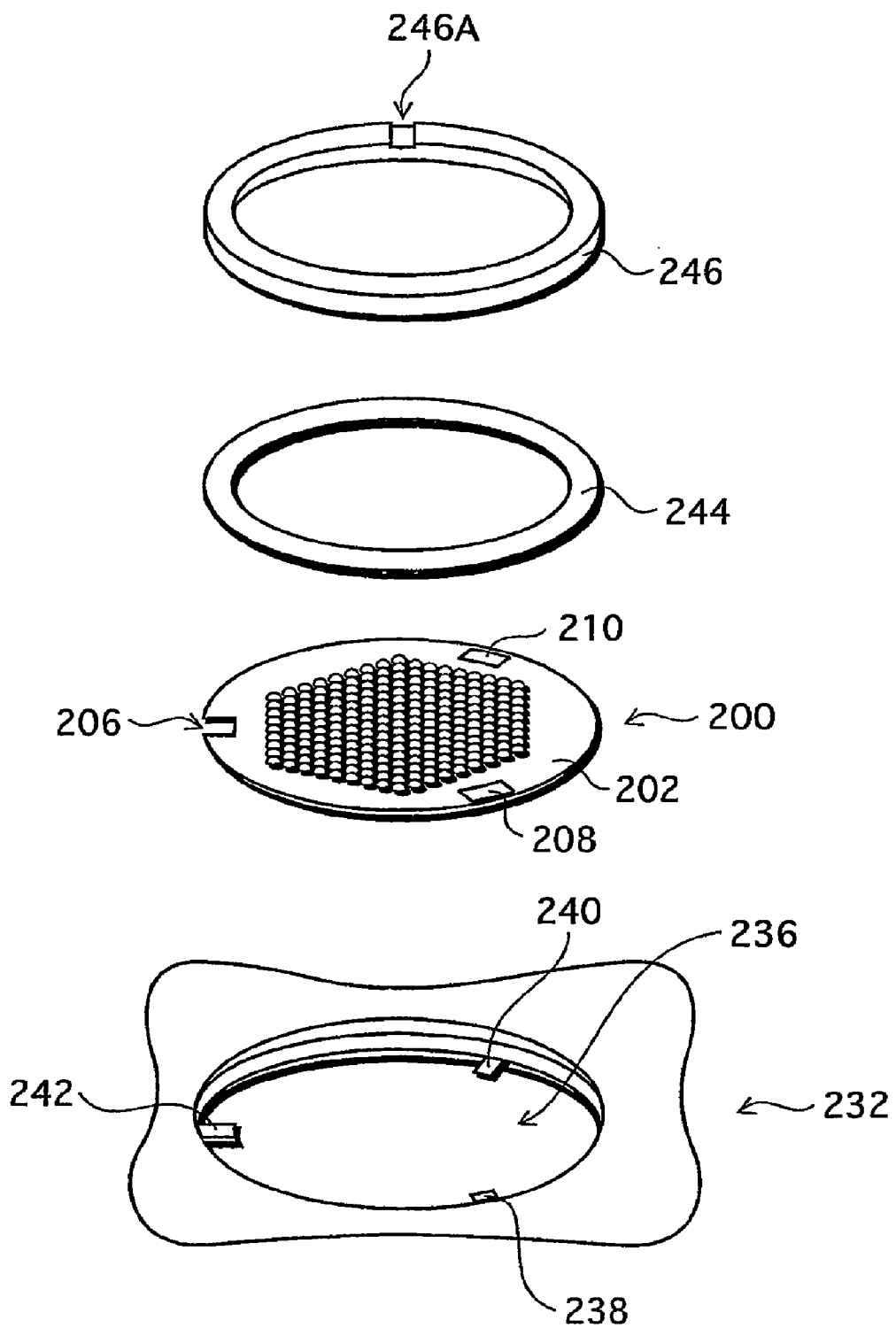
FIG. 38 is a perspective exploded view illustrating the lighting apparatus relating to the sixth embodiment.

The following part describes a construction to attach the LED module 200 to the lighting unit 232, with reference to FIG. 38.

The lighting unit 232 has a circular depression 236 in which the LED module 200 is to be fitted. A bottom surface of the circular depression 236 is flat. An internal thread (not shown in FIG. 38) is created, in the vicinity of an open end of the circular depression 236, on an inside wall of the circular depression 236. Flexible power supply terminals 238 and 240 and a guiding protrusion 242 protrude from the inside wall of the circular depression 236, between the internal thread and the bottom surface of the circular depression 236. The power supply terminals 238 and 240 are respectively positive and negative.

An O-ring 244 made of silicon rubber and a ring screw 246 are used to attach the LED module 200 to the lighting unit 232. The ring screw 246 has a shape of a ring that has a substantially rectangular cross-section. An external thread (not shown in FIG. 38) is created on an outer surface of the ring screw 246, and a depression 246A is provided.

The following part describes a procedure of attaching the LED module 200 to the lighting unit 232.

To start with, the LED module 200 is fitted in the circular depression 236 in the following manner. The ceramics substrate 202 of the LED module 200 is positioned between the bottom surface of the circular depression 236 and the power supply terminals 238 and 240. The guiding protrusion 242 is fitted in the guiding depression 206, so as to align the positive terminal 208 and the negative terminal 210 with the power supply terminal 238 and the power supply terminal 240 respectively.

After the LED module 200 is fitted in the circular depression 236, the ring screw 246 to which the O-ring 244 has been attached is screwed into the circular depression 236 and fixed. Thus, the positive and negative terminals 208 and 210 are respectively connected to the power supply terminals 238 and 240, so that the terminals 208 and 210 are electrically connected to the terminals 238 and 240 reliably. In addition, substantially the entire lower surface of the ceramics substrate 202 is connected to the flat bottom surface of the circular depression 236. This enables heat generated in the LED module 200 to be efficiently conducted to the lighting unit 232, thereby improving a cooling effect of the LED module 200. Here, silicone grease may be applied to the lower surface of the ceramics substrate 202 and the bottom surface of the circular depression 236 to further improve the heat conduction efficiency from the LED module 200 to the lighting unit 232.

When power is supplied to this lighting apparatus 234 from a commercial power source, each LED chip 2 emits white light in the manner described above. The white light is emitted through the lenses 204.

Figure 39:
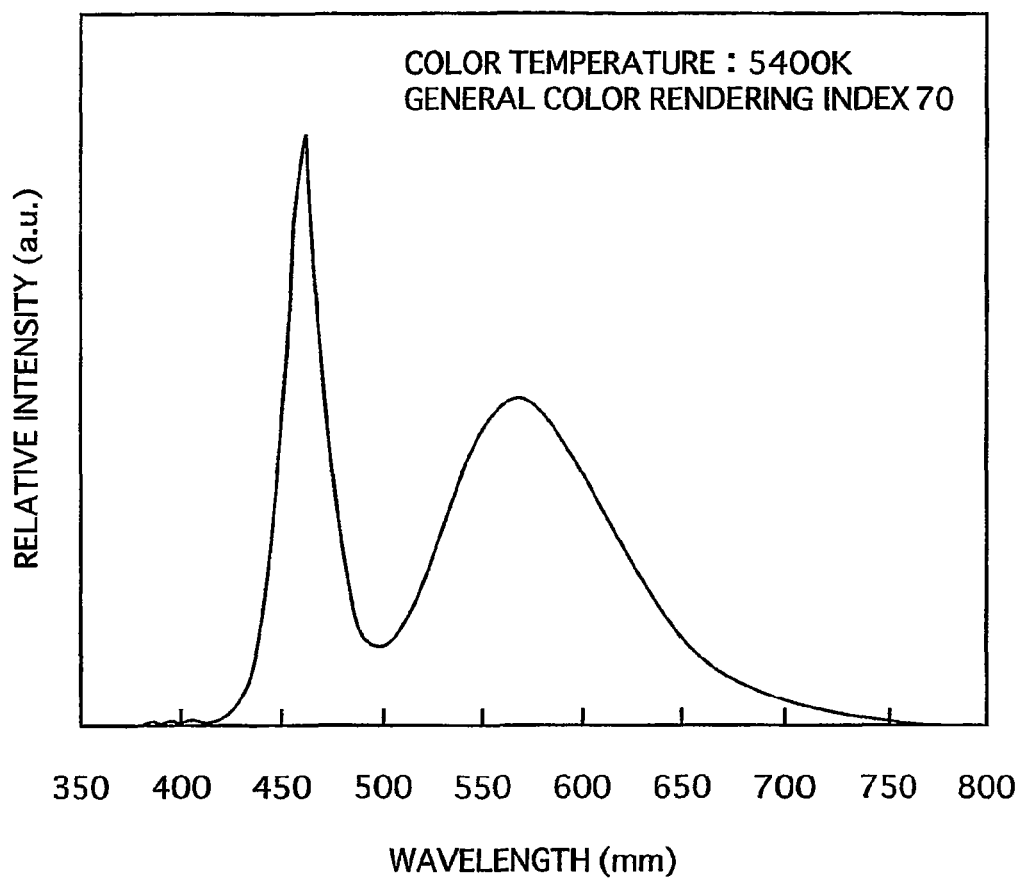
FIG. 39 shows an emission spectrum of the lighting apparatus relating to the sixth embodiment.

When an electric current of 350 mA is applied to the LED module 200, a total luminous flux of 1,000 lm, an on-axis luminous intensity of 2,000 cd, and an emission spectrum shown in FIG. 39 are observed.

In the above description, the LED chip 2 relating to the first embodiment is used to constitute the LED module 200. However, the LED chip 500 relating to the fifth embodiment may be instead used.

Figure 40A:
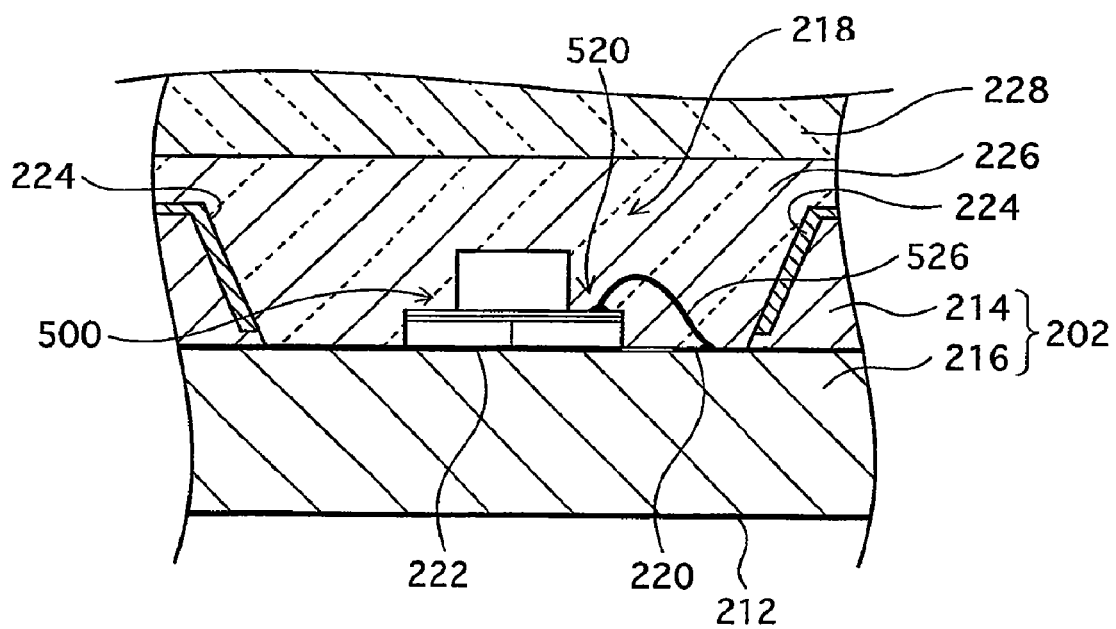
FIG. 40 illustrates a modification example of the sixth embodiment.
Figure 40B:
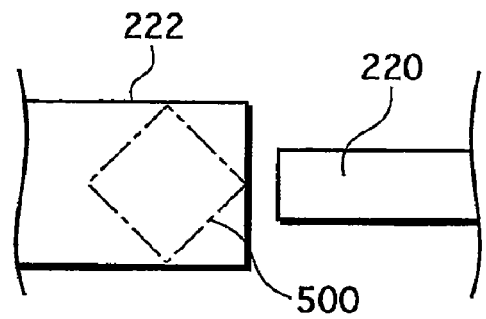

FIG. 40 illustrates a case where the LED chip 500, instead of the LED chip 2, is mounted in the LED module 200. FIG. 40A and FIG. 40B respectively correspond to FIG. 35C and FIG. 36B. A construction of the LED module 200 is the same between cases of using the LED chip 2 and the LED chip 500, except for a slight increase in diameter of the through hole 218 due to a use of a bonding wire to mount the LED chip 500. In FIGS. 40A and 40B, the same reference numerals are used as in FIGS. 35C and 36B to identify common constituents. Such constituents are not repeatedly explained in the following part.

The LED chip 500 is mounted on the ceramics substrate 202 in such a manner that a bottom surface of the anode power supply terminal 502 (shown in FIG. 29B) is connected to the anode pad 222. The cathode power supply terminal 520 is connected to the cathode pad 220 by means of a bonding wire 526.

As mentioned, the bonding wire 526 is used to mount the LED chip 500. Here, the bonding wire 526 extends from the cathode power supply terminal 520 which is positioned behind the light extraction surface of the n-GaN layer 512 (shown in FIG. 29B) in a direction of light emission. In other words, the bonding wire 526 does not block light emitted from the light extraction surface at all. As a result, shadow of the bonding wire 526 is not likely to be produced on a light irradiated surface.

Seventh Embodiment

Figure 41:
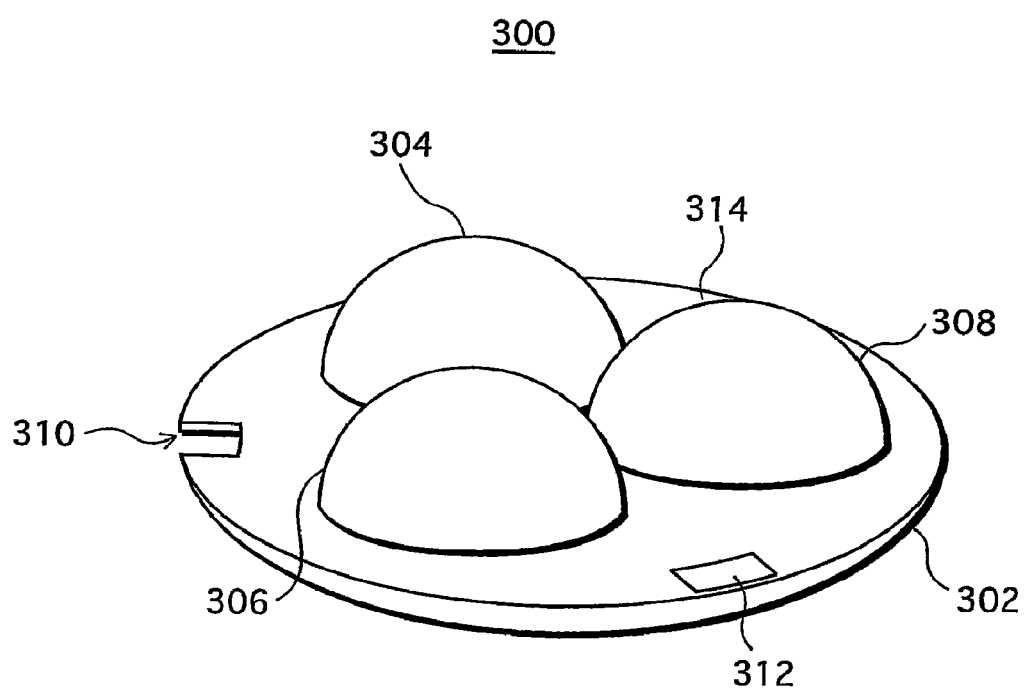
FIG. 41 is a perspective view illustrating a white LED module relating to a seventh embodiment.

FIG. 41 is an external perspective view illustrating a white LED module 300, which is a lighting module including the LED array chip 80 relating to the third embodiment (shown in FIG. 14) (hereinafter simply referred to as an LED module 300). The LED module 300 is attached to a lighting unit which is the same as the lighting unit 232 (shown in FIGS. 37 and 38) described in the sixth embodiment.

The LED module 300 includes a ceramics substrate 302 that is in a shape of a circle having a diameter of 5 cm and is made of AlN and three resin lenses 304, 306 and 308. A guiding depression 310 used to attach the LED module 300 to the lighting unit and terminals 312 and 314 to receive a power supply from the lighting unit are provided in the ceramics substrate 302.

Figure 42A:
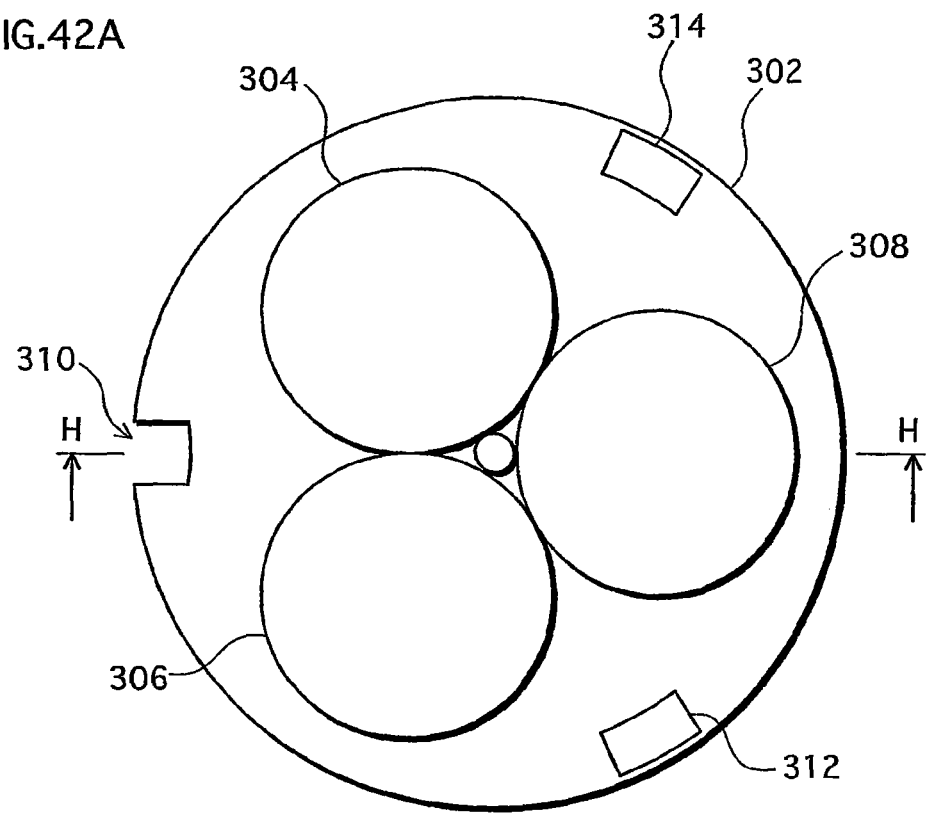
FIG. 42A is a plan view illustrating the white LED module relating to the seventh embodiment.
Figure 42B:
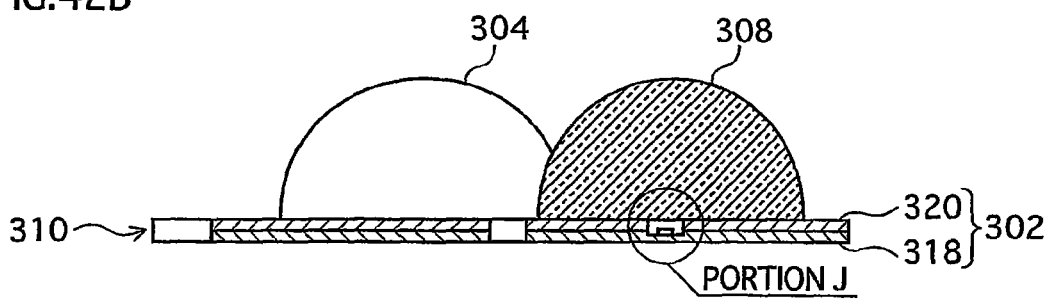
FIG. 42B illustrates a cross-section along a line HH shown in FIG. 42A.
Figure 42C:
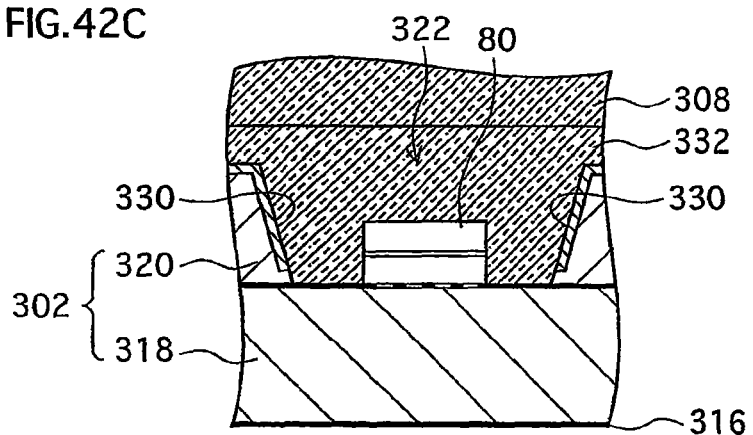
FIG. 42C is an enlargement view illustrating a portion J (chip mounting portion) shown in FIG. 42B.

FIG. 42A is a plan view illustrating the LED module 300, FIG. 42B illustrates a cross-section of the LED module 300 along a line HH shown in FIG. 42A, and FIG. 42C is an enlargement view illustrating a portion J shown in FIG. 42B.

As shown in FIG. 42C, an Au plating 316 is applied to a back main surface of the ceramics substrate 302 for improving heat dissipation.

The LED array chip 80 is mounted at a location, on an upper surface of the ceramics substrate 302, corresponding to a center of each of the lenses 304, 306 and 308 having a shape of a circle as shown in FIG. 42A. In total, three LED array chips 80 are mounted on the ceramics substrate 302.

The ceramics substrate 302 is constituted by two ceramics substrates 318 and 320 each of which is 0.5 mm in thickness and mainly made of AlN. Other than AlN, the ceramics substrates 318 and 320 can be made of $Al_2O_3$, BN, MgO, ZnO, SiC or diamond.

The LED array chips 80 are mounted on the lower ceramics substrate 318. Taper through holes 322 are provided in the upper ceramics substrate 320, so as to create spaces for mounting the LED array chips 80.

A cathode pad 324, an anode pad 326 and 34 island pads 328 (shown in FIG. 43B) are provided at the location, on an upper surface of the ceramics substrate 318, where each LED array chip 80 is to be mounted. Each of the cathode pad 324, the anode pad 326 and the island pads 328 is made up of Au plating applied on copper (Cu). The island pads 328 are electrically independent from each other, and have a role of connecting the LED array chip 80 and the ceramics substrate 318 reliably and thereby improving heat dissipation.

Here, AuSn solder is plated on the Au plating layer 90 of the LED array chip 80. After all of the LED array chips 80 are mounted, the ceramics substrate 302 is heated through a reflow furnace to a temperature equal to a melting point of the solder. Thus, all of the three LED array chips 80 can be simultaneously connected to the ceramics substrate 302. This reflow soldering process can be conducted if a shape of each of the cathode pad 324, the anode pad 326 and the island pads 328, an amount of the applied solder, a shape of the power supply terminals of the LED array chip 80 and the like are optimized. Here, a silver paste or a bump may be used instead of the solder.

Before being mounted, the LED array chips 80 have been tested for their optical performance, such as unevenness of color and a color temperature, and have passed the test. According to the seventh embodiment, the LED array chip 80 includes the phosphor layer 96, and can emit white light by itself. As described above, this makes it possible to test the LED array chip 80 for its optical performance before mounting. Consequently, it can be prevented that the LED module 300 including the LED array chips 80 is rejected due to poor optical performance of the LED array chips 80. In other words, the ratio of accepted finished products (LED modules 300) is improved.

An aluminum reflection film 330 is formed on a wall of each through hole 322 provided in the upper ceramics substrate 320 and on an upper surface of the ceramics substrate 320 as shown in FIG. 42C.

After mounted on the ceramics substrate 318, the LED array chips 80 are covered by a first resin (e.g. a silicon resin 332). Subsequently, the lenses 308 (304 and 306) are formed by injection molding with use of a second resin (e.g. an epoxy resin).

The three LED array chips 80 are connected in parallel by a wiring pattern formed on the upper main surface of the ceramics substrate 318.

Figure 43A:
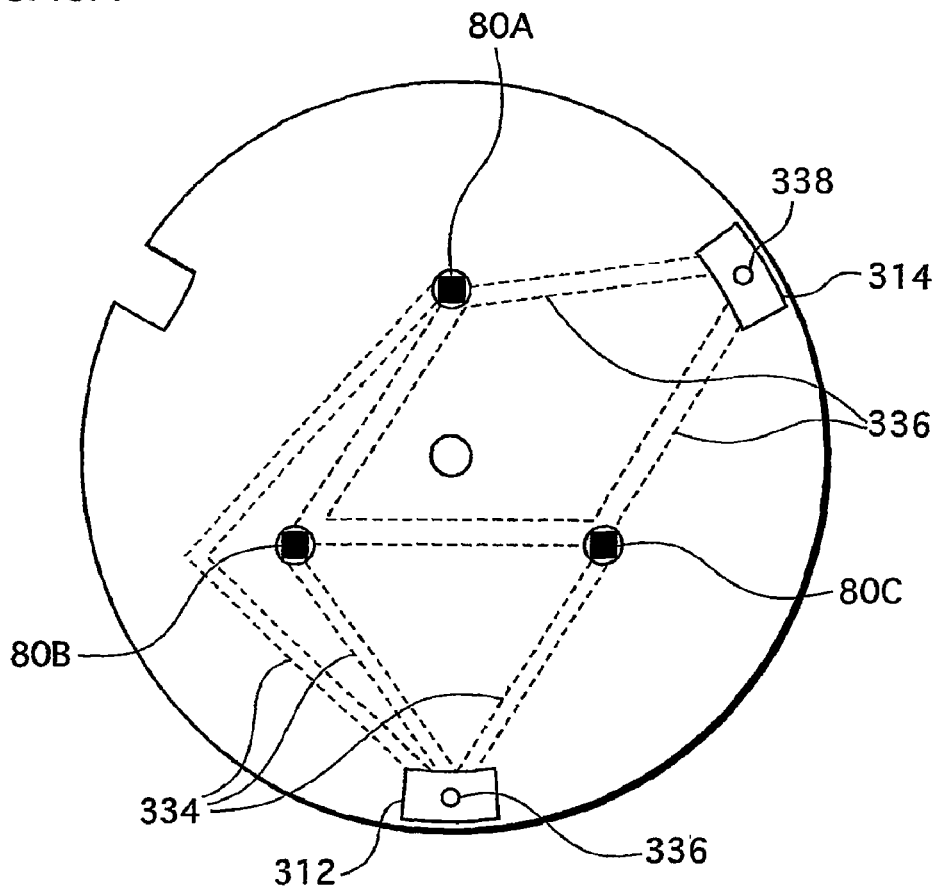
FIG. 43A illustrates a wiring pattern formed in the white LED module.
Figure 43B:
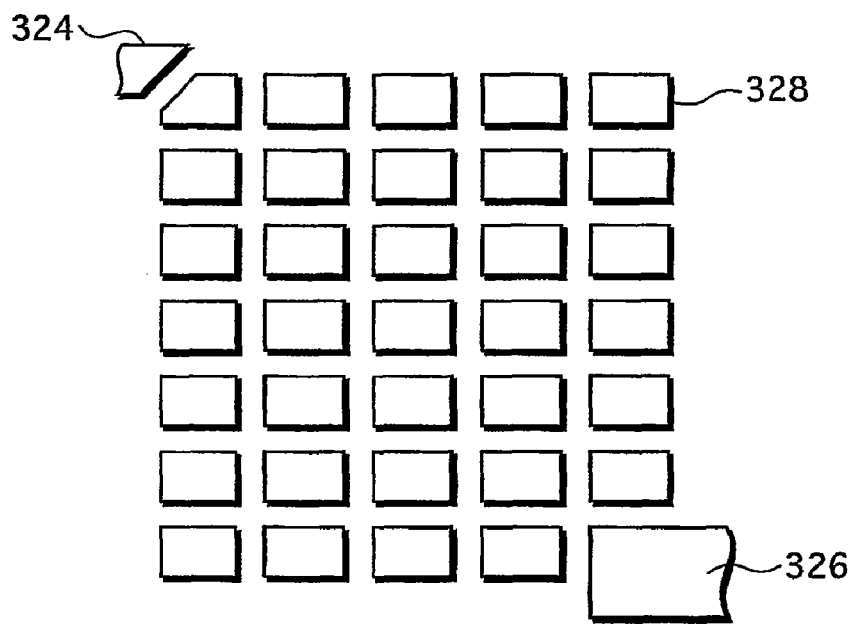
FIG. 43B illustrates a pad pattern formed on a ceramics substrate which constitutes the white LED module.

FIG. 43A is a plan view illustrating the LED module 300 after removing the lenses 304, 306 and 308. The three LED array chips 80 are distinguished from each other by addition of marks A, B and C.

As described above, the anode pad 326 and the cathode pad 324 (shown in FIG. 43B) are provided at the location, on the upper main surface of the ceramics substrate 318, where each of the LED array chips 80A, 80B and 80C is to be mounted.

The anode pads 326 are respectively connected to anode power supply terminals Au1 (see FIG. 14B) of the LED array chips 80A, 80B and 80C, and electrically connected to each other through a wiring pattern 334. One end of the wiring pattern 334 is connected to the positive terminal 312 through a through hole 336. The cathode pads 324 are respectively connected to cathode power supply terminals Au35-2 (see FIG. 14B) of the LED array chips 80A, 80B and 80C, and electrically connected to each other through a wiring pattern 336. One end of the wiring pattern 336 is connected to the negative terminal 314 through a through hole 338. In other words, the LED array chips 80A, 80B and 80C are connected in parallel by means of the wirings 334 and 336. Which is to say, three groups of 35 LEDs connected in series are connected in parallel in the LED module 300.

The LED module 300 described above is attached to a lighting unit which is the same as the lighting unit 232 shown in FIGS. 37 and 38. The LED module 300 and the lighting unit constitute a lighting apparatus. A procedure to attach the LED module 300 to the lighting unit is the same as in the sixth embodiment, and therefore not explained here.

When an electric current of 150 mA is applied to the LED module 300, a total luminous flux of 500 lm, an on-axis luminous intensity of 1,000 cd, and the same emission spectrum as in the sixth embodiment (shown in FIG. 39) are observed.

Eighth Embodiment

Figure 44:
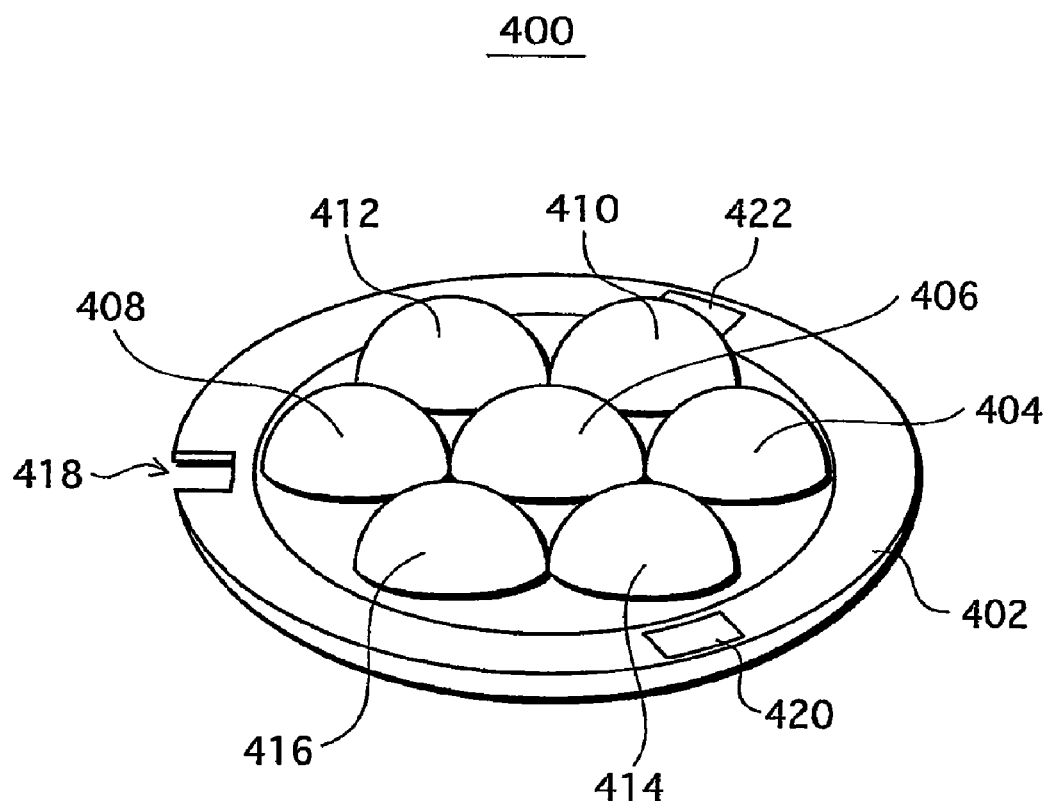
FIG. 44 is a perspective view illustrating a white LED module relating to an eighth embodiment.

FIG. 44 is an external perspective view illustrating a white LED module 400, which is a lighting module including the LED array chip 130 relating to the fourth embodiment (shown in FIGS. 21 and 22) (hereinafter simply referred to as an LED module 400). The LED module 400 is attached to a lighting unit which is the same as the lighting unit 232 (shown in FIGS. 37 and 38) described in the sixth embodiment.

The LED module 400 includes a ceramics substrate 402 that is in a shape of a circle having a diameter of 5 cm and is made of AlN and seven resin lenses 404, 406, 408, 410, 412, 414 and 416. A guiding depression 418 used to attach the LED module 400 to the lighting unit and terminals 420 and 422 to receive a power supply from the lighting unit are provided in the ceramics substrate 402.

Figure 45A:
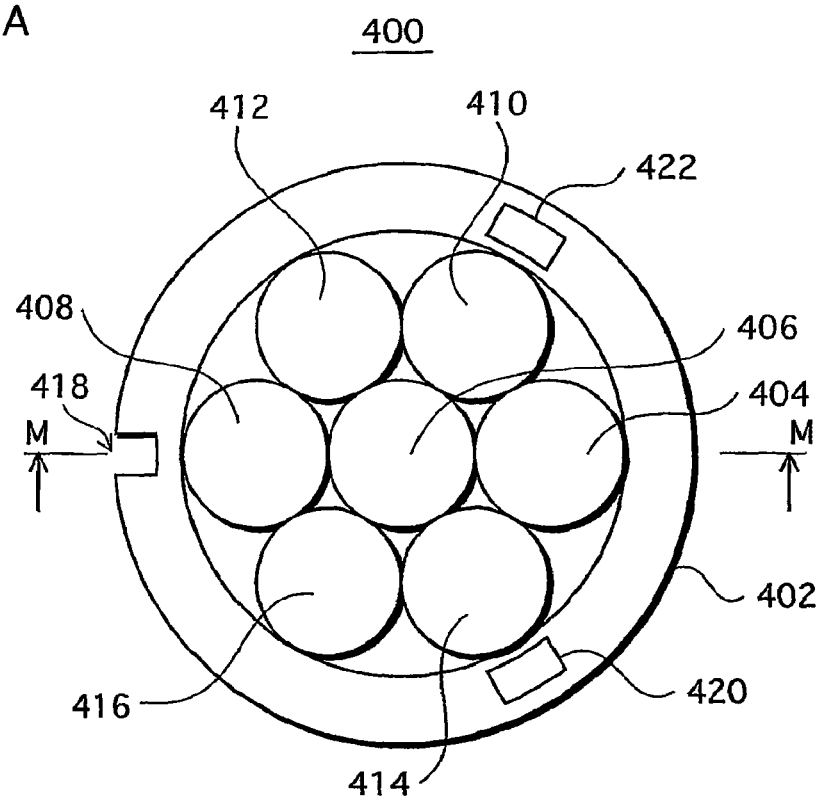
FIG. 45A is a plan view illustrating the white LED module relating to the eighth embodiment.
Figure 45B:
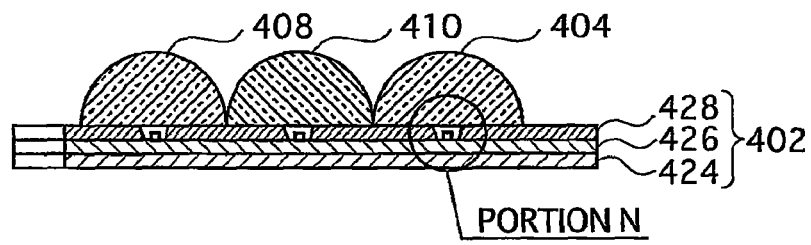
FIG. 45B illustrates a cross-section along a line MM shown in FIG. 45A.
Figure 45C:
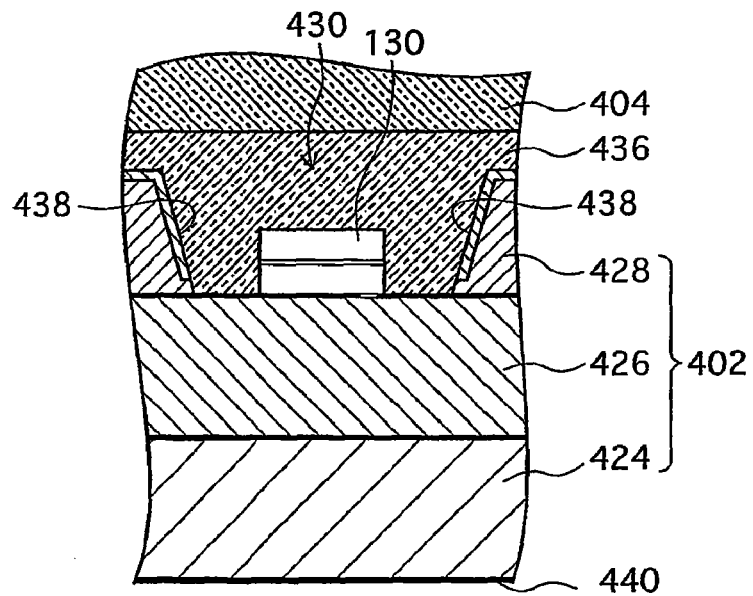
FIG. 45C is an enlargement view illustrating a portion N (chip mounting portion) shown in FIG. 45B.

FIG. 45A is a plan view illustrating the LED module 400, FIG. 45B illustrates a cross-section of the LED module 400 along a line MM shown in FIG. 45A, and FIG. 45C is an enlargement view illustrating a portion N (a chip mounted portion) shown in FIG. 45B.

The LED array chip 130 is mounted at a location, on an upper surface of the ceramics substrate 402, corresponding to a center of each of the lenses 404 to 416 having a shape of a circle as shown in FIG. 45A. In total, seven LED array chips 130 are mounted on the ceramics substrate 402.

The ceramics substrate 402 is constituted by three ceramics substrates 424, 426 and 428 each of which is 0.5 mm in thickness and mainly made of AlN. Other than AlN, the ceramics substrates 424, 426 and 428 can be made of $Al_2O_3$, BN, MgO, ZnO, SiC or diamond.

The LED array chips 130 are mounted on the middle ceramics substrate 426. Taper through holes 430 are provided in the upper ceramics substrate 428, so as to create spaces for mounting the LED array chips 130.

An anode pad 432 and a cathode pad 434 (shown in FIG. 46B) are provided at the location, on an upper surface of the ceramics substrate 426, where each LED array chip 130 is to be mounted. Each of the anode pad 432 and the cathode pad 434 is made up of Au plating applied on copper (Cu). The LED array chip 130 is flip-chip mounted in such a manner that the anode power supply terminal 132A and the cathode power supply terminal 132K (FIG. 21B) are respectively connected to the anode pad 432 and the cathode pad 434.

Before being mounted, the LED array chips 130 have been tested for their optical performance, such as unevenness of color and a color temperature, and have passed the test. According to the eighth embodiment, the LED array chip 130 includes the phosphor layer 148, and can emit white light by itself. As described above, this makes it possible to test the LED array chip 130 for its optical performance before mounting. Consequently, it can be prevented that the LED module 400 including the LED array chips 130 is rejected due to poor optical performance of the LED array chips 130. In other words, the ratio of accepted finished products (LED modules 400) is improved.

After mounted on the ceramics substrate 402, the LED array chips 130 are covered by a first resin (e.g. a silicon resin 436). Subsequently, the resin lenses 404 to 416 are formed by injection molding with use of a second resin (e.g. an epoxy resin).

An aluminum reflection film 438 is formed on a wall of each through hole 430 provided in the upper ceramics substrate 428 and on an upper surface of the ceramics substrate 428. An Au plating 440 is applied on a back surface of the lower ceramics substrate 424 for improving heat dissipation.

The seven LED array chips 130 are connected in parallel by a wiring pattern formed on the ceramics substrate 402.

Figure 46A:
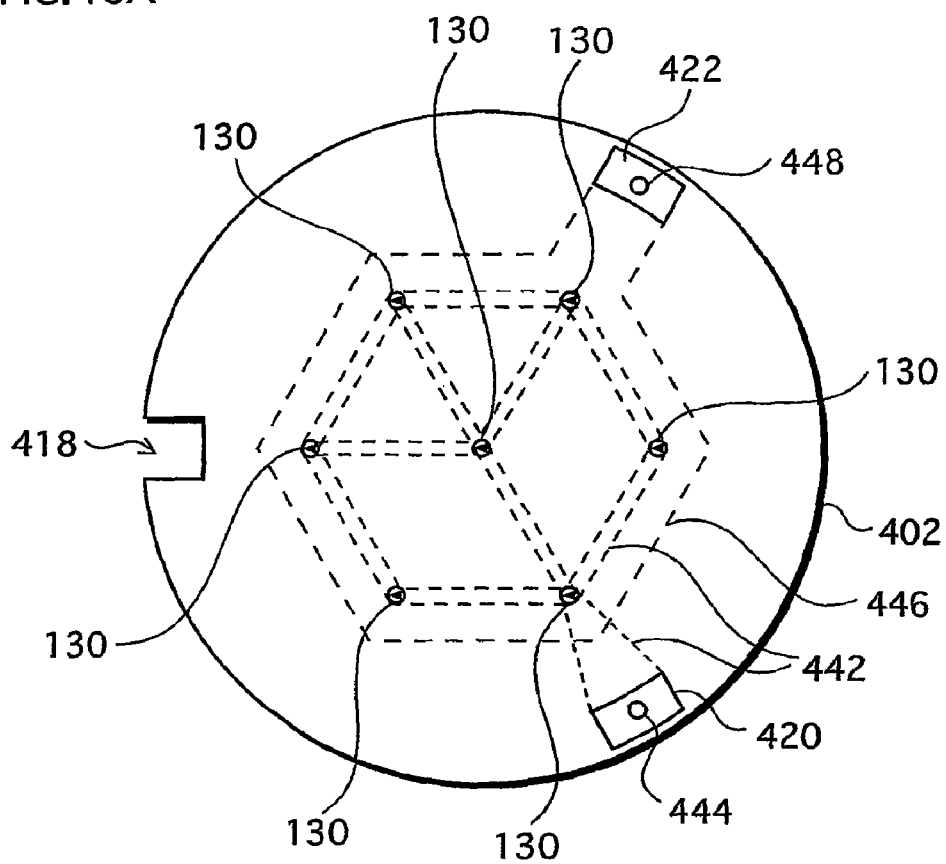
FIG. 46A illustrates a wiring pattern formed in the white LED module relating to the eighth embodiment.
Figure 46B:
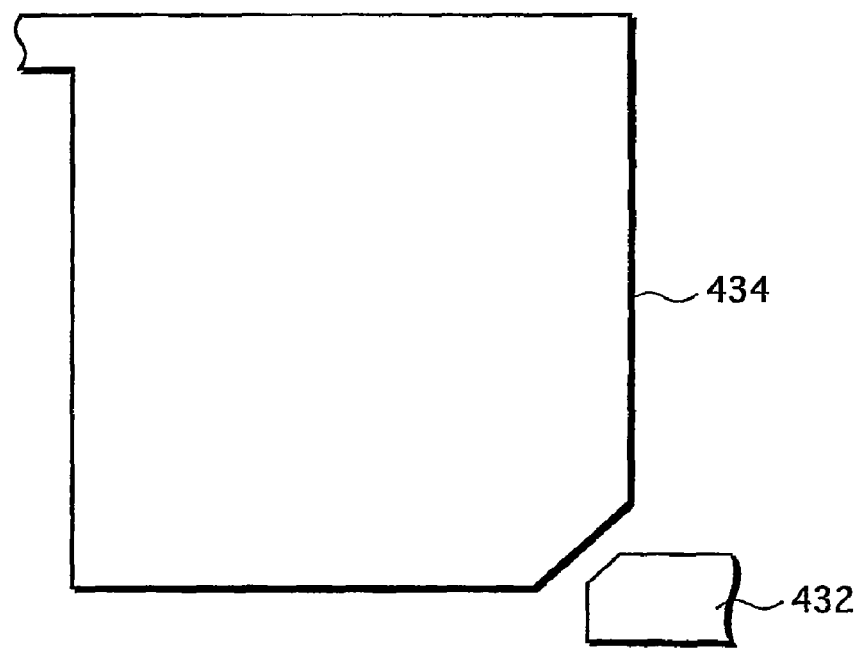
FIG. 46B illustrates a pad pattern formed on a ceramics substrate which constitutes the white LED module relating to the eighth embodiment.

FIG. 46A is a plan view illustrating the LED module 400 after removing the lenses 404 to 416. As described above, the anode pad 432 and the cathode pad 434 (shown in FIG. 46B) are provided at the location, on the upper main surface of the ceramics substrate 426, where each LED array chip 130 is to be mounted.

The anode pads 432 connected to the LED array chips 130 are electrically connected to each other by means of a wiring pattern 442 that is formed on an upper surface of the middle ceramics substrate 426. One end of the wiring pattern 442 is connected to the positive terminal 420 through a through hole 444 (provided in the upper ceramics substrate 428). The cathode pads 434 connected to the LED array chips 130 are electrically connected to a wiring pattern 446 through a through hole (not shown but provided in the middle ceramics substrate 426). Here, the wiring pattern 446 is formed on the upper main surface of the lower ceramics substrate 424. One end of the wiring pattern 446 is connected to the negative terminal 422 through a through hole 448 (provided so as to run through the middle and upper ceramics substrates 426 and 428). In other words, the LED array chips 130 are connected in parallel by means of the wiring patterns 442 and 446. Which is to say, seven groups of 35 LEDs connected in series are connected in parallel in the LED module 400.

The LED module 400 described above is attached to a lighting unit which is the same as the lighting unit 232 shown in FIGS. 37 and 38. The LED module 400 and the lighting unit constitute a lighting apparatus. A procedure to attach the LED module 400 to the lighting unit is the same as in the sixth embodiment, and therefore not explained here.

Figure 47:
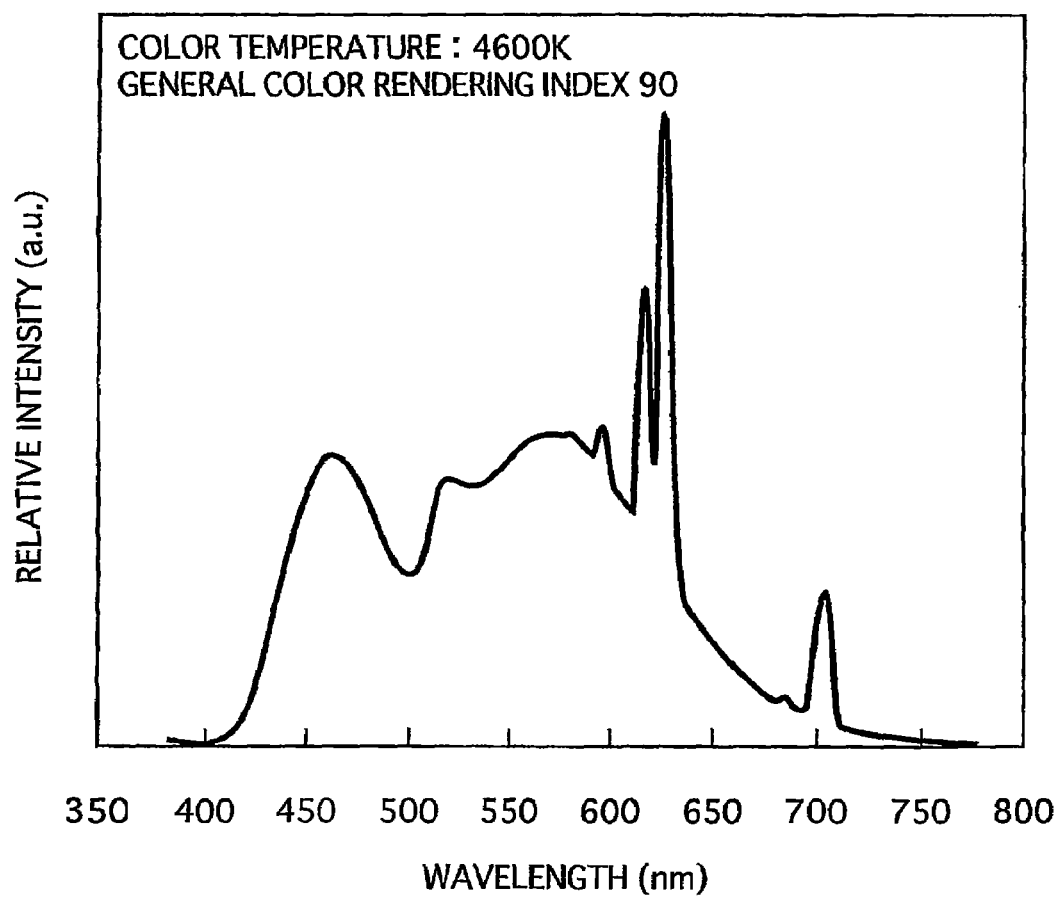
FIG. 47 shows an emission spectrum of a lighting apparatus using the white LED module relating to the eighth embodiment.

When an electric current of 350 mA is applied to the LED module 400, a total luminous flux of 800 lm, an on-axis luminous intensity of 1,600 cd, and an emission spectrum shown in FIG. 47 are observed.

The present invention is not limited the above-described embodiments. The present invention, for example, includes the following modifications.

(1) A light extraction efficiency from a multilayer epitaxial structure to a phosphor layer can be improved by making a surface of the multilayer epitaxial structure which is in contact with the phosphor layer uneven. The uneven surface may be formed by conducting etching, epitaxial regrowth or the like on the surface of the multilayer epitaxial structure. Alternatively, a metal oxide film or a dielectric film is formed on the surface and then partly etched. If such is the case, a metal oxide film or a dielectric film, which is formed between the multilayer epitaxial structure and the phosphor layer, may be a gradient-index film. In detail, a refractive index of the film provided between the multilayer epitaxial structure and the phosphor layer gradually varies, from a value equal to a refractive index of the multilayer epitaxial structure (e.g. 2.4) to a value equal to a refractive index of a resin forming the phosphor layer (e.g. 1.5).

(2) Instead of a macromolecule film, a single-crystal substrate, or a semiconductor substrate such as an Si substrate can be used as a supporting member. If a single-crystal substrate is, as a supporting member, adhered in reference to a crystal axis in a cleavage direction of the single-crystal substrate and a multilayer epitaxial structure, the adhered single-crystal substrate can be cleaved into portions. Depending on a construction of a semiconductor light emitting device, the single-crystal substrate can be adhered to a phosphor layer or a metal layer of the semiconductor light emitting device.

(3) Instead of a ceramics substrate, a semiconductor light emitting device may be mounted on a cermet substrate, a resin substrate such as a glass epoxy substrate or the like, or a substrate made of a composite material in which a resin and particles of metal oxide are mixed. Furthermore, for example, a driving circuit for a semiconductor light emitting device may be also mounted on a mounting substrate.

(4) Alternatively, a semiconductor light emitting device can be mounted on a semiconductor substrate made of Si, SiC, GaAs or the like. In this case, circuits such as a protection circuit and a driving circuit for a semiconductor light emitting device can be incorporated into a semiconductor substrate.

(5) The number of LEDs included in an LED array chip, that is to say, the number of LEDs which are connected in series is not limited to that mentioned in the embodiments. Furthermore, LEDs are not necessarily connected in series in an LED array chip, and may be connected in parallel or series-parallel.

INDUSTRIAL APPLICABILITY

As described above, a semiconductor light emitting device relating to an embodiment of the present invention is suitable for lighting apparatuses such as indoor lighting apparatuses and headlights of cars, projectors, and the like.

The invention claimed is:

1. A semiconductor light emitting device comprising:
a light emitting element array formed in such a manner that a plurality of light emitting elements are connected in series, each of the plurality of light emitting elements including: (a) a multilayer epitaxial structure including a first conductive layer, a second conductive layer and a light emitting layer between the first conductive layer and the second conductive layer, a main surface of the second conductive layer which faces away from the light emitting layer being a light extraction surface, (b) a first electrode formed on a main surface of the first conductive layer which faces away from the light emitting layer, and (c) a second electrode formed on the main surface of the second conductive layer which faces away from the light emitting layer, the first electrode and the second electrode are positioned relative to each other in a same manner for each light emitting element;
a metal layer on which the light emitting element array is formed, with an insulating layer therebetween, in such a manner that the first electrode is positioned closer to the metal layer than the second electrode, the metal layer connecting and supporting the multilayer epitaxial structures and conducting heat generated in the light emitting layer, wherein the metal layer is electrically divided into at least two portions;
the insulating layer is formed on side surfaces of each light emitting element;
a first conductor bridging member is connected to the first electrode of a light emitting element at one end of the light emitting element array and to one of the two portions of the metal layer to form a first power supply terminal; and a second conductor bridging member is connected to the second electrode of a light emitting element at the other end of the light emitting array and to the other of the two portions of the metal layer to form a second power supply terminal.

2. The semiconductor light emitting device of claim 1, wherein
the first electrode is formed on substantially the entire main surface of the first conductive layer which faces away from the light emitting layer, and reflects light emitted from the light emitting layer.

3. The semiconductor light emitting device of claim 1, wherein
the second electrode is a transparent electrode which transmits the light emitted from the light emitting layer.

4. The semiconductor light emitting device of claim 3, wherein
the second electrode is formed on substantially the entire main surface of the second conductive layer which faces away from the light emitting layer.

5. The semiconductor light emitting device of claim 1, further comprising:
a phosphor layer formed on the multilayer epitaxial structure so as to cover the main surface of the second conductive layer which faces away from the light emitting layer, the phosphor layer including a light emitting substance which is excited by the light emitted from the light emitting layer, to emit light.

6. The semiconductor light emitting device of claim 1, wherein
each of the first conductive layer, the light emitting layer, and the second conductive layer is made of a compound semiconductor including nitrogen.

7. A lighting module comprising:
a printed wiring board including a bonding pad; and
a semiconductor light emitting device as defined in claim 1, the semiconductor light emitting device being mounted on the printed wiring board by connecting a metal layer included in the semiconductor light emitting device to the bonding pad.

8. A lighting apparatus comprising a lighting module as defined in claim 7.

9. The semiconductor light emitting device of claim 1, wherein a third conductor bridging member connects the second electrode of the light emitting element at one end of the light emitting element array to the first electrode of the light emitting element at the other end of the light emitting element array to provide the series electrical connection between adjacent light emitting elements of the plurality of light emitting elements.

* * * * *

UNITED STATES PATENT AND TRADEMARK OFFICE
CERTIFICATE OF CORRECTION

| | |
|---|---|
| PATENT NO. | : 7,956,368 B2 |
| APPLICATION NO. | : 12/569660 |
| DATED | : June 7, 2011 |
| INVENTOR(S) | : Nagai et al. |

It is certified that error appears in the above-identified patent and that said Letters Patent is hereby corrected as shown below:

On the Cover Page of the Patent item (62) Related U.S. Application data needs to be added:
Division of application no. 10/577,780 filed on April 28, 2006, which is a 371 of PCT/JP04/16507, now Pat. No. 7,622,743.

Signed and Sealed this
Ninth Day of August, 2011

David J. Kappos
*Director of the United States Patent and Trademark Office*